(12) United States Patent
Higashida et al.

(10) Patent No.: US 6,826,181 B1
(45) Date of Patent: Nov. 30, 2004

(54) PACKET TRANSMITTER

(75) Inventors: Masaaki Higashida, Moriguchi (JP); Yoshihiro Morioka, Kashiba (JP); Masakazu Nishino, Kashiwara (JP); Satoshi Ohyama, Ashiya (JP); Masaaki Kobayashi, Kawanishi (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/214,830

(22) PCT Filed: May 13, 1998

(86) PCT No.: PCT/JP98/02101

§ 371 (c)(1), (2), (4) Date: Mar. 10, 1999

(87) PCT Pub. No.: WO98/52323

PCT Pub. Date: Nov. 19, 1998

(30) Foreign Application Priority Data

May 13, 1997 (JP) ............................. 9-121364
Mar. 11, 1998 (JP) ............................. 10-59413

(51) Int. Cl.[7] ........................... H04L 12/28; H04J 3/26; H03M 13/00; G01V 3/00
(52) U.S. Cl. ..................... 370/390; 370/432; 714/758; 340/825.53
(58) Field of Search ............................. 370/397, 399, 370/395.61, 395.65, 389, 390, 432, 473, 474, 469, 476, 392; 714/758, 804, 752, 754, 756, 751, 702, 124, 789; 340/825.53; 341/50

(56) References Cited

U.S. PATENT DOCUMENTS 4,284,976 A * 8/1981 Gable et al. ........... 340/825.53
4,893,306 A * 1/1990 Chao et al. ................. 370/474

(List continued on next page.)

FOREIGN PATENT DOCUMENTS

| EP | 0700231 A | 3/1996 |
|----|-----------|--------|
| EP | 0721267 A2 | 7/1996 |
| JP | 61-242426 | 10/1986 |
| JP | 7-312561 | 11/1995 |
| JP | 8-307859 | 11/1996 |

OTHER PUBLICATIONS

Zsehong Tsai et al: "Performance Analysis of Two Echo Control Designs in ATM Networks", IEEE/ACM Transactions on Networking, IEEE Inc., New York, US, vol. 2, No. 1, Feb. 1, 1994, pp. 30–39.

(List continued on next page.)

Primary Examiner—Duc Ho
Assistant Examiner—Phuongchau Ba Nguyen
(74) Attorney, Agent, or Firm—Wenderoth, Lind & Ponack, L.L.P.

(57) ABSTRACT

There is disclosed a packet transmission apparatus for transmitting in a packet form a transmission unit including a data string arranged so as to divide predetermined data into a plurality of blocks, each block having a fixed length, block information for specifying the block type being added to each block. A DIF data processing circuit generates a transmission header having a new identifier by deleting predetermined redundancy information from the block information belonging to the plurality of blocks based on inputted data string, and then, generates a transmission unit having the generated transmission header. Next, a transmission terminal unit transmits the generated transmission unit by way of a transmission line. In this case, the DIF data processing circuit generates a new identifier by making the information of one block represent the information of the plurality of blocks to generate a transmission header having the generated identifier, or making the information of one block represent the information of an identical block or deleting the redundancy information including at least one of reserved data and invalid data.

10 Claims, 40 Drawing Sheets

U.S. PATENT DOCUMENTS

| | | | |
|---|---|---|---|
| 5,159,452 A | | 10/1992 | Kinoshita et al. |
| 5,241,563 A | * | 8/1993 | Paik et al. .................. 714/789 |
| 5,430,767 A | | 7/1995 | Min |
| 5,461,639 A | * | 10/1995 | Wheatley et al. ........... 370/342 |
| 5,467,342 A | * | 11/1995 | Logston et al. ............. 370/474 |
| 5,483,525 A | * | 1/1996 | Song et al. ................. 370/392 |
| 5,539,586 A | | 7/1996 | Inoue et al. |
| 5,550,593 A | | 8/1996 | Nakabayashi |
| 5,563,887 A | * | 10/1996 | Harasaki ..................... 714/756 |
| 5,572,532 A | * | 11/1996 | Fimoff et al. ............... 714/702 |
| 5,581,481 A | * | 12/1996 | Weerackody et al. ......... 341/50 |
| 5,909,434 A | * | 6/1999 | Odenwalder et al. ....... 370/342 |
| 5,978,958 A | * | 11/1999 | Tanaka et al. .............. 714/758 |
| 6,011,797 A | * | 1/2000 | Sugawara .............. 370/395.51 |
| 6,061,820 A | * | 5/2000 | Nakakita et al. ............ 714/751 |
| 6,094,433 A | * | 7/2000 | Kunimoto et al. .......... 370/397 |
| 6,178,547 B1 | * | 1/2001 | Pennello ..................... 717/124 |
| 6,373,856 B1 | * | 4/2002 | Higashida ................... 370/474 |

OTHER PUBLICATIONS

Zsehong Tsai et al., "Performance analysis of Two Echo Control Desings in ATM Networks", IEEE/ACM Transactions on Networking, IEEE Inc. New York, US, vol. 2, No.1, Feb. 1994, pp. 30–39, XP000446088, ISSN: 1063–6692.

Naotaka Morita, "A study on the transfer of MPEG2 signal over the ATM network", Proceedings of the 1994 IEICE Fall Conference, Communications, The Institute of Electronics, Information and Communication Engineers, SB–9–3, Tohoku University, in Sendai, Japan, Sep. 26–29, 1994 together with a partial English translation thereof.

Sakae Okuba, "MPEG–2 Video Coding Standard and its Applications to ATM Network—International Standardization at ISO/IEC and ITU–T", The Institute of Electronics, Information and Communication Engineers, Technical Report of IEICE, CS93–164, DS93–88, pp. 91–102, Jan. 1994 together with an English Abstract on p. 91 thereof.

* cited by examiner

Fig.1  First Preferred Embodiment

Fig. 3 First Preferred Embodiment

First Preferred Embodiment

Fig. 5 First Preferred Embodiment

Fig.7 First Preferred Embodiment

Third Preferred Embodiment

DIF Data Processing Circuit 104b

Fig. 13 Fourth Preferred Embodiment
(Modified Preferred Embodiment of First Preferred Embodiment)
DIF Data Processing Circuit 104c Fig.14 Fourth Preferred Embodiment Fifth Preferred Embodiment Fig. 22 Seventh Preferred Embodiment Fig. 24 Seventh Preferred Embodiment Eighth Preferred Embodiment Fig. 30 Ninth Preferred Embodiment Fig.31 Tenth Preferred Embodiment Eleventh Preferred Embodiment DIF Data Processing Circuit 104i

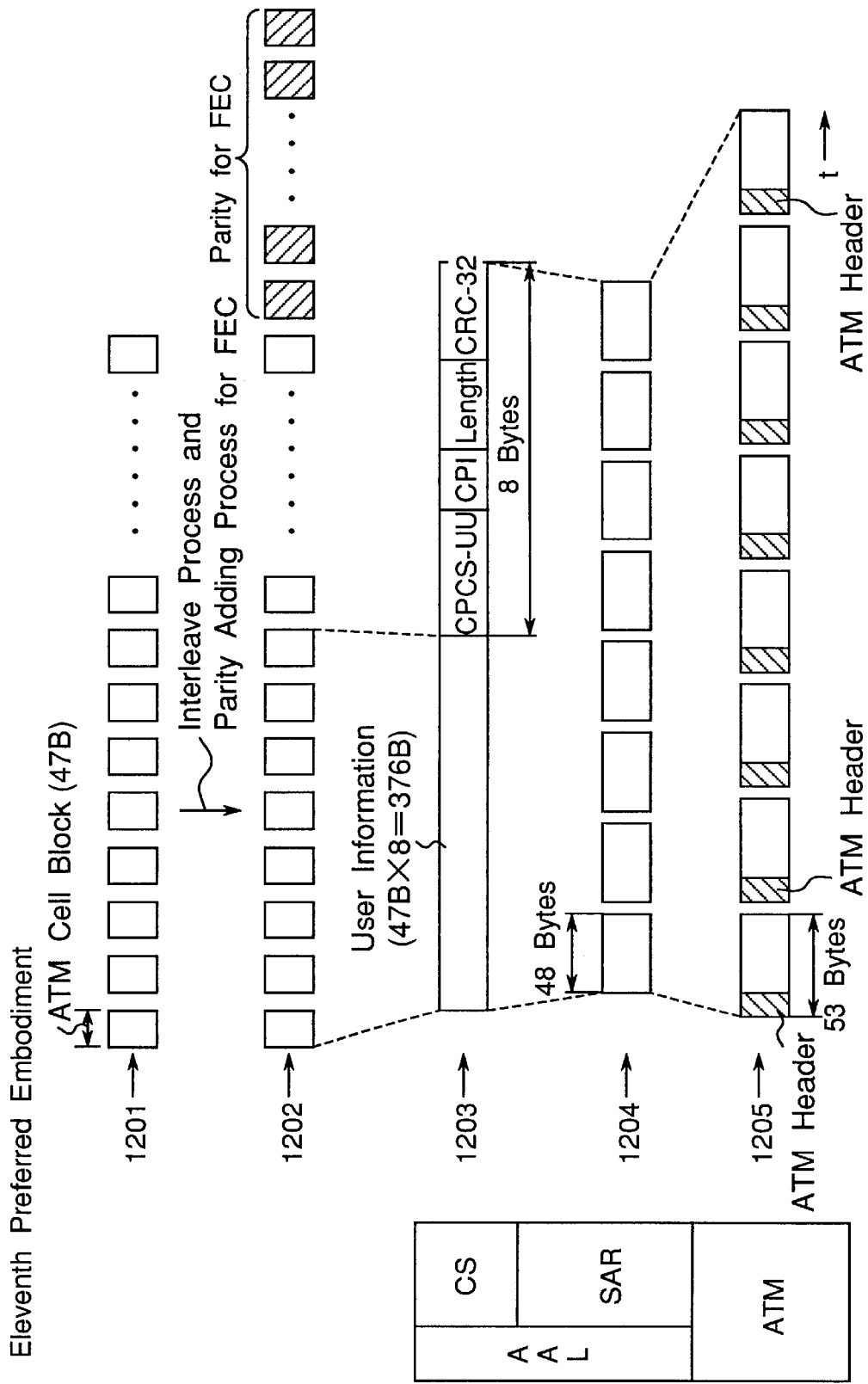

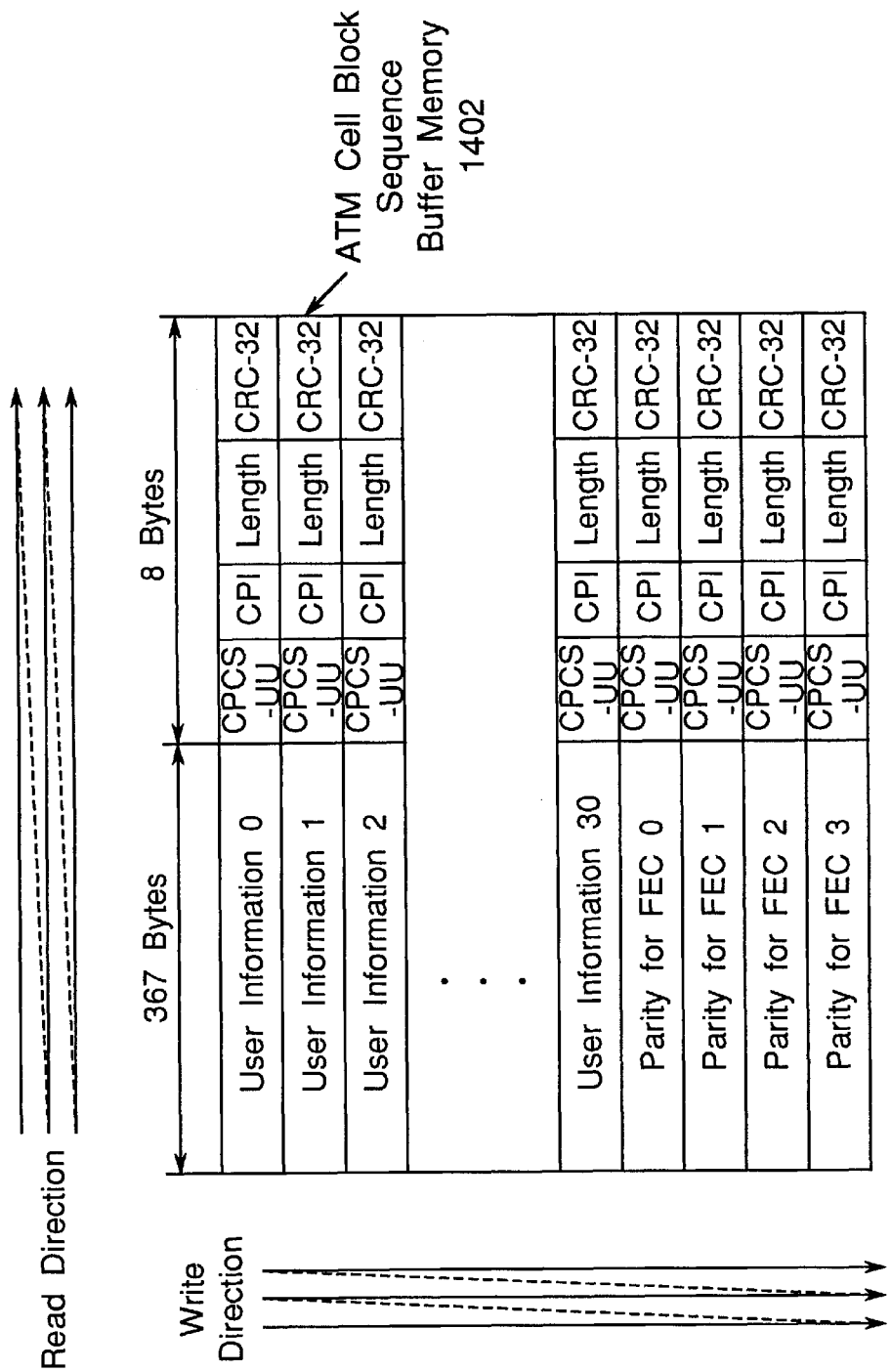
Fig. 35 Eleventh Preferred Embodiment

Fig. 36
Twelfth Preferred Embodiment (B)

1702
3B | 77B (C)

Write Direction ← 467B
Read Direction →
50B
Data 2600
Header (D)

50B | 5B
Parity for FEC 2610

(E)

Read Direction ←
Write Direction →
467B
55B
Data 2603
Parity for FEC 2610
Header (A) DIF Data Processing Circuit 104j 6001 → Block Buffer Memory 6002 → Interleave Buffer Memory 2600 → Parity Adding Circuit 2602 → Interleave Buffer Memory 2603 → 2605

Block Buffer Memory Control Circuit (Packet Block Generating Method of Fig.5-Fig.7) 6003

Interleave Control Circuit (Interleave Method of Fig.36(C)) 2601

Interleave Control Circuit (Interleave Method of Fig.36(E)) 2604

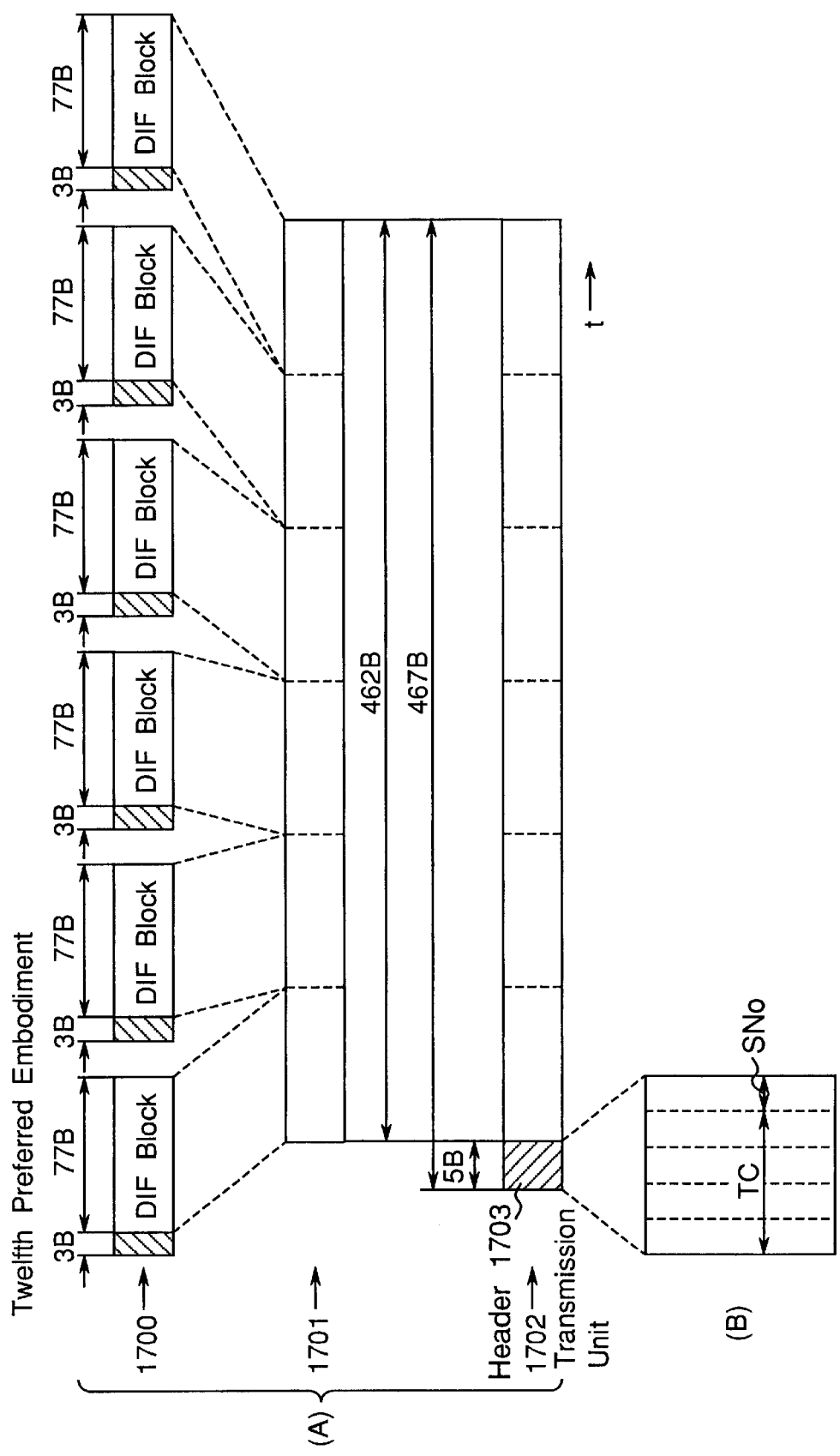

Twelfth Preferred Embodiment
Output Data Structure of ATM Cell Forming Circuit 105

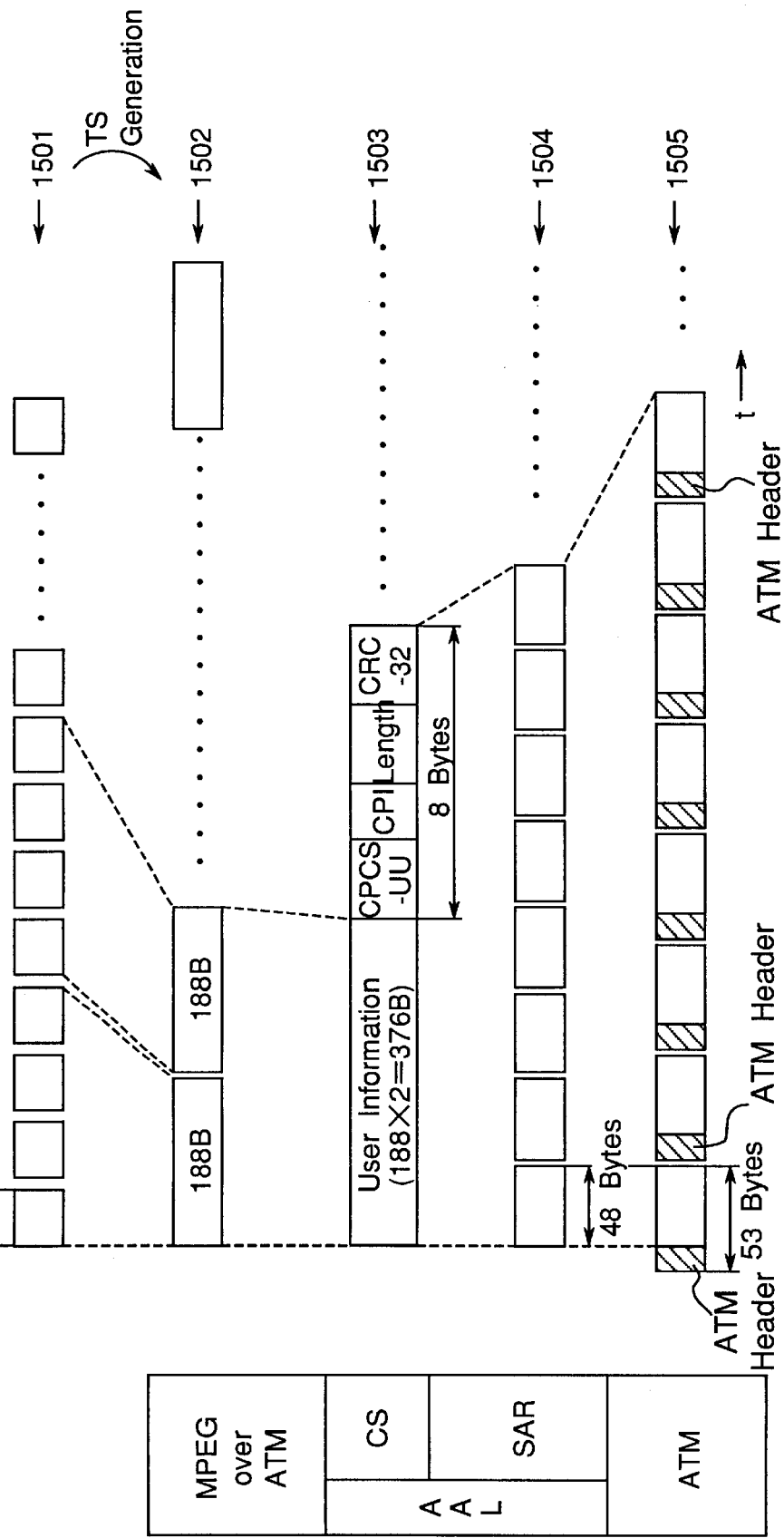

PACKET TRANSMITTER

TECHNICAL FIELD

The present invention relates to a packet transmission apparatus for transmitting compressed coded image data, audio data and additional information data or general data in a packet form by way of a transmission line.

BACKGROUND ART

In recent years, the capacity of communications has remarkably increased according to development of communications systems utilizing optical fiber cables and the like, and digital transmission systems for transmitting not only digital data for use in computers and the like, but also, for example, an image signal, an audio signal and the other additional information after being digitized has been put into practical use.

For example, use of an asynchronous transfer mode (referred to as an ATM hereinafter) or the like enables transmission at a rate of not lower than 155 megabits per second, and an ATM transmission system for transmitting image data by way of an ATM transmission line has been put into practical use.

In regard to the ATM transmission system, there is provided standardization through discussions by ITU-T (International Telecommunication Union-Telecommunication Standardization Sector), The ATM Forum and so forth, and many relevant documents have been published.

For example, a prior art for communicating a video signal in a packet form is disclosed in the prior art reference of U.S. Pat. No. 5,159,452 (referred to as a prior art hereinafter).

In the prior art, an example in which a packet loss position (packet loss information) is known and loss correction is executed is shown in FIGS. 6A and 6B of the prior art, and an example in which error correction is executed is shown in FIG. 7 of the prior art.

However, the prior art construction as described above has had the following problems.

(1) When handling communications in, for example, the ATM, transmission is executed in a unit of packet of 53 bytes called a cell. If a packet loss (cell loss) occurs, then the cell is lost within the ATM network, and therefore, this leads to such a problem that the occurrence of the cell loss within the ATM network cannot be detected from the information of the cell itself received by a reception terminal. As is natural for the above reasons, there has been such a problem that the position in which the cell loss has occurred cannot be identified. Therefore, the loss correction that must essentially identify the position of the error (cell loss) is impossible unless a special constituent factor for informing the reception terminal of the occurrence of the cell loss from the network side is provided. provided.

(2) Although the identification of the error position and correction are enabled by using the error correction method shown in FIG. 7 of the prior art, the method has had such a problem that the efficiency is low when the error correction is executed in terms of the number of errors that can be corrected with respect to the parity amount for error correction use to be added, i.e., the total amount of transmission and the number of error corrections (error correcting performance).

There has been such a further problem that the probability of the occurrence of cell loss disadvantageously increases due to the congestion of the ATM network when the total amount of transmission increases.

(3) In the ATM, an ATM adaptation layer (referred to as an AAL hereinafter) is prescribed by the standard of ITU-T Recommendation, and there are many types of equipment that cope with the standard. However, the prior art, which does not use the universal AAL function, has had such a problem that, for example, the error detection of the AAL type 5 cannot be utilized. It is also essential to independently input, for example, the function that a signal representing the breakpoint of a sequence of a video signal must be independently inputted, for which the transmission efficiency is low and no universal equipment can be used, and this leads to such a problem that no interconnecting capability exists.

There has also been such a problem that the processing circuit scale is large, and a cost is very high since no universal equipment can be used.

A first object of the present invention is to provide a packet transmission apparatus capable of enabling transmission tolerating packet loss (cell loss) by reducing the probability of the occurrence of the packet loss (cell loss) and improving the reliability of real-time communications.

A second object of the present invention is to provide a packet transmission apparatus capable of effectively utilizing a communications zone, enabling the ATM layers to be utilized from upper layers and easily using the currently popularized or prevailed ATM equipments.

A third object of the present invention is to provide a packet transmission apparatus capable of improving the error correction efficiency and error correction capability with respect to the amount of parity added by executing error correction or error detection, enabling the ATM layers to be utilized from upper layers and easily using the currently popularized ATM equipments.

Furthermore, a fourth object of the present invention is to provide a packet transmission apparatus that has a simpler apparatus construction and is less expensive as compared with the prior art.

DISCLOSURE OF THE INVENTION

According to the first aspect of the present invention, there is provided a packet transmission apparatus for transmitting in a packet form a transmission unit including a data string arranged so as to divide predetermined data into a plurality of blocks, each block having a fixed length, wherein block information for specifying a block type is added to each block. The packet transmission apparatus according to the first aspect of the present invention comprises generating means for generating a transmission header having a new identifier by deleting predetermined redundancy information from the block information belonging to the plurality of blocks based on said data string, and generating a transmission unit having the generated transmission header, and transmitting means for transmitting the transmission unit generated by said generating means by way of a transmission line.

generating means for generating a transmission header having a new identifier by deleting predetermined redundancy information from the block information belonging to the plurality of blocks based on said data string, and generating a transmission unit having the generated transmission header; and transmitting means for transmitting the transmission unit generated by said generating means by way of a transmission line.

Also, in the above-mentioned packet transmission apparatus, the generating means preferably generates a new identifier by making the information of one block represent the information of the plurality of blocks, and generates a transmission header having the generated identifier.

Further, in the above-mentioned packet transmission apparatus, the generating means preferably makes the information of one block represent the information of an identical block.

Furthermore, in the above-mentioned packet transmission apparatus, the generating means preferably deletes the redundancy information including at least one of reserved data and invalid data.

Also, in the above-mentioned packet transmission apparatus, the transmission header preferably includes a time code and a serial number.

Further, in the above-mentioned packet transmission apparatus, the transmitting means preferably transmits the transmission unit by an ATM transmission system using the AAL TYPE 1 as an adaptation layer function of an asynchronous transfer mode.

Furthermore, in the above-mentioned packet transmission apparatus, the transmitting means preferably transmits the transmission unit by an ATM transmission system using the AAL TYPE 5 as an adaptation layer function of an asynchronous transfer mode.

Also, in the above-mentioned packet transmission apparatus, the transmitting means preferably adds a parity for error correction to the generated transmission unit, thereafter, executes an interleave process on data including the added parity for error correction, and outputs data obtained after the interleave process as a transmission unit.

Further, in the above-mentioned packet transmission apparatus, the generating means preferably executes the interleave process by writing the data including the added parity for error correction into a storage apparatus having a matrix form in a first direction of the matrix, and thereafter, reading from the storage apparatus the data in a second direction perpendicular to the first direction of the matrix.

According to the second aspect of the present invention, there is provided a packet transmission apparatus for transmitting in a packet form a transmission unit including a data string arranged so as to divide predetermined data into a plurality of blocks, wherein each block has a fixed length. The packet transmission apparatus according to the second aspect of the present invention comprises a first interleave processing means for executing a first interleave process by writing the data string into a first storage apparatus having a first matrix form in a first direction of the first matrix, and thereafter, reading from the first storage apparatus the data in a second direction perpendicular to the first direction of the first matrix, and for outputting the data obtained after the first interleave process in a unit of data in the second direction, parity adding means for adding a predetermined parity for error correction to data outputted from the first interleave processing means in a unit of data in the second direction, and outputting the data to which the parity for error correction is added, second interleave processing means for executing a second interleave process by writing data outputted from the parity adding means into a second storage apparatus having a second matrix form in a fourth direction of the second matrix coinciding with the second direction of the first matrix, and thereafter, reading from the second storage apparatus the data in a third direction perpendicular to the fourth direction of the second matrix, and for outputting the data obtained after the second interleave process in a unit of data in the third direction, and transmitting means for transmitting data outputted from the second interleave processing means by way of a transmission line, as a transmission unit of a unit of data in the third direction.

Also, the above-mentioned packet transmission apparatus preferably further comprises generating means, provided at a preceding stage of the first interleave processing means, for generating a transmission header having a new identifier by deleting predetermined redundancy information from the block information belonging to the plurality of blocks based on the data string, and outputting data including a transmission unit having the generated transmission header to the first interleave processing means.

Further, in the above-mentioned packet transmission apparatus, the transmitting means preferably transmits the transmission unit by an ATM transmission system using the AAL TYPE 1 as an adaptation layer function of an asynchronous transfer mode.

Furthermore, in the above-mentioned packet transmission apparatus, the transmitting means preferably transmits the transmission unit by an ATM transmission system using the AAL TYPE 5 as an adaptation layer function of an asynchronous transfer mode.

According to the third aspect of the present invention, there is provided a packet transmission apparatus comprising first parity adding means for adding a parity for error detection to a predetermined data string in a direction in which the data string is aligned, and outputting, in a predetermined unit of data, the data string to which the parity for error detection is added, first interleave processing means for executing a first interleave process by writing the data string outputted from the first parity adding means into a first storage apparatus having a first matrix form in a first direction of the first matrix, and thereafter, reading from the first storage apparatus the data in a second direction perpendicular to the first direction of the first matrix, and for outputting the data obtained after the first interleave process, in a unit of data in the second direction, second parity adding means for adding a predetermined parity for error correction to data outputted from the first interleave processing means in a unit of data in the second direction, and outputting the data to which the parity for error correction is added, second interleave processing means for executing a second interleave process by writing data outputted from the second parity adding means into a second storage apparatus having a second matrix form in a fourth direction of the second matrix coinciding with the second direction of the first matrix, and thereafter, reading from the second storage apparatus the data in a third direction perpendicular to the fourth direction of the second matrix, and for outputting the data obtained after the second interleave process, in a unit of data in the third direction, and transmitting means for transmitting data outputted from the second interleave processing means by way of a transmission line, as a transmission unit of a unit of data in the third direction.

Also, the above-mentioned packet transmission apparatus preferably further comprises, generating means, provided at a preceding stage of the first parity adding means, for generating a transmission header having a new identifier by deleting predetermined redundancy information from the block information belonging to the plurality of blocks based on the data string, and outputting data including a transmission unit having the generated transmission header to the first parity adding means.

According to the fourth aspect of the present invention, there is provided a packet transmission apparatus for transmitting in a packet form a transmission unit including a data string arranged so as to divide predetermined data into a plurality of blocks, wherein each block has a fixed length. The packet transmission apparatus according to the fourth aspect of the present invention comprises generating means for generating a plurality of transmission headers having a new identifier from block information belonging to a plurality of blocks based on the data string, and outputting data including a transmission unit having the plurality of generated transmission headers, first interleave processing means for executing a first interleave process by writing data outputted from the generating means into a first storage apparatus having a first matrix form in a first direction of the first matrix, and thereafter, reading from the first storage apparatus the data in a second direction perpendicular to the first direction of the first matrix, and for outputting the data obtained after the first interleave process in a unit of data in the second direction, parity adding means for adding a predetermined parity for error correction to data outputted from the first interleave processing means in a unit of data in the second direction, and outputting the data to which said parity for error correction is added, second interleave processing means for executing a second interleave process by writing data outputted from the parity adding means into a second storage apparatus having a second matrix form in a fourth direction of the second matrix coinciding with the second direction of the first matrix, and thereafter, reading from the second storage apparatus the data in a third direction perpendicular to the fourth direction of the second matrix, and for outputting the data obtained after the second interleave process in a unit of data in the third direction, and transmitting means for transmitting data outputted from the second interleave processing means by way of a transmission line, as a transmission unit of a unit of data in the third direction, wherein the generating means arranges the plurality of transmission headers in the data including the transmission unit so that the plurality of transmission headers are positioned in different units of data in the third direction, respectively.

According to the fifth aspect of the present invention, there is provided a packet transmission apparatus for transmitting in a packet form a transmission unit including a data string arranged so as to divide predetermined data into a plurality of blocks, wherein each block has a fixed length. The packet transmission apparatus according to the fifth aspect of the present invention comprises parity adding means for adding a predetermined parity for error correction to the data string in a predetermined unit of data, and outputting the data to which the parity for error correction is added, interleave processing means for executing an interleave process by writing data outputted from the parity adding means into a storage apparatus having a matrix form in a first direction of the matrix, and thereafter, reading from the storage apparatus the data in a second direction perpendicular to the first direction of the matrix, and for outputting the data obtained after the interleave process in a unit of data in the second direction, and transmitting means for transmitting data outputted from the interleave processing means by way of a transmission line, as a transmission unit of a unit of data in the second direction.

Also, in the above-mentioned packet transmission apparatus, the data unit in the second direction is preferably a cell block unit of an asynchronous transfer mode.

Further, the above-mentioned packet transmission apparatus preferably further comprises generating means, provided at a preceding stage of the parity adding means, for generating a transmission header having a new identifier by deleting predetermined redundancy information from the block information belonging to the plurality of blocks based on the data string, and outputting data including a transmission unit having the generated transmission header to the parity adding means.

According to the sixth aspect of the present invention, there is provided a packet transmission apparatus for transmitting in a packet form a transmission unit including a data string arranged so as to divide predetermined data into a plurality of blocks, wherein each block has a fixed length, and wherein block information for specifying a block type is added to each block. The packet transmission apparatus in accordance with the sixth aspect of the present invention comprises generating means for generating a transmission header having a new identifier by deleting predetermined redundancy information from the block information belonging to the plurality of blocks based on the data string, and generating a transmission unit having the generated transmission header, packet forming means for dividing a data string including the transmission unit generated by the generating means, into a plurality of packets in a unit of MPG transport stream packets, and outputting the plurality of packets, and transmitting means for transmitting the plurality of packets outputted from the packet forming means by way of a transmission line.

BRIEF DESCRIPTION OF THE DRAWINGS

FIGS. 7(A)–7(D) are block diagrams showing an ID transform process executed by the DIF data processing circuit 104 of FIG. 4, wherein FIG. 7(A) is a block diagram showing first 3-byte data before ID transform, FIG. 7(B) is a block diagram showing second 3-byte data before ID transform, FIG. 7(C) is a block diagram showing third 3-byte data before ID transform, and FIG. 7(D) is a block diagram showing 4-byte data obtained after ID transform;

FIGS. 9(A) and 9(B) are block diagrams showing a packet block generating method by means of a block buffer memory control circuit 6003$a$ of FIG. 8, wherein FIG. 9(A) is a block diagram showing the whole body of the packet block and FIG. 9(B) is a block diagram showing the contents of a header 1703 of FIG. 9(A);

FIGS. 21(A)–21(E) are views showing a construction of a seventh preferred embodiment of the present invention, wherein FIG. 21(A) is a block diagram showing a construction of a DIF data processing circuit 104f of the seventh preferred embodiment, FIG. 21(B) is a block diagram showing data inputted from a block buffer memory 6002 to an interleave buffer memory 3000 of FIG. 21(A), FIG. 21 (C) is a memory map showing storage contents of an interleave buffer memory 3000 according to an interleave method executed by an interleave control circuit 3001 of FIG. 21(A), FIG. 21(D) is a block diagram showing data inputted from a parity adding circuit 3002 to an interleave buffer memory 3003 of FIG. 21(A), and FIG. 21(E) is a memory map showing storage contents of an interleave buffer memory 3003 according to an interleave method executed by an interleave control circuit 3004 of FIG. 21(A);

FIGS. 23(A) and 23(B) are views showing an interleave method of the DIF data processing circuit 104f of FIG. 21(A), wherein FIG. 23(A) is a memory map showing storage contents of the interleave buffer memory 3000 according to the interleave method executed by the interleave control circuit 3001 of FIG. 21(A), and FIG. 23(B) is a memory map showing storage contents of the interleave buffer memory 3003 according to the interleave method executed by the interleave control circuit 3004 of FIG. 21(A);

FIGS. 26(A)–26(E) are views showing a construction of an eighth preferred embodiment of the present invention, wherein FIG. 26(A) is a block diagram showing a construction of a DIF data processing circuit 104g of the eighth preferred embodiment, FIG. 26(B) is a block diagram showing data inputted from the block buffer memory 6002 to the CRC adding circuit 3106 of FIG. 26(A), FIG. 26(C) is a block diagram showing data inputted from a CRC adding circuit 3106 to an interleave buffer memory 3000 of FIG. 26(A), FIG. 26(D) is a memory map showing storage contents of the interleave buffer memory 3000 according to the interleave method executed by an interleave control circuit 3001 of FIG. 26(A), FIG. 26(E) is a block diagram showing data inputted from a parity adding circuit 3002 to the interleave buffer memory 3003 of FIG. 26(A), and FIG. 26(F) is a memory map showing storage contents of the interleave buffer memory 3003 according to the interleave method executed by an interleave control circuit 3004 of FIG. 26(A);

FIG. 29 is a view showing a construction of a

FIGS. 29(A)–29(E) are views showing a construction of a ninth preferred embodiment of the present invention, wherein FIG. 29(A) is a block diagram showing a construction of a DIF data processing circuit 104h of the ninth preferred embodiment, FIG. 29(B) is a block diagram showing data inputted from the block buffer memory 6002 to the interleave buffer memory 3000 of FIG. 29(A), FIG. 29(C) is a memory map showing storage contents of the interleave buffer memory 3000 according to an interleave method executed by the interleave control circuit 3001 of FIG. 29(A), FIG. 29(D) is a block diagram showing data inputted from the parity adding circuit 3002 to the interleave buffer memory 3003 of FIG. 29(A), and FIG. 29(E) is a memory map showing storage contents of the interleave buffer memory 3003 according to an interleave method executed by an interleave control circuit 3004 of FIG. 29(A);

FIG. 34 is a block diagram showing a packet block generating method executed by an ATM transmission apparatus provided with the DIF data processing circuit 104i of FIG. 33;

FIG. 35 is a memory map showing storage contents of an ATM cell block sequence buffer memory 1402 according to a packet block generating method executed by the interleave control circuit 1403 of FIG. 33;

FIGS. 36(A)–36(E) are views showing a construction of a twelfth preferred embodiment of the present invention, wherein FIG. 36(A) is a block diagram showing a construction of the DIF data processing circuit 104j of the twelfth preferred embodiment, FIG. 36(B) is a block diagram showing data inputted from a block buffer memory 6002 to the interleave buffer memory 2600 of FIG. 36(A), FIG. 36(C) is a memory map showing storage contents of the interleave buffer memory 2600 according to an interleave method executed by an interleave control circuit 2601 of FIG. 36(A), FIG. 36(D) is a block diagram showing data inputted from a parity adding circuit 2602 to an interleave buffer memory 2603 of FIG. 36(A), and FIG. 36(E) is a memory map showing storage contents of an interleave buffer memory 2603 according to an interleave method executed by an interleave control circuit 2604 of FIG. 36(A);

FIG. 37 is a block diagram showing a packet block generating method of an ATM transmission apparatus provided with a DIF data processing circuit 104j of FIG. 36(A);

FIG. 40 is a block diagram showing a packet block generating method executed by the ATM transmission apparatus 1c of FIG. 39.

BEST MODE FOR CARRYING OUT THE INVENTION PREFERRED EMBODIMENTS

Preferred embodiments of the present invention will be described in detail below with reference to the accompanying drawings.

In regard to the preferred embodiments of the present invention, there will be described an example in which compressed image data, audio data and additional information are transmitted in accordance with the standard of the household digital VTR in an ATM network to be used as a communications network. Herein is used the "DVC Standard" according to the agreement made by the HD DIGITAL VCR CONFERENCE as the standard of the household digital VTR.

The ATM standard is standardized by and disclosed in ITU-T Recommendation Q. 2931, ITU-T Recommendation I. 363, The ATM Forum, ATM User-Network Interface Specification Version 3.0 (referred to as UNI3.0 hereinafter), The ATM Forum, ATM User-Network Interface Specification Version 3.1 (referred to as UNI3.1 hereinafter), The ATM Forum, ATM User-Network Interface Specification Version 4.0 (referred to as UNI4.0 hereinafter) and so on.

The DVC Standard is mentioned in "Specifications of Household Digital VCRs using 6.3 mm magnetic tape" December, 1994 HD DIGITAL VCR CONFERENCE (referred to as a first reference hereinafter), and the digital interface thereof is mentioned in "Specifications of Digital Interface for Consumer Electric Audio/Video Equipment" December, 1995 HD DIGITAL VCR CONFERENCE (referred to as a second reference hereinafter).

It is to be noted that the preferred embodiments of the present invention can be applied to not only the above-mentioned DVC Standard but also the DVCPRO Standard that is the standard for broadcasting stations using an identical image compression system.

The DVCPRO Standard is mentioned in "Proposed SMPTE Standard for Digital Video Recording with video compression at 25 Mb/s 6.35 mm Type D-7 Component Format 525/60 and 625/50(DVCPRO): Final version Dec., 24 1997".

In the following description, there is no hindrance if the DVC, DVC Standard and DVC data are replaced by DVCPRO, and this does not influence the subject matter of the present invention.

First Preferred Embodiment

Figure 1:
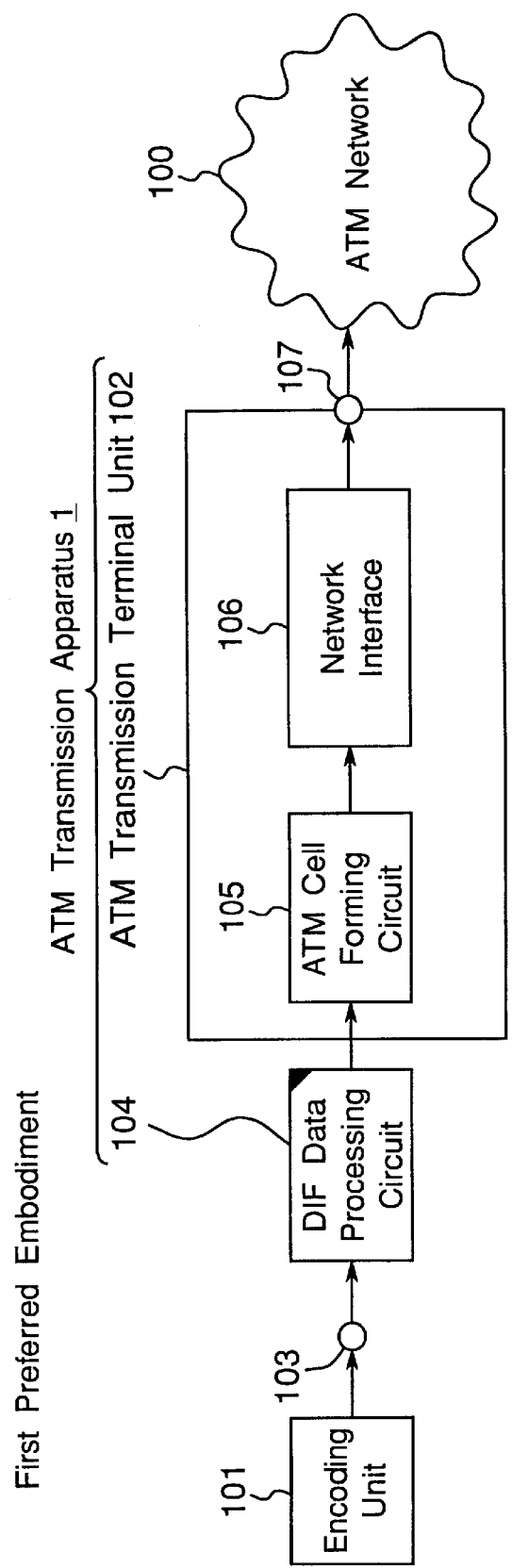
FIG. 1 is a block diagram showing a construction of an ATM transmission apparatus 1 according to a first preferred embodiment of the present invention.

FIG. 1 is a block diagram showing a construction of an ATM transmission apparatus 1 according to a first preferred embodiment of the present invention. In FIG. 1 and the other figures, the triangular mark located in the upper right-hand position of each block indicates that the block is the characteristic portion of the preferred embodiment. In FIG. 1 are shown an encoding unit 101, an ATM transmission terminal unit 102, an input terminal 103 of the ATM transmission terminal unit 102, a digital interface data processing circuit 104 (referred to as a DIF data processing circuit hereinafter, and the digital interface will be referred to as DIF hereinafter), an ATM cell forming circuit 105, a network interface 106 and an output terminal 107 for an ATM network 100. In this case, the ATM transmission apparatus 1 is constituted by comprising the DIF data processing circuit 104 and the ATM transmission terminal unit 102, wherein the ATM transmission terminal unit 102 is constituted by comprising the ATM cell forming circuit 105 and the network interface 106.

In the construction shown in FIG. 1, a data string including encoded compressed image and audio data as well as additional information is outputted from the encoding unit 101, and then, is inputted via the input terminal 103 to the DIF data processing circuit 104 of the ATM transmission apparatus 1. The DIF data processing circuit 104 generates a transmission header having a new identifier by deleting predetermined redundancy information from block information belonging to a plurality of blocks based on the inputted data string, generates a transmission unit having the generated transmission header, and then, outputs the transmission unit to the ATM cell forming circuit 105 as described in detail later. In response to this, the ATM cell forming circuit 105 generates a packet to be transmitted by dividing the inputted data including the transmission unit into ATM cell blocks, and then, outputs the packet to the network interface 106. In response to this, the network interface 106, which is provided with a transmitter and a receiver for the ATM network 100, transmits the inputted packet via the output terminal 107 to the ATM network 100, thereby transmitting the packet to the ATM transmission terminal unit of the destination indicated by the transmission header.

Figure 2:
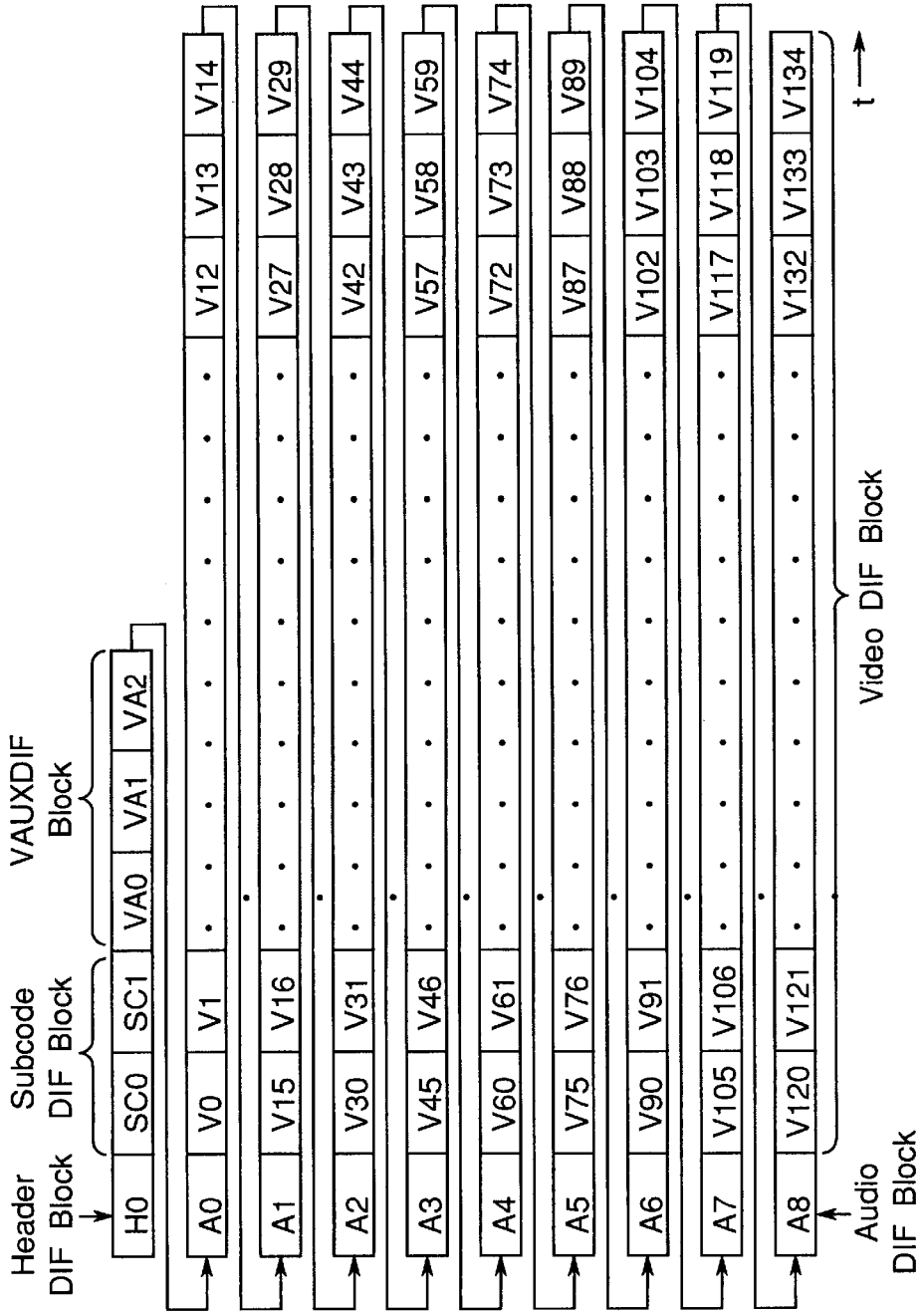
FIG. 2 is a block diagram showing a construction of data outputted from an encoding unit 101 of FIG. 1.

FIG. 2 is a block diagram showing a construction of data outputted from the encoding unit 101 of FIG. 1, and the form of the data is mentioned in the above-mentioned second reference. The data stream shown in FIG. 2 is constructed of a series of a plurality of blocks, each block being called the DIF block. Data of one frame is constructed by repeating the series of data sequence shown in FIG. 2, and therefore, the data stream of FIG. 2 is called the subsequence in the following description.

In FIG. 2, H0 denotes a header DIF block, SC0 and SC1 denote subcode DIF blocks, VA0, VA1 and VA2 denote video AUX DIF blocks (referred to as VAUX hereinafter) and A0, A1, . . . , A8 denote audio DIF blocks inserted between video DIF blocks described later. Further, V0, V1, . . . , V134 denote the video DIF blocks. Each DIF block is constructed of a total of 80 bytes comprised of a 3-byte ID and 77-byte data as shown in FIG. 3.

The header DIF block is mounted with control information relevant to the subsequence, the audio DIF block is mounted with audio data and auxiliary data relevant to audio, the video DIF block is mounted with video data, the video AUXDIF block is mounted with auxiliary data relevant to video and the subcode block is mounted with other additional information.

Figure 3:
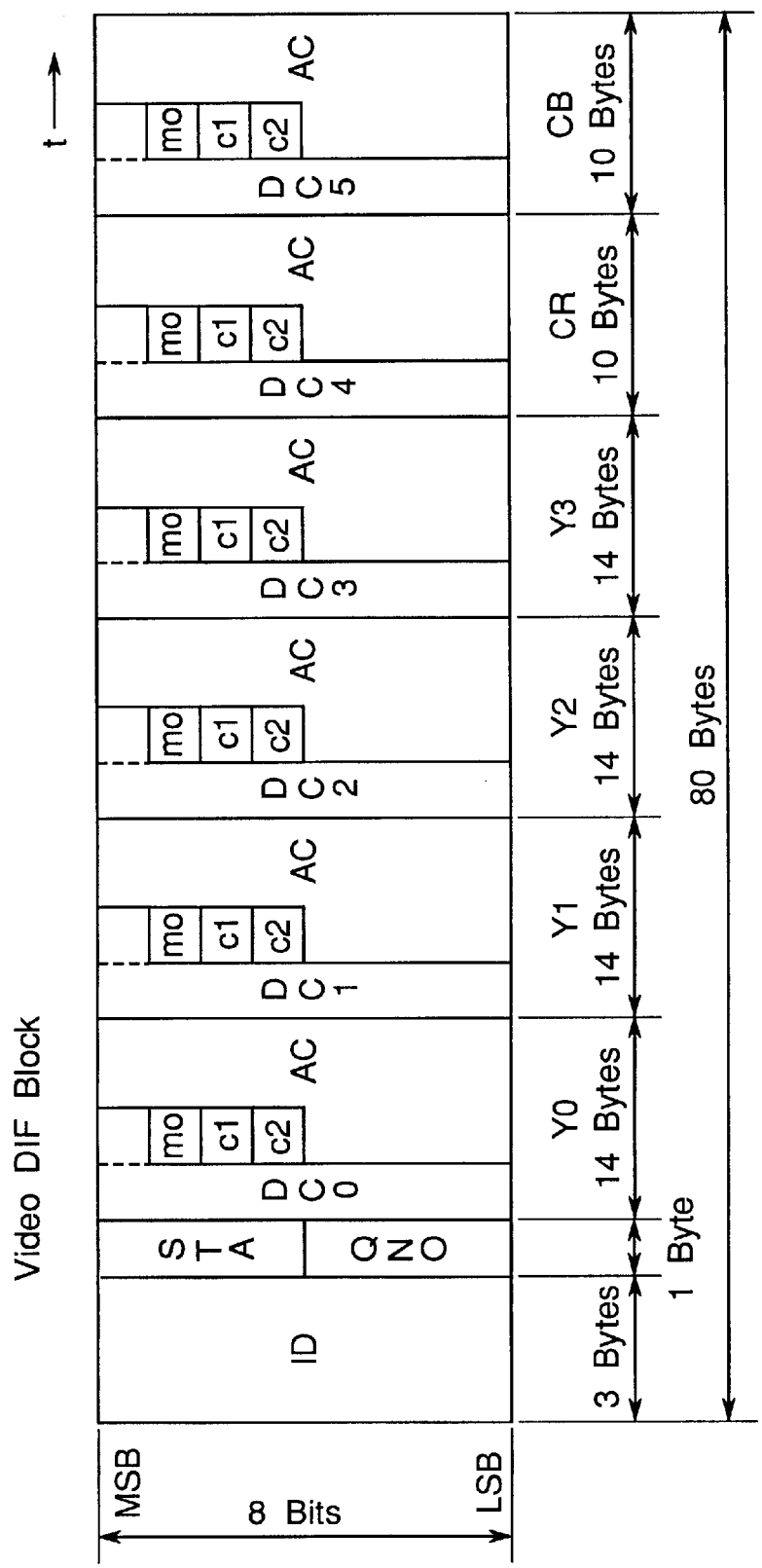
FIG. 3 is a block diagram showing a construction of a video DIF block of FIG. 2.

FIG. 3 is a block diagram showing a construction of the video DIF block of FIG. 2. In FIG. 3, the data of the video DIF block is constructed by dividing the screen into small units, each unit being called the macro block and subjecting the blocks to DCT transform or the like.

Among the 80 bytes of the video DIF block, the first three bytes represent an ID, and the higher-order four bits of the next one byte represent the error status (SAT). The error status stores information indicating whether an error exists in the DIF block, indicating whether the DIF block is the error-corrected or error-concealed DIF block, and indicating what correction method is used in the case of the error-corrected or error-concealed DIF block. The lower-order four bits represent the quantization number (QNO), and the succeeding blocks each having 14 bytes represent the luminance signal information (Y0, Y1, Y2 and Y3) of each macro block, and the succeeding two blocks each having 10 bytes represent the color-difference signal information (CR, CB), mo represents the DCT mode, and C0 and C1 represent the class number. It is to be noted that FIG. 3 is identical to the above-mentioned DVCPRO standard of "Proposed SMPTE Standard for Digital Video Recording with video compression at 25 Mb/s 6.35 mm Type D-7 Component Format 525/60 and 625/50 (DVCPRO): Final version Dec. 24, 1997" of FIG. 40, and the compression method is also described in detail in the same reference.

What is important in the preferred embodiment of the present invention is the fact that the information representing the error status of each video DIF block is only one.

As shown in FIG. 2, there is a total of 150 DIF blocks comprised of one header DIF block, two subcode DIF blocks, three VAUXDIF blocks, nine audio DIF blocks and 135 video DIF blocks, and then, the 150 DIF blocks form one. subsequence having a total of 80 bytes×150=12000 bytes.

According to the NTSC system having 525 scanning lines and 60 frames (referred to as a 525/60 system hereinafter), 10 subsequences constitute one frame data.

According to the PAL system having 625 scanning lines and 50 frames (referred to as a 625/50 system hereinafter), 12 subsequences constitute one frame data. Therefore, the number of DIF blocks in one frame becomes 150×10=1500 in the 525/60 system or becomes 150×12=1800 in the 625/25 system. The following description is based on an example of the 525/60 system.

The first-preferred embodiment is characterized in that the DIF blocks are subjected to transform for data amount reduction. Specifically, when collectively handling a plurality of DIF blocks as one transmission unit, the 3-byte ID inside each DIF block is not always necessary for every DIF block, and the data amount reduction is executed by making one ID represent all the IDs or replacing the IDs with another ID having a smaller data amount than the data amount of all the IDs. Furthermore, the data amount reduction is executed by reducing the redundant data such as the reserved data and/or invalid data in the data.

Figure 5:
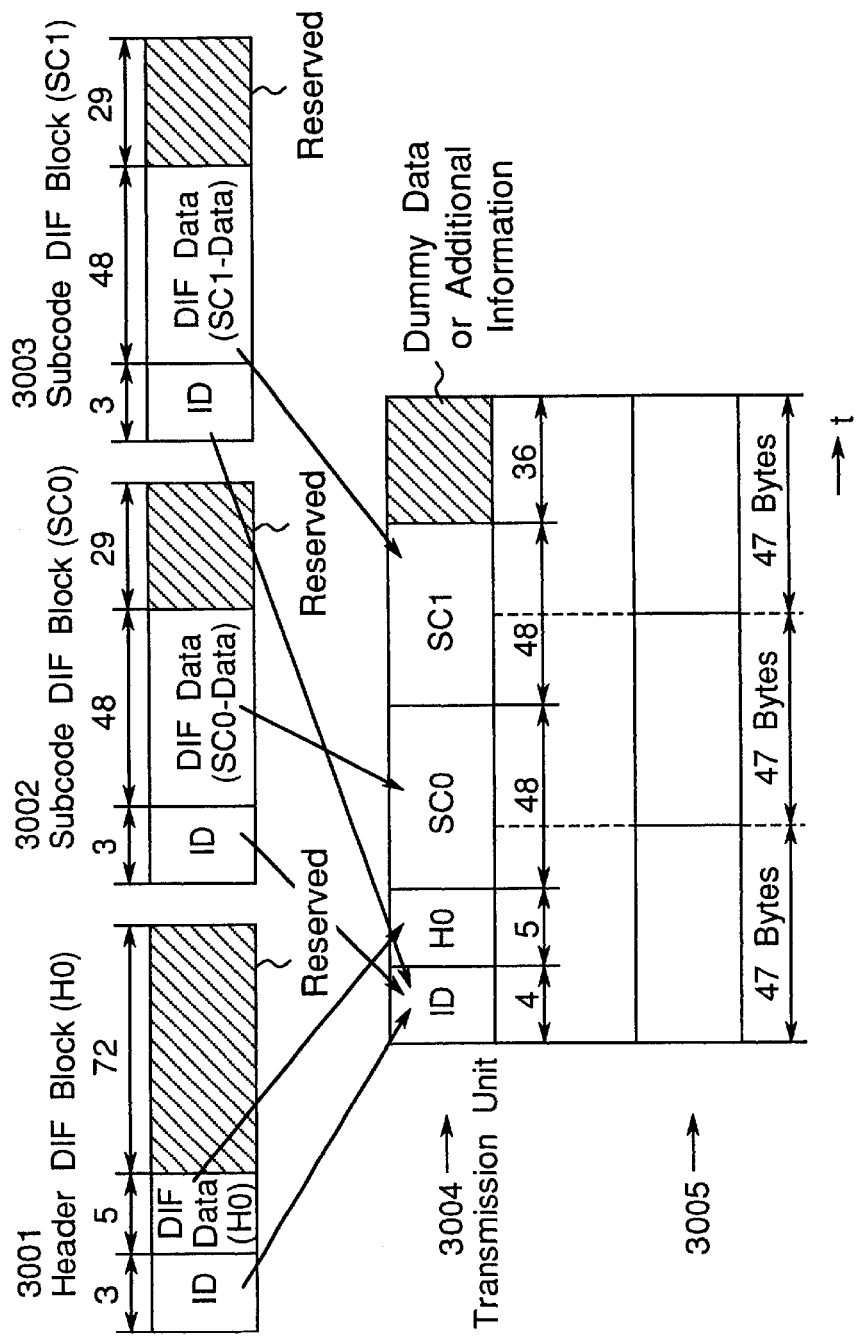
FIG. 5 is a block diagram showing a constructions of a header DIF block and a subcode DIF block of FIG. 2.

FIG. 5 is a block diagram showing a constructions of the header DIF block and the subcode DIF block of FIG. 2, where is shown a block transform of the header and subcode blocks constituting the three DIF blocks located at the head of the subsequence.

In FIG. 5 are shown a header DIF block (H0) 3001, a subcode DIF block (SC0) 3002, and a subcode DIF block (SC1) 3003. In the present preferred embodiment, reduction of the data amount is executed with the above three DIF blocks (240 bytes in total) used as a transmission unit of 141 bytes (denoted by 3004). The sections of 72 bytes, 29 bytes and 29 bytes at the tail of the three DIF blocks 3001, 3002 and 3003 are reserved data.

First of all, the ID of three bytes in each of the above three DIF blocks (nine bytes in total) is reduced to four bytes by a method as described later with reference to FIG. 7 for the execution of data amount reduction. Next, since the valid data of the header DIF block H0 has five bytes, the 5-byte valid data is continuously placed closely. Next, each of the valid data of the subcode DIF block SC0 and the valid data of the subcode DIF block SC1 has 48 bytes, the data are successively placed closely. Finally, 36-byte dummy data is inserted into the hindmost portion of the transmission unit 3004 as shown in the hatched section. It is to be noted that additional information may be inserted in this hatched section.

The transmission unit 3004 has a total of 141 bytes, and therefore, the transmission unit 3004 can be divided into three blocks each having 47 bytes as denoted by 3005.

Figure 6:
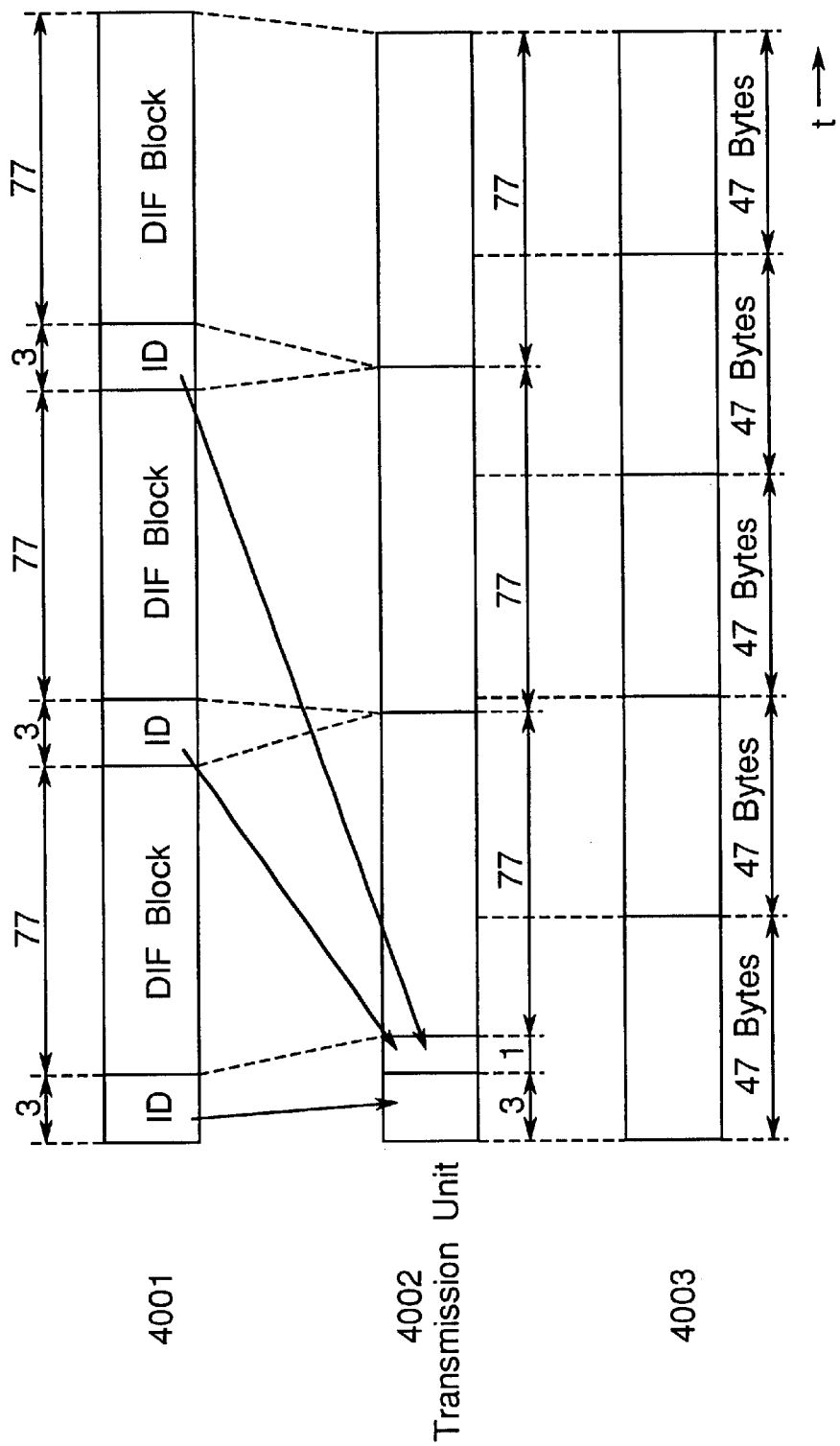
FIG. 6 is a block diagram showing one of the VAUXDIF block, audio DIF block and video DIF block of FIG. 2.

FIG. 6 is a block diagram showing a block transform process of one of the VAUXDIF block, audio DIF block and video DIF block of FIG. 2. In FIG. 6, the reference numeral 4001 denotes continuous three blocks of the above DIF blocks in the subsequence. There are continuous three blocks of, for example, "VA0, VA1, VA2", "A0, V0, V1" and "V2, V3, V4".

First of all, the 3-byte IDs of the continuous three blocks are reduced to four bytes by the method described later (See FIG. 7) for the execution of data amount reduction. Next, 77 bytes of the data section of each DIF block are successively placed closely. As a result, the data of 240 bytes of the original data block 4001 can be reduced to 235 bytes as denoted by a transmission unit 4002, thereby allowing the data amount reduction to be achieved. The transmission unit 4002 can be divided into five blocks each having 47 bytes as denoted by 4003.

Figure 4:
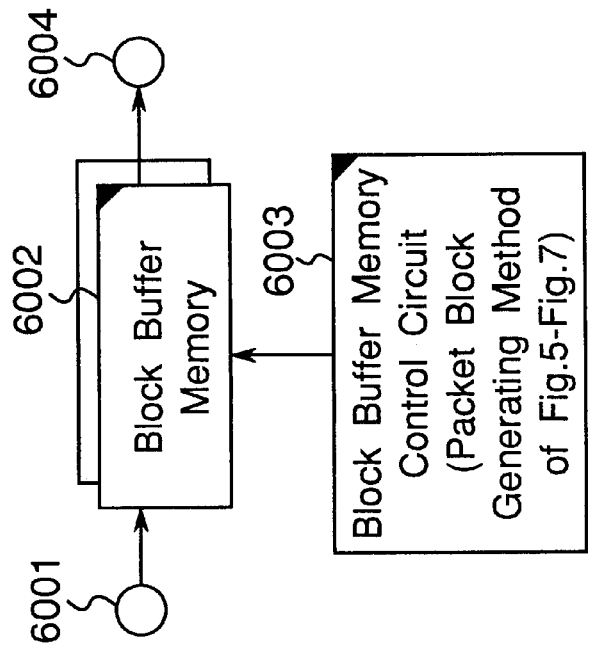
FIG. 4 is a block diagram showing a construction of a DIF data processing circuit 104 of FIG. 1.
Figure 7:
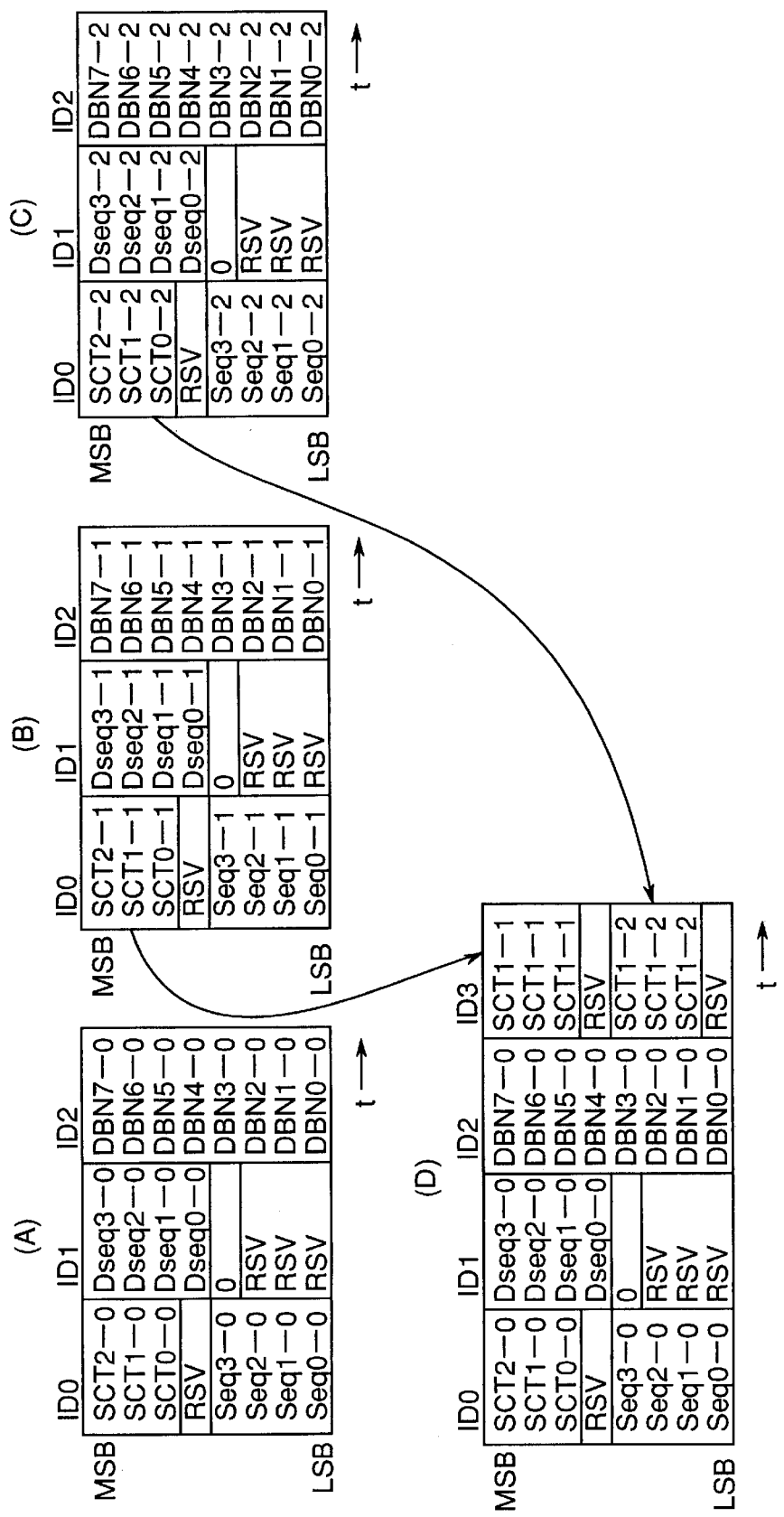

FIG. 7 is a block diagram showing an ID transform process executed by the DIF data processing circuit 104 of FIG. 4, wherein FIG. 7(A) is a block diagram showing first 3-byte data before ID transform, FIG. 7(B) is a block diagram showing second 3-byte data before ID transform, FIG. 7(C) is a block diagram showing third 3-byte data before ID transform and FIG. 7(D) is a block diagram showing 4-byte data obtained after ID transform.

As described with reference to FIG. 5 and FIG. 6, in the first preferred embodiment, the data amount reduction is executed by transforming the IDs each having three bytes of the three DIF blocks into one ID of four bytes.

In FIG. 7, SCT denotes the section type, Seq denotes the sequence number, Dseq denotes the DIF sequence number and DBN denotes the DIF block number. A bit number is attached to the tail of each code, and the bit number is followed by a hyphen (-) and the serial number "0" in FIG. 7(A), the serial number "1" in FIG. 7(B) and the serial number "2" in FIG. 7(C). It is to be noted that RSV denotes reserved data.

The section type SCT indicates the type of the DIF block, where the types of the header, subcode, VAUX, audio and video are expressed by three bits. The sequence number Seq indicates the correspondence to a color frame type. The DIF sequence number Dseq indicates the subsequence number. Since the 525/60 system is comprised of 10 subsequences, the values of 0 to 9 are expressed by four bits. Since the 625/50 system is comprised of 12 subsequences, the values of 0 to 11 are expressed by four bits.

The DIF block number DBN indicates the number of the DIF block in the subsequence by eight bits. For example, 135 video DIF blocks exist in one subsequence, and therefore, the values of 0 to 134 are expressed by binary digits. Nine audio DIF blocks exist in one subsequence, and therefore, the values of 0 to 8 are expressed by binary digits.

This first preferred embodiment directs its attention to the fact that three pieces of common data are not necessary for the IDs when integrating three IDs into one ID and only one DIF block number is necessary when integrating the IDs of continuous DIF blocks by a prescribed method. Specifically, the sequence numbers Seq are identical within the subsequence among the bits constituting the IDs, and there is no need for transmitting all the three blocks. The DIF sequence numbers Dseq are identical or the same within the subsequence, and there is no need for transmitting all the three blocks. The DIF block numbers DBN of all the three blocks are not necessary if the inputted data string is subjected to the block transform in the prescribed order.

As described above, as shown in FIG. 7(D), a new ID is constructed by bringing the arrangement of FIG. 7(A) as it is into the places of the first three bytes and bringing into the place of the fourth byte the higher-order three bits of the section type SCT of (B), the reserve bit, the three bits of the section type SCT of (c) and the reserve bit in this order. With this arrangement, the amount of data comes to have a data length of 235 bytes (p=235<3×80) by reducing the redundancy information from the three (m=3) blocks, each block having a fixed length of 80 bytes (n=80).

According to the method shown in FIG. 5 to FIG. 7, there are three blocks of 47 bytes of the header DIF block and the subcode DIF block. Since the VAUX, the audio DIF block and the video DIF block are comprised of a total of 147 DIF blocks, there are (147/3)×5=245 47-byte blocks. Accordingly, there is a total of 248 47-byte blocks of all the DIF blocks. The data amount of 47 bytes, which corresponds to the payload of the AAL TYPE 1 of the ATM, will be referred to as an ATM cell block in the following description.

It is to be noted that the three IDs (DIF blocks) are integrated into one in the first preferred embodiment, the present invention is not limited to this, and it is acceptable to integrate another number of IDs.

Although the method shown in FIG. 7 has been described by taking the continuous three DIF blocks as an example, the continuation is not the essential factor, and the case where the ID information is reduced from a plurality of arbitrary DIF blocks is not excluded from the scope of the present invention.

When integrating continuous three DIF blocks into one, it is sometimes the case where the audio DIF block and the video DIF block are mixed with each other. Therefore, newly-constructed three IDs (See FIG. 7(D)) are inserted only for the section type SCT. With this arrangement, even when the audio DIF block and the video DIF block are mixed with each other, their positions in the subsequence can be identified by the three section types of the newly-constructed three IDs (See FIG. 7(D)) and the block numbers.

FIG. 4 is a block diagram showing a construction of the DIF data processing circuit 104 of FIG. 1 for executing block transform. In FIG. 4 is shown an input terminal 6001 to which the DIF block subsequence is inputted. There are shown a block buffer memory 6002, a block buffer memory control circuit 6003 and an output terminal 6004.

The block buffer memory 6002 can store therein continuous three DIF blocks. The data write and read control of the block buffer memory 6002 is executed by the block buffer memory control circuit 6003.

In regard to the DIF subsequence inputted from the input terminal 6001, three DIF blocks are written into the block buffer memory 6002 under the control of the block buffer memory control circuit 6003. The reading is executed by designating the address of the block buffer memory 6002 according to the method shown in FIG. 5 for the header DIF block and the subcode DIF block and according to the method shown in FIG. 6 for the VAUXDIF block, the audio DIF block and the video DIF block. The block buffer memory 6002 is constructed of two buffer memories, where writing and reading are alternately executed.

The block buffer memory control circuit 6003 is provided with a DIF block counter for counting DIF blocks, and the counter is counting the DIF blocks that are being currently written and the DIF blocks that are currently being read. The read address is preliminarily fixed according to the methods shown in FIG. 5 and FIG. 6, and therefore, the read address can be simply generated by storing a control program of the methods into a ROM of a small storage capacity and incorporating the ROM into the block buffer memory control circuit 6003.

According to the ID transform shown in FIG. 7, there is required a circuit for forming eight bits by adding the higher-order four bits of the first byte of FIG. 7(B) and the higher-order four bits of the first byte of FIG. 7(C) to the fourth byte of FIG. 7(D). This circuit can be constructed by, for example, a simple register and incorporated into the block buffer memory 6002.

The output terminal 6004 of the DIF data processing circuit 104 of FIG. 4, first of all, outputs three ATM cell blocks from the header DIF block and the subcode DIF blocks from the head of the DIF block subsequence as indicated by 3005 in FIG. 5. Subsequently, as indicated by 4003 in FIG. 6, 245 ATM cell blocks are outputted from the VAUX, the audio DIF block and the video DIF block.

As described above, according to the first preferred embodiment, the amount of ID information can be further reduced by integrating three DIF blocks, producing the effects as follows.

Only a total of 248 ATM cell blocks constructed of 47 bytes are outputted, and therefore, the total data amount becomes 11656 bytes. The original DIF block subsequence has 150 DIF blocks of 80 bytes, and accordingly, the data has 12000 bytes. Therefore, a data amount reduction of:

(12000−11656)/12000×100=2.87% can be achieved. In terms of the ATM cell block, this leads to require 256 ATM cells for transmitting the original data since:

12000/47=255.3, however, the original data can be transmitted by 248 ATM cells in the first preferred embodiment as described above.

According to the first preferred embodiment of the present invention, the communications load can be remarkably reduced and the use of the resources of the communications network can be reduced. By virtue of the reduction in amount of communications, the communications time becomes short, thereby improving the reliability of the real-time communications by that much or degree. The communications zone used by the ATM network is reduced, the load applied on the network becomes small and the load applied on an ATM switching process becomes small. Therefore, the probability of the cell disposal or the like becomes small, so that highly-reliable communications tolerant of cell loss can be achieved. Furthermore, this preferred embodiment can be achieved with a very simple circuit construction.

The data sequence obtained after the DIF block subsequence process as described in the first preferred embodiment will be referred to as an ATM cell block sequence. The ATM cell block sequence is constructed of 11656 bytes as described above.

The system of the first preferred embodiment is used in the following preferred embodiments, and the numbers of the circuit block diagram shown in FIG. 4 are also used for the same blocks in the other figures.

The system of the first preferred embodiment is also used as data processing means for executing the process appropriate for subordinate layers in the preferred embodiments described as follows.

Although the ATM is used as the transmitting means for the explanation of the first preferred embodiment, the transmitting means is not limited to the ATM. The subject matter of the present invention capable of reducing the amount of communications does not change even when an Ethernet or a fiber channel is used, and no transmitting means is excluded from the scope of the invention of the present application.

Second Preferred Embodiment

Figure 8:
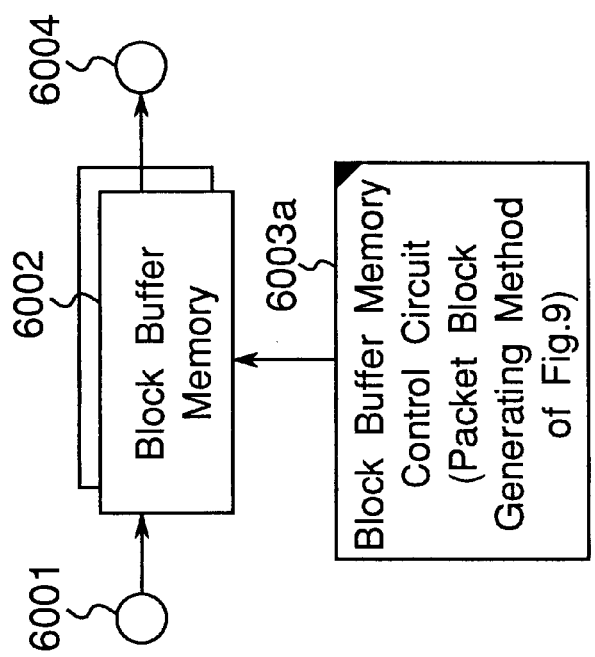
FIG. 8 is a block diagram showing a construction of a DIF data processing circuit 104$a$ according to a second preferred embodiment of the present invention.

FIG. 8 is a block diagram showing a construction of a DIF data processing circuit 104a according to a second preferred embodiment of the present invention. This second preferred embodiment is characterized in that the data amount reduction is executed by executing DIF block transform. In the second preferred embodiment, the 3-byte ID in each DIF block is not always necessary for all the DIF blocks when collectively handling a plurality of DIF blocks as one transmission unit similar to that of the first preferred embodiment, and the data amount reduction is executed by replacing the IDs with another ID having a smaller data amount than the data amount of all the IDs.

FIGS. 9(A) and 9(B) are block diagrams showing a packet block generating method by means of the block buffer memory control circuit 6003a of FIG. 8, wherein FIG. 9(A) is a block diagram showing the whole body of the packet block and FIG. 9(B) is a block diagram showing the contents of the header 1703 of FIG. 9(A). FIG. 9(A) shows the DIF block transform, by which six DIF blocks are integrated into one block. The reference numeral 1700 denotes six DIF blocks. The six DIF blocks may be six DIF blocks of a continuous subsequence or arbitrary six DIF blocks according to a prescribed method. The DIF blocks are not limited to those inside the subsequence, and the DIF blocks may be those across subsequences.

The reference numeral 1701 denotes a data block obtained by collecting only the valid data of each DIF block. Each DIF block has valid data of 77 bytes, and therefore, this results in 6×77=462 bytes. Then, as denoted by the reference numeral 1702, a header 1703 is attached to the head of the data block 1701. The reference numeral 1702 will refer to a transmission unit hereinafter.

FIG. 9(B) shows the detail of the header 1703. In the second preferred embodiment, the header 1703 is constructed of five bytes, among which the first four bytes represent a time code (TC) and the last one byte represents the sequence number (SNo) inside one frame.

In regard to the time code, for example, the subcode block of the DIF block has time code information of four bytes, and therefore, it is proper to use the data as it is. The time code is not limited to the information inside the subcode, and an independent time code may be attached. The time code is not limited to four bytes.

The time code is, for example, HH-hour MM-minute SS-second FF-frame (referred to as an HH:MM:SS:FF frame hereinafter). For example, if the n-th frame is 01:02:03:00, then the time code increases every frame as exemplified by 01:02:03:01 for the (n+1)-th frame and 01:02:03:02 for the (n+2)-th frame. By this time code, the video frame to which each transmission unit belongs can be identified.

The subsequence shown in FIG. 2 is constructed of 150 DIF blocks, and one frame is constructed of 10 subsequences. Accordingly, there is a total of 1500 DIF blocks. Each transmission unit is constructed of six DIF blocks, and therefore, one frame data is constructed of 1500/6 250 transmission units. By attaching the numbers of 0 to 249 to the sequence number (SNo) inside one frame of FIG. 9(B), the transmission unit inside one frame can be identified.

For example, the foremost transmission unit of the foremost subsequence of the first frame is constructed of six DIF blocks of H0, SC0, SC1, VA0, VA1, and VA2 of FIG. 2, and the sequence number SN is zero. The next transmission unit is constructed of six DIF blocks of A1, V0, V1, V2, V3, V4 and V5, and the sequence number SN is one. One subsequence is constructed of:

$$150/6=25$$

transmission units, and therefore, the foremost transmission unit of the next subsequence is constructed of six DIF blocks of H0, SC0, SC1, VA0, VA1 and VA2 of FIG. 2, and the sequence number (SNo) is twenty five.

As described above, in the present preferred embodiment, the sequence numbers (SNo) are sequentially attached to the transmission units inside one frame.

As a transmitting means, there can be used the ATM, Ethernet, fiber channel or the like as exemplified in the first preferred embodiment for the achievement of transmission.

As described above, according to the present preferred embodiment, the six 80-byte DIF blocks are integrated into the 467-byte transmission unit 1702 with the header, and therefore, an information amount reduction of:

$$(80\times6-467)/(80\times6)\times100\ 2.7\%$$

can be achieved, so that an advantageous effect similar to that of the first preferred embodiment can be obtained.

Figure 9:
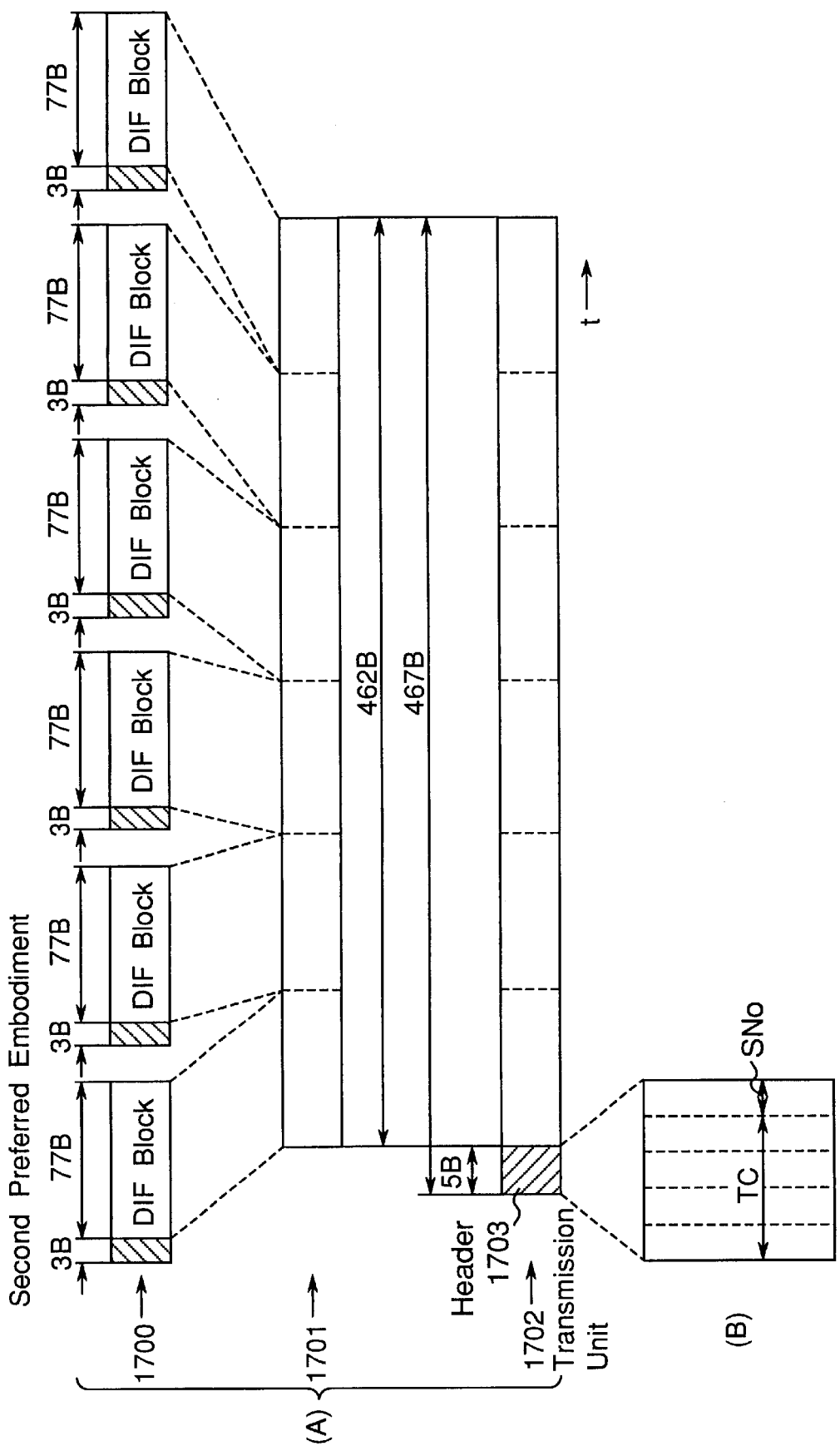

Although a circuit similar to the DIF data processing circuit 104 of the first preferred embodiment of FIG. 4 is used for materializing the second preferred embodiment, a block buffer memory control circuit 6003a having a varied packet block generating method as shown in FIG. 8 is employed. The method shown in FIG. 9 is fixed, and therefore, the read address can be easily generated by executing the writing into the block buffer memory 6002 in the order of the data inputted from the input terminal 6001, storing a read control program into a ROM of a small storage capacity and integrating the ROM into the block buffer memory control circuit 6003.

In regard to the time code of the header 1703 of the transmission unit 1702, when using the one stored in the subcode, it is proper to provide the block buffer memory 6002 with a buffer memory specially for the time code (TC), store the time code (TC) in accordance with the timing at which the time code (TC) is inputted, and output the time code in accordance with the timing of the head of each transmission unit 1702. The time required for the detection of the time code (TC) inside the subcode can be easily adjusted by delaying the read timing from the block buffer memory 6002.

When an individual time code (TC) is independently attached, a simple counter to be incremented every frame is used. It is proper to reset the sequence number SNo at the head of the frame and increment the sequence number for each transmission unit.

Although the transmission unit of the second preferred embodiment is generated from the six DIF blocks, the present invention is not limited to this number, and it is a matter of course that the reduction amount of the DIF block headers is greater when the transmission unit is generated from a greater number of DIF blocks, for the achievement of a high reduction rate of the total amount of information.

Third Preferred Embodiment

Figure 10:
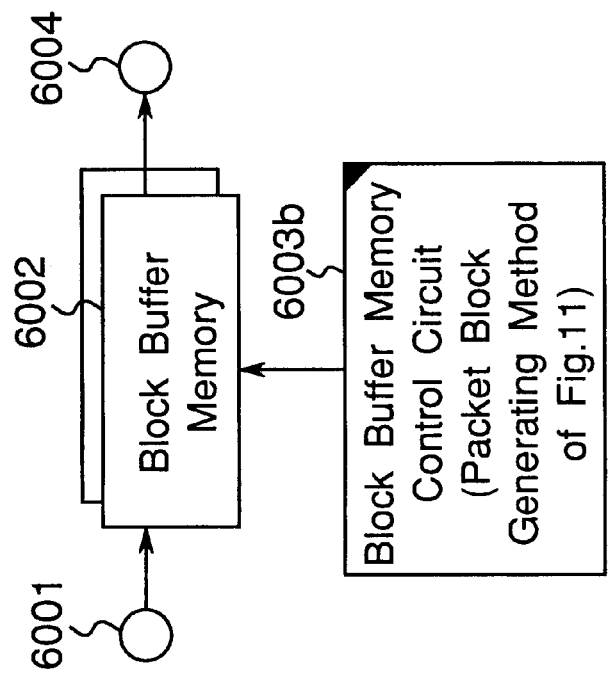
FIG. 10 is a block diagram showing a construction of a DIF data processing circuit 104$b$ according to a third preferred embodiment of the present invention.

FIG. 10 is a block diagram showing a construction of a DIF data processing circuit 104b according to a third preferred embodiment of the present invention. This third preferred embodiment is characterized in that a transmission unit is generated from a greater number of DIF blocks than those of the second preferred embodiment in the first preferred embodiment.

Figure 11:
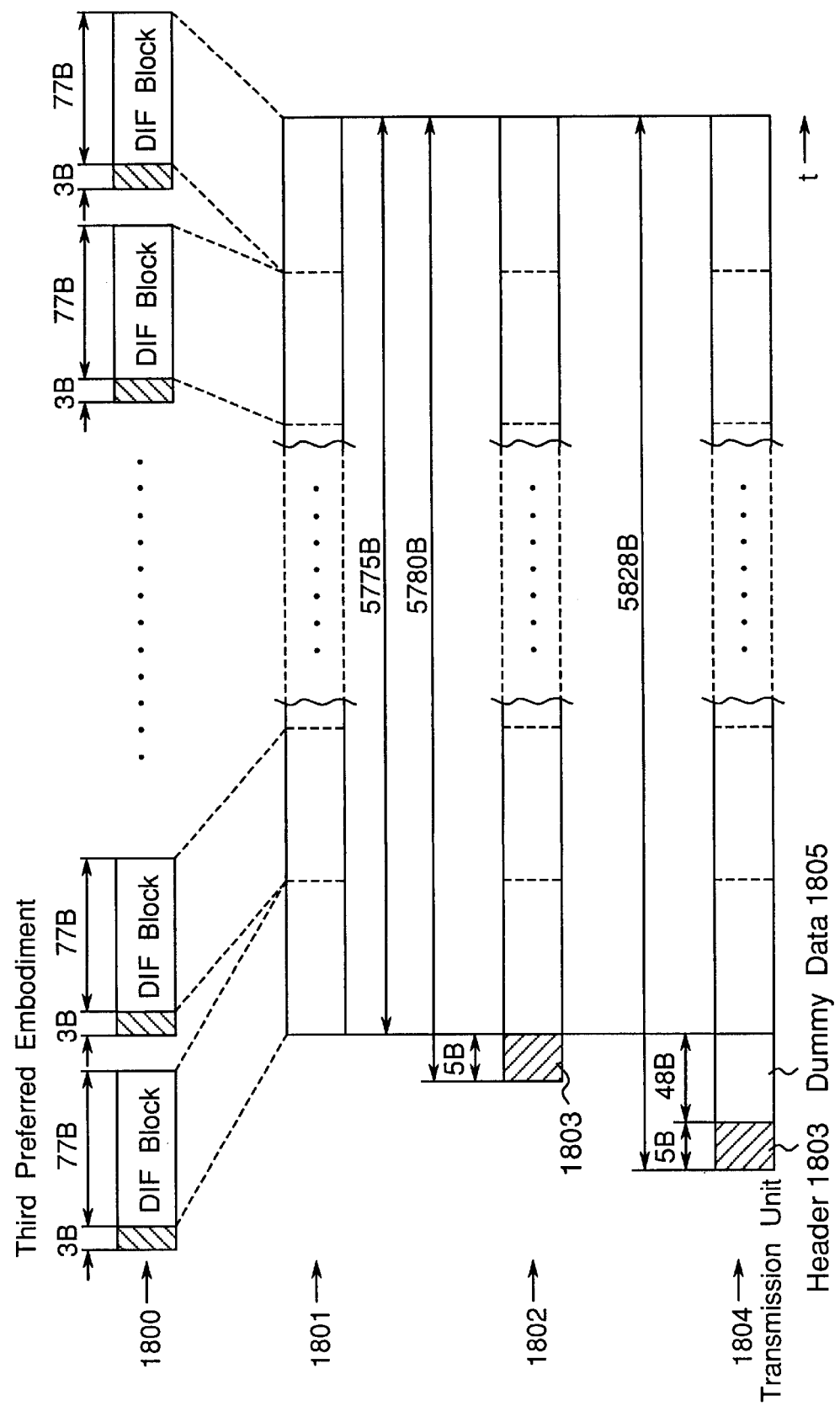
FIG. 11 is a block diagram showing a packet block generating method by means of a block buffer memory control circuit 6003$b$ of FIG. 10.

FIG. 11 is a block diagram showing a packet block generating method by the block buffer memory control circuit 6003b of FIG. 10. FIG. 11 shows a DIF block transforming process, which forms a transmission unit 1804 from 75 DIF blocks 1800. The reference numeral 1801 denotes a data block obtained by collecting only the valid data of each DIF block. If the data blocks are collected, then this results in a total of 77 (75=5775 bytes as denoted by 1801. A transmission unit header 1803 indicated by the hatching in a data block 1802 has five bytes identical to that described with reference to FIG. 9(B) in the second preferred embodiment. Therefore, the data block 1802 has 5780 bytes. In this case, each data block 1802 is constructed of 75 DIF blocks, and therefore, the data of one frame is constructed of 1500/6=20 transmission units. Therefore, by giving serial numbers of 0 to 19 to the sequence numbers SNo in one frame, the transmission unit in one frame can be identified.

As a transmitting means, there can be used the ATM, Ethernet, fiber channel or the like as exemplified in the first preferred embodiment for the achievement of transmission.

As described above, the 75 DIF blocks of 80 bytes are integrated into the transmission unit 1802 of 5780 bytes in the third preferred embodiment, and therefore, an information amount reduction of:

(80×75−5780)/(80×75)×100=3.6% can be achieved, so that an advantageous effect similar to that of the first preferred embodiment can be obtained.

Although a circuit similar to the DIF data processing circuit 104 of the first preferred embodiment of FIG. 4 is used for materializing the third preferred embodiment, the block buffer memory control circuit 6003b having a varied packet block generating method as shown in FIG. 10 is employed.

The dummy data is added next to the header 1803 of the transmission unit 1804, and the adding of the dummy data can be achieved by outputting a predetermined value in accordance with a predetermined timing from the block buffer memory 6002. For example, it is acceptable to preparatorily store dummy data in the block buffer memory 6002, and then, output the data.

The dummy data adding timing is controlled by the block buffer memory control circuit 6003b and is able to be easily realized by deciding the dummy data adding timing by means of a counter or the like and indicating the address in which the dummy data is stored inside the block buffer memory 6002.

Fourth Preferred Embodiment

Figure 12:
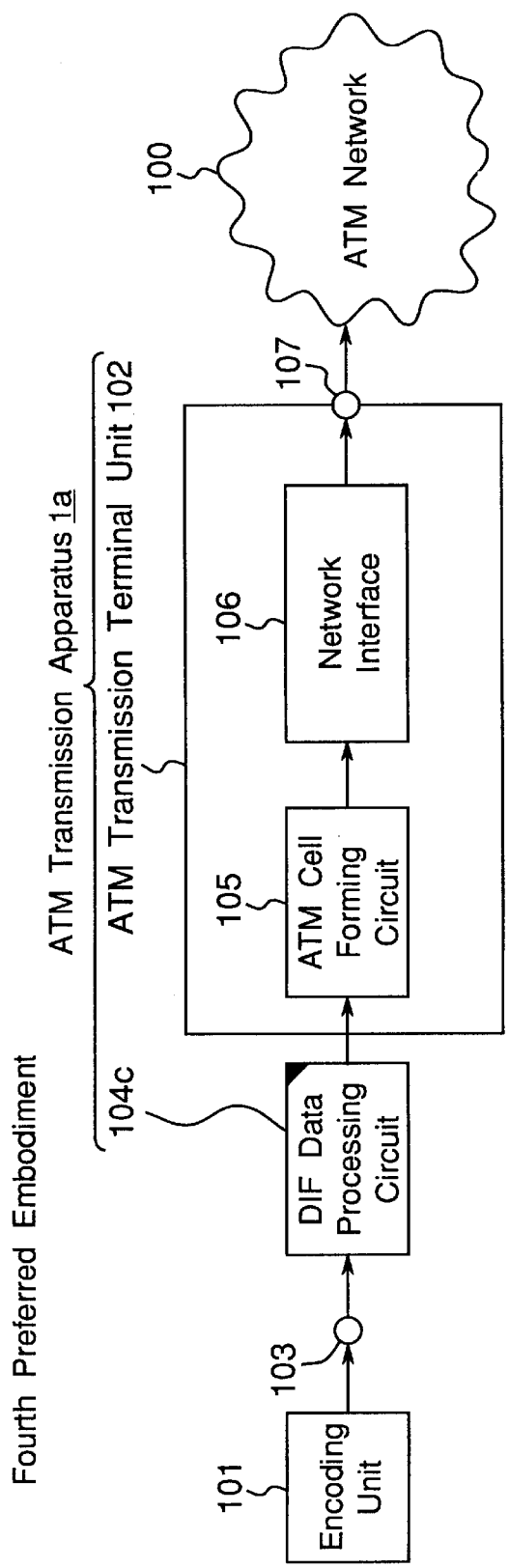
FIG. 12 is a block diagram showing a construction of an ATM transmission apparatus 1$a$ according to a fourth preferred embodiment of the present invention.
Figure 13:
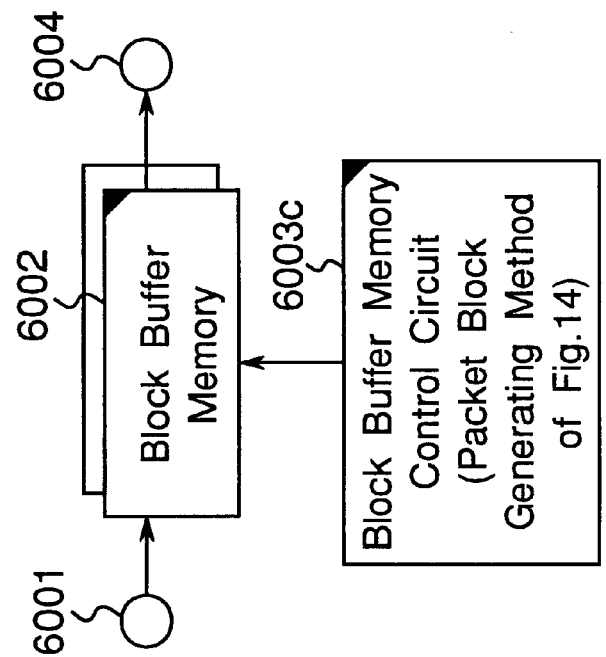
FIG. 13 is a block diagram showing a construction of a DIF data processing circuit 104c of FIG. 12.

FIG. 12 is a block diagram showing a construction of an ATM transmission apparatus 1a according to a fourth preferred embodiment of the present invention. FIG. 13 is a block diagram showing a construction of a DIF data processing circuit 104c of FIG. 12. The fourth preferred embodiment is characterized in that the ATM cell block sequence of the first preferred embodiment is used as an example of data to be transmitted and the ATM transmission terminal unit 102 transmits a data packet by means of an adaptation layer protocol prescribed by the AAL TYPE 1 of the ATM.

Figure 14:
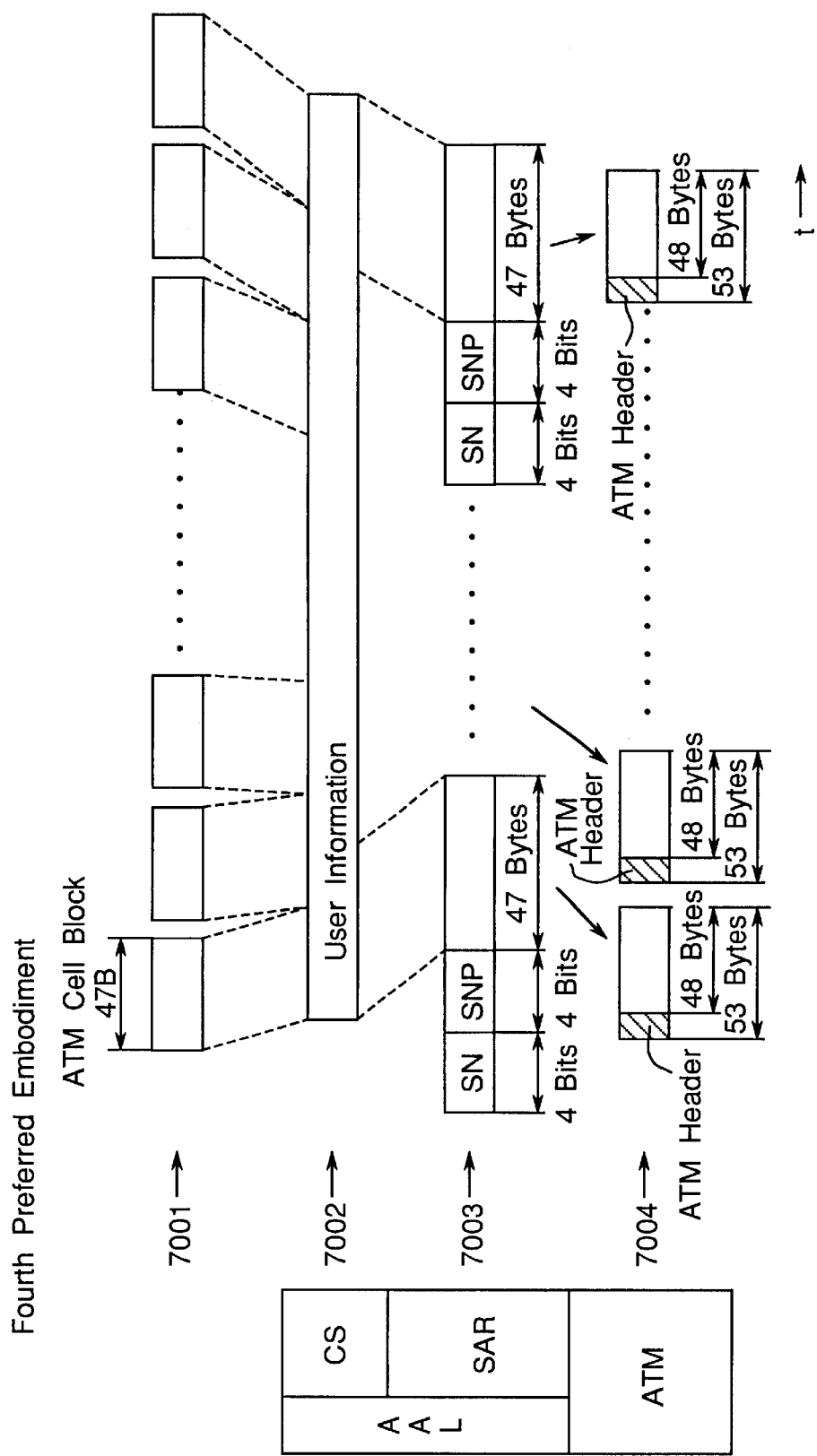
FIG. 14 is a block diagram showing a packet block generating method by means of a block buffer memory control circuit 6003c of FIG. 13.

FIG. 14 is a block diagram showing a packet block generating method by the block buffer memory control circuit 6003c of FIG. 13. In the fourth preferred embodiment, as described above, the transmission of data packet is executed by means of the protocol of the AAL TYPE 1 of the ATM. A protocol stack is shown on the left-hand side of FIG. 14.

In FIG. 14, the reference numeral 7001 denotes an TM cell block sequence (3005 of FIG. 5 and 4003 of FIG. 6) as described in the first preferred embodiment. The reference numeral 7002 denotes a user information region of CS (Convergence Sublayer) of an AAL layer. The reference numeral 7003 denotes the data construction of a SAR (Segmentation and Re-assembly) sublayer of the AAL layer. The reference numeral 7004 denotes the cell of the AAL layer. These abbreviations are also used in the following description.

The ATM cell block sequence 7001 is constructed of 248 ATM cell blocks of 47 bytes as described in the first preferred embodiment. In the CS, the ATM cell blocks are conceptually integrated into one as user information and transmitted to the SAR layer. In the SAR layer, a 4-bit sequence number (SN) and a 1-byte CRC (SNP) or the like for protecting the 4-bit sequence number are added to every 47 bytes of the SAR layer according to the AAL TYPE 1 protocol, and the resulting 48 bytes are transmitted to the ATM layer.

In this case, CRC is a cyclic redundancy check parity for detecting an error. In the ATM layer, as indicated by the hatched section of the ATM cell 7004, a 5-byte ATM cell header is added for the formation an ATM cell.

As described in the first preferred embodiment, the ATM cell block sequence 7001 is divided in a unit of 47 bytes, and therefore, each ATM cell block equivalently corresponds to the ATM cell 7004 of the ATM layer on a one-to-one basis, meaning that no useless data is added. Therefore, the layer of AAL TYPE 1 can be easily utilized without any additional circuit. It is to be noted that the CS data 7002 of the AAL exists only conceptually, and actually each ATM cell block 7001 has 47 bytes. Therefore, each ATM cell block can also be directly mapped to the layer of the SAR data 7003 of the AAL.

As a circuit for materializing this fourth preferred embodiment, a block buffer memory control circuit 6003c that is similar to the DIF data processing circuit 104 of the first preferred embodiment of FIG. 4 and has a varied packet block generating method as shown in FIG. 13 is employed.

In FIG. 12, the ATM cell forming circuit 105 constitutes the ATM cell 7004 by collecting the ATM cell blocks 7001 and adding necessary data to the blocks as shown in FIG. 14, and then, outputs the ATM cell. In this case, the ATM cell forming circuit 105 executes the processing of the AAL layer and the ATM layer as described above. As circuits for these processes, equipments for executing transmission by the AAL TYPE 1 protocol are currently popularized, and the circuits can be easily realized by using them. In regard to the network interface 106, there are popularized ATM physical layer LSI and so on, and the network interface can be easily achieved by using them. Therefore, the AAL layer, the ATM layer and the ATM physical layer can be easily realized at low cost.

As described above, in the fourth preferred embodiment, a data amount reduction of 2.87% can be achieved similar to that of the first preferred embodiment, so that the communications load can be remarkably reduced and the use of the resources of the communications network can be reduced. By virtue of the reduction in the amount of communications, the communications time becomes short and the reliability of the real-time communications is improved by that much or degree. Furthermore, by reducing the amount of communications, a load applied on an ATM switch and so on inside the network is also reduced and the probability of the cell loss or the like is also reduced, so that high-quality transmission can be achieved. Furthermore, the currently popularized equipments such as the equipments for the AAL TYPE 1 use or the like can be used as they are and the construction of the circuit to be added can be realized very simply, so that the preferred embodiment can be achieved very easily at low cost.

In particular, when the data reduction method as described in the first preferred embodiment is used, the data amount is exactly adjusted to the payload of the AAL TYPE 1. Therefore, the data transmission can be efficiently executed and the adding of a processing circuit for putting the data on the AAL TYPE 1 is made very simple, so that the circuit scale can be remarkably reduced.

Furthermore, the DIF block subsequence and the ATM cell block sequence have a constant amount of information. Therefore, by using the AAL TYPE 1 of the ATM transmission protocol appropriate for the transmission of sound and image at a fixed rate, the reliability of the real-time communications is improved. Even when the ATM cell loss occurs due to the logical coincidence of the direction in which the ATM cell is transmitted with the direction of the DIF block, the DIF block error is limited to a minimum of one or two in number, so that a transmission system which causes a very small amount of disorder of image and sound even when the ATM cell loss occurs can be provided.

Although the fourth preferred embodiment has been described based on the ATM cell block sequence as described in the first preferred embodiment, the subject matter of the present invention is to efficiently execute the transmission by the AAL TYPE 1 protocol by reducing the data amount. A similar effect can be obtained even when the data amount reduction method of the second preferred embodiment or the third preferred embodiment or another data amount reduction method is used, and such methods are not excluded from the scope of the present invention.

Fifth Preferred Embodiment

Figure 15:
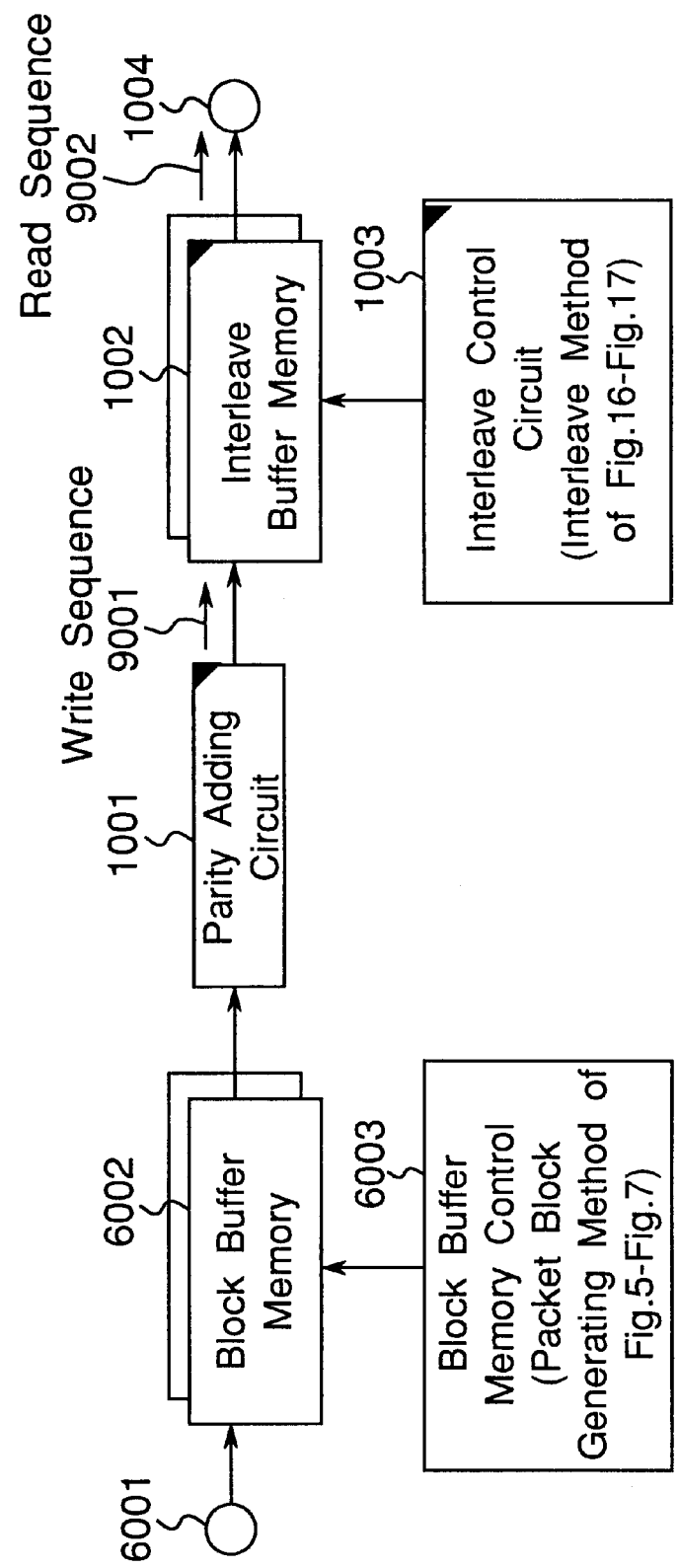
FIG. 15 is a block diagram showing a construction of a DIF data processing circuit 104d according to a fifth preferred embodiment of the present invention.

FIG. 15 is a block diagram showing a construction of a DIF data processing circuit 104d according to a fifth preferred embodiment of the present invention. This fifth preferred embodiment is characterized in that the transmission is executed by means of the AAL TYPE 1 of the ATM after subjecting the ATM cell block sequence to an interleave process and a process for error correcting. As shown in FIG. 15, the preferred embodiment is characterized in that a parity adding circuit 1001, an interleave buffer memory 1002 and an interleave control circuit 1003 are further provided as compared with the DIF data processing circuit 104 of the first preferred embodiment of FIG. 4.

That is, the DIF data processing circuit 104d of the fifth preferred embodiment is characterized in that the circuit adds a parity for FEC to the generated transmission unit, thereafter subjects the data including the added Parity for FEC to the interleave process, and then, outputs the data obtained after the interleave process as a transmission unit.

Figure 16:
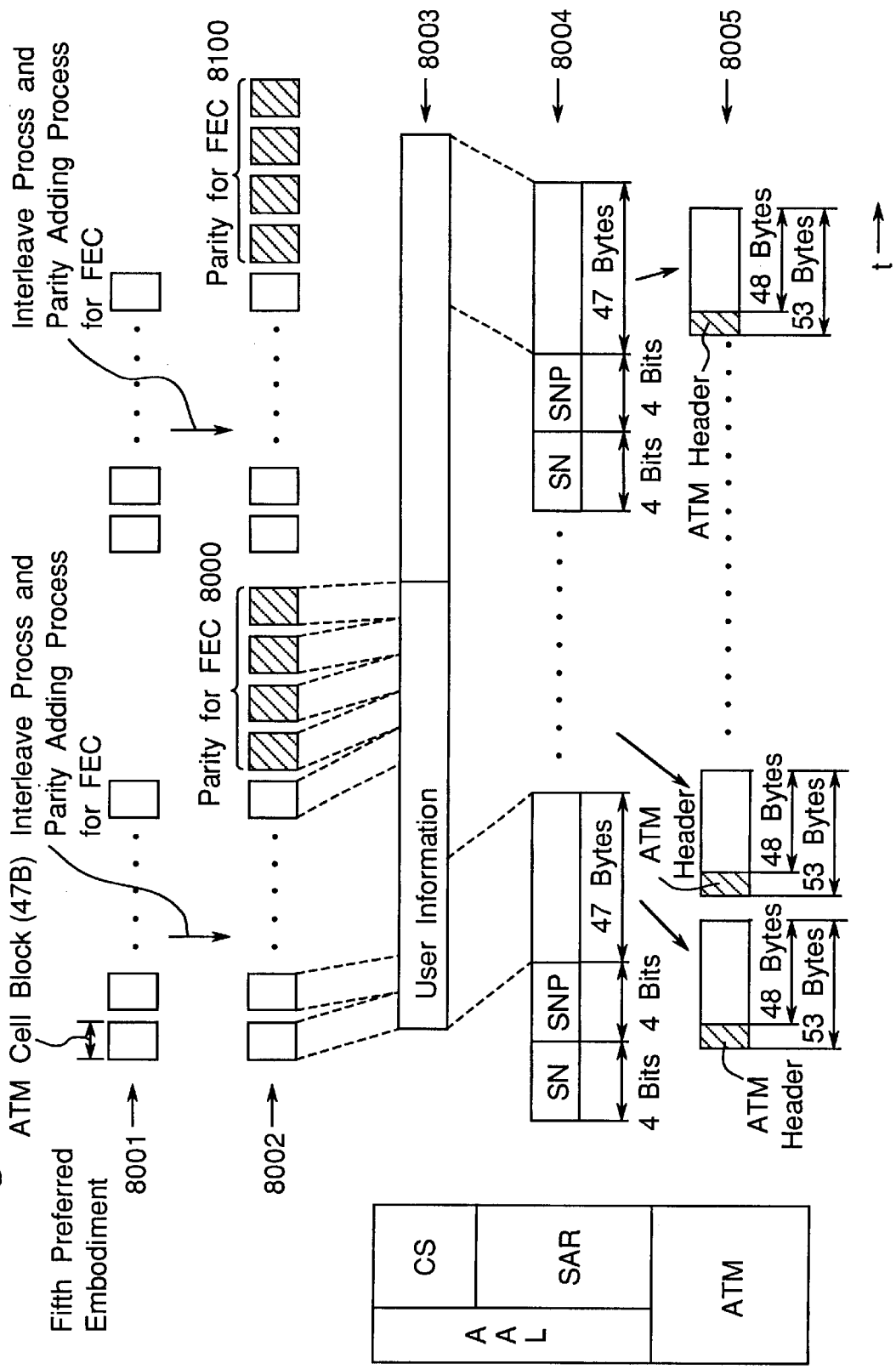
FIG. 16 is a block diagram showing a packet block generating method executed by an ATM transmission apparatus provided with a DIF data processing circuit 104d of FIG. 15.

FIG. 16 is a block diagram showing a packet block generating method executed by an ATM transmission apparatus provided with the DIF data processing circuit 104d of FIG. 15. In FIG. 16, the reference numeral 8001 denotes an ATM cell block sequence constructed of 248 ATM cell blocks of 47 bytes as described in the first preferred embodiment. The reference numeral 8002 denotes data in which an interleave process use parity and a forward error correction (FEC) use parity (the forward error correction use parity referred to as FEC hereinafter) are attached to the ATM cell block sequence 8001 by a method as described later (See FIG. 17). In the data 8002, the hatched sections serve as the Parity for FEC. The reference numeral 8003 denotes a user information region of CS of the AAL layer. The reference numeral 8004 denotes the data construction of the SAR sublayer of the AAL layer (the AAL TYPE 1). The reference numeral 8005 denotes an ATM layer cell.

The interleave process and the method for adding the Parity for FEC from the ATM cell block sequence 8001 to the data 8002 will be described next with reference to FIG. 17. In this case, FIG. 17 is a memory map showing storage contents of an interleave buffer memory 1002 according to an interleave method executed by the interleave control circuit 1003 of FIG. 15.

Figure 17:
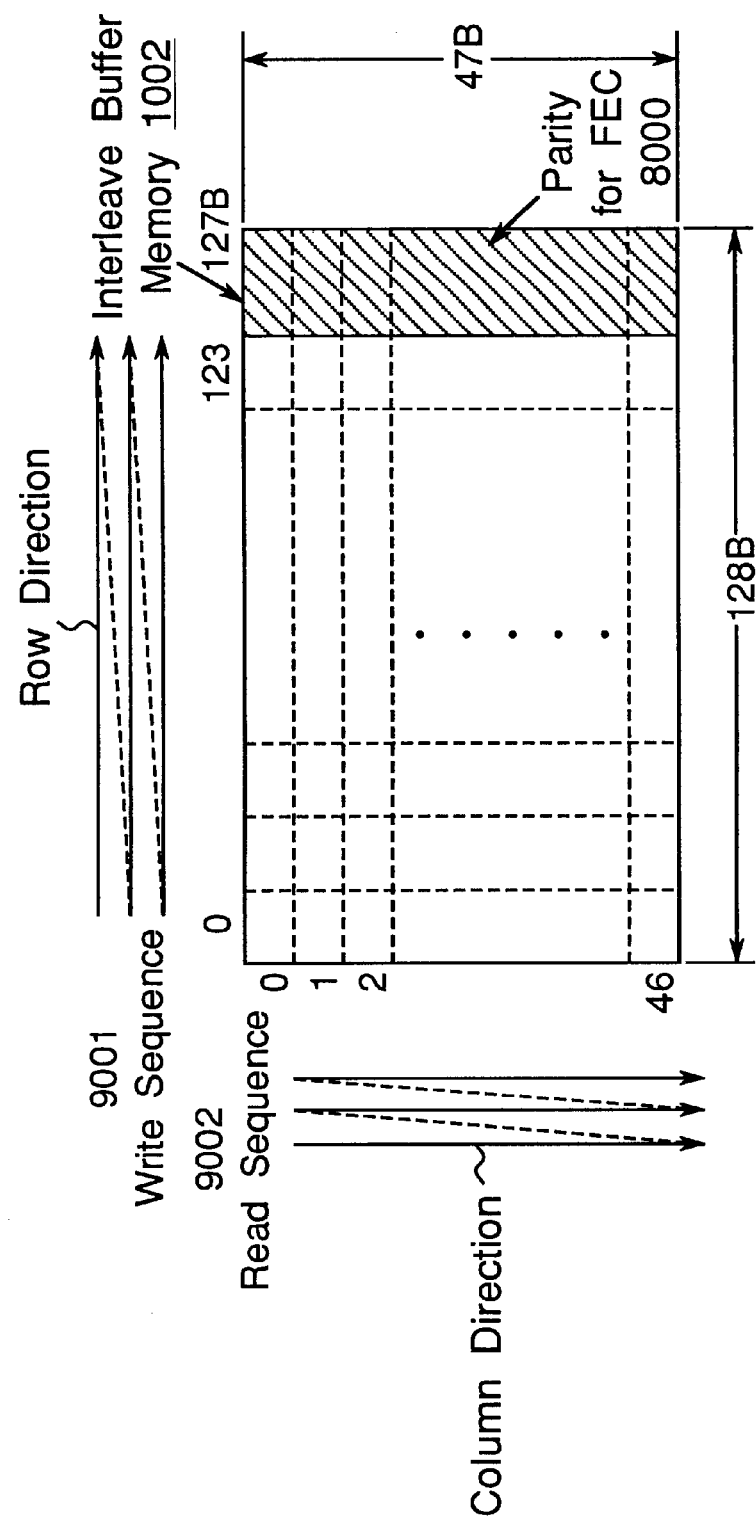
FIG. 17 is a memory map showing storage contents of an interleave buffer memory 1002 according to an interleave method executed by an interleave control circuit 1003 of FIG. 15.

FIG. 17 shows a coding method of the interleave (long interleave) process and an error correcting code coding process prescribed by the adaptation layer (the AAL TYPE 1) of the ATM of the method shown in FIG. 2 to FIG. 9 of ITU-T Recommendation I.363 and FIG. 2 to FIG. 9 of JT-I363.

The method shown in FIG. 17 executes the interleave process by means of the interleave buffer memory 1002 having a matrix form, where data write and read control is expressed by the concept of a two-dimensional matrix. At the writing stage, data are written in a unit of 124 bytes (0 to 123) in the row direction of the matrix as denoted by 9001, and a parity for FEC 8000 of four bytes (124 to 127) are added to each row. The writing is completed by repeating this process 47 times. The Parity for FEC 8000 is able to execute error correction to a maximum of two bits by using, for example, Reed-Solomon codes (128 and 124) or correct a loss to a maximum of four bites.

The reading is executed in the column direction of the matrix, and consequently 128 blocks of 47 bytes (0 to 46) are generated. This result of read is the data 8002 shown in FIG. 16. The data write and read unit of FIG. 17 is referred to as an interleave unit hereinafter.

In FIG. 16, the ATM cell block sequence 8001 is constructed of 248 ATM cell blocks of 47 bytes, and there are 124 blocks in terms of blocks of 47 bytes in the payload section of the matrix shown in FIG. 17. Therefore, the data can be processed in two interleave units without excess nor deficiency. That is, by executing two times the process of the interleave unit of FIG. 17, the data of the ATM cell block sequence 8001 can be processed without excess nor deficiency while adding no useless dummy data. The parities for FEC 8000 and 8100 are added in a unit of 47 bytes, and therefore, this method is also appropriate for the process of the AAL TYPE 1.

Four blocks of the parities for FEC 8000 and 8001 are added in the interleave unit, and therefore, the ATM cell block 8002 increases in number from 248 by 4×2=8 to 256 ATM cell blocks.

The process subsequent to the ATM cell block 8002 in FIG. 16 is similar to that of the method described in the fourth preferred embodiment except for the increase in data amount by the parities and the construction of a convergence sublayer protocol data unit in the interleave unit.

The user data information 8003 is divided into two protocol data units and transmitted to the SAR layer. In the SAR layer, a 4-bit sequence number (SN) and a 1-byte CRC (SNP) or the like for protecting the 4-bit sequence number are added in a unit of 47 bytes according to the AAL TYPE 1 protocol and the resulting 48 bytes are transmitted to the ATM layer. Furthermore, in the ATM layer, as indicated by the hatched section 8005, a 5-byte ATM cell header is added for the formation an ATM cell.

It is to be noted that the protocol data unit 8003 merely conceptually exists, and actually each ATM cell block 8002 has 47 bytes. Therefore, each ATM cell blocks can also be directly mapped to the layer of the data block 8004.

FIG. 15 is a block diagram showing a construction of the DIF data processing circuit 104d according to the fifth preferred embodiment. The present preferred embodiment is constructed by further providing the DIF data processing circuit 104 of FIG. 1 with a parity adding circuit 1001, an interleave buffer memory 1002 and an interleave control circuit 1003. The block buffer memory 6002 and the block buffer memory control circuit 6003 operate in a similar manner to that of the corresponding circuits 6002 and 6003 of the first preferred embodiment of FIG. 4.

In FIG. 15, the ATM cell block sequence 8001 outputted from the block buffer memory 6002 is formed into 128-byte data by adding the 4-byte parities for FEC 8000 and 8100 in a unit of 124 bytes by means of the parity adding circuit 1001 and then outputted.

The interleave buffer memory 1002 is constructed of two memories capable of storing therein the interleave unit shown in FIG. 17 and alternately used for the writing and reading. The writing and reading of the interleave buffer memory 1002 are executed by the interleave control circuit 1003. The interleave control circuit 1003 generates an address so that 128-bytes data from the parity adding circuit 1001 is written into the interleave buffer memory 1002 in the row direction 9001 of FIG. 17 and executes the writing of the data. When the writing of each row is completed, the write operation is advanced in the row direction in a direction in which the column address increases, and the operation is switched to the reading when the interleave unit shown in FIG. 17 becomes full.

On the other hand, for the reading, the interleave control circuit 1003 generates an address and sequentially reads the data in a unit of 47 bytes so that the data are read out from the interleave buffer memory 1002 in the column direction 9002 of FIG. 17, thereby obtaining the data 8002.

The interleave control circuit 1003, which repeatedly generates a fixed address for interleave, can be constructed of a simple circuit by means of a ROM in which each address of one sequence is stored.

The data read out from the interleave buffer memory 1002 is outputted from an output terminal 1004. The output data from the output terminal 1004 becomes the output of the DIF data processing circuit 104 of FIG. 1, and therefore, the next process shifts to the ATM cell forming circuit 105 of FIG. 1.

The ATM cell forming circuit 105 executes the processing of the AAL layer and the ATM layer. As circuits for these processes, equipments for transmitting the layers by the AAL TYPE 1 protocol are currently popularized, and the circuits can be easily realized by using them. In regard to the network interface 106, there are popularized ATM physical layer LSIs and so on, and the network interface can be easily realized by using them. Therefore, the AAL layer, the ATM layer and the ATM physical layer can be simply realized at low cost.

As described above, in the fifth preferred embodiment, a data amount reduction of 2.87% can be achieved in a similar manner to that of the first preferred embodiment.

When the interleave of the AAL TYPE 1 shown in FIG. 17 is used, the data transmission amount increase in the interleave unit. Therefore, unless the information amount reduction of the DVC subsequence is executed, the process in the interleave unit of FIG. 17 must be transmitted three times. However, according to the fifth preferred embodiment of the present invention, the information amount reduction is executed, and therefore, the transmission can be achieved by executing the process twice in the interleave unit of FIG. 17. Therefore, the communications load can be remarkably reduced and the use of the resources of the communications network can be reduced. By virtue of the reduction in the amount of communications, the communications time is reduced and the reliability of the real-time communications is improved by that much or degree. Furthermore, by reducing the amount of communications, a load applied on an ATM switch and so on inside the network is also reduced and the probability of the cell loss or the like is also reduced, so that high-quality transmission can be provided.

Furthermore, the Parity for FEC is added after executing the interleave process, and therefore, correction of two symbols and correction of the loss of four symbols can be achieved. Therefore, the correction effectively operates also on the cell loss (packet loss) and the bit error, which are the characteristic error of the ATM communications (packet communications), so that communications of a high reliability can be achieved.

Furthermore, based on the processing of the standardized AAL TYPE 1, the currently popularized equipments can be used as they are and the construction of the circuit to be added is allowed to be very simple, so that the circuit can be realized very easily at low cost.

Furthermore, the DIF block subsequence and the ATM cell block sequence have constant amount of information. Therefore, by using the AAL TYPE 1 of the ATM transmission protocol appropriate for the transmission of sound and image at a fixed rate, the reliability of the real-time communications is improved. Furthermore, if the error rate of the network is within the range of error correction, then ATM communications of highly-reliable DVC (packet data string) can be achieved with a simple construction.

Sixth Preferred Embodiment

Figure 18:
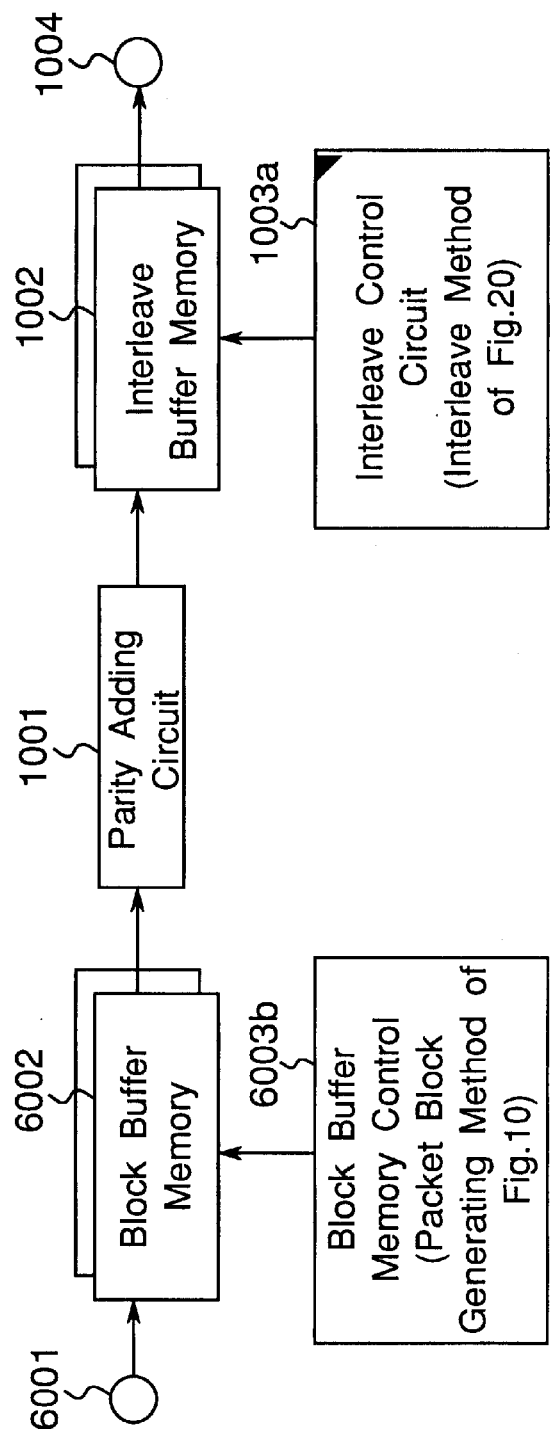
FIG. 18 is a block diagram showing a construction of a DIF data processing circuit 1004e according to a sixth preferred embodiment of the present invention.

FIG. 18 is a block diagram showing a construction of a DIF data processing circuit 104e according to a sixth preferred embodiment of the present invention. This sixth preferred embodiment is a modified preferred embodiment of the third preferred embodiment or a modified preferred embodiment of the fifth preferred embodiment. As shown in FIG. 18, this preferred embodiment is characterized in that the block buffer memory control circuit 6003b of the third preferred embodiment of FIG. 10 and a new interleave control circuit 1003a by means of the interleave method of FIG. 20 are provided.

The matrix of the interleave buffer memory 1002 of the fifth preferred embodiment of FIG. 17 can store therein valid data information of 124×47=5828 bytes. In contrast to this, the data 1802 of FIG. 19 has 5780 bytes, which has a shortage of 48 bytes, and therefore, dummy data 1805 of 48 bytes are added to the newly formed header of five bytes as denoted by 1804 in FIG. 19, thereby providing a total of 5828 bytes. It is to be noted that the position of the dummy data 1805 is not limited to the position indicated by the transmission unit 1804, and it is acceptable to put header expansion information, a secondly written header or other information into the section of the dummy data 1805. The adding timing of the dummy data 1805 may be provided at the time of being written into the matrix of the interleave buffer memory 1002.

Figure 19:
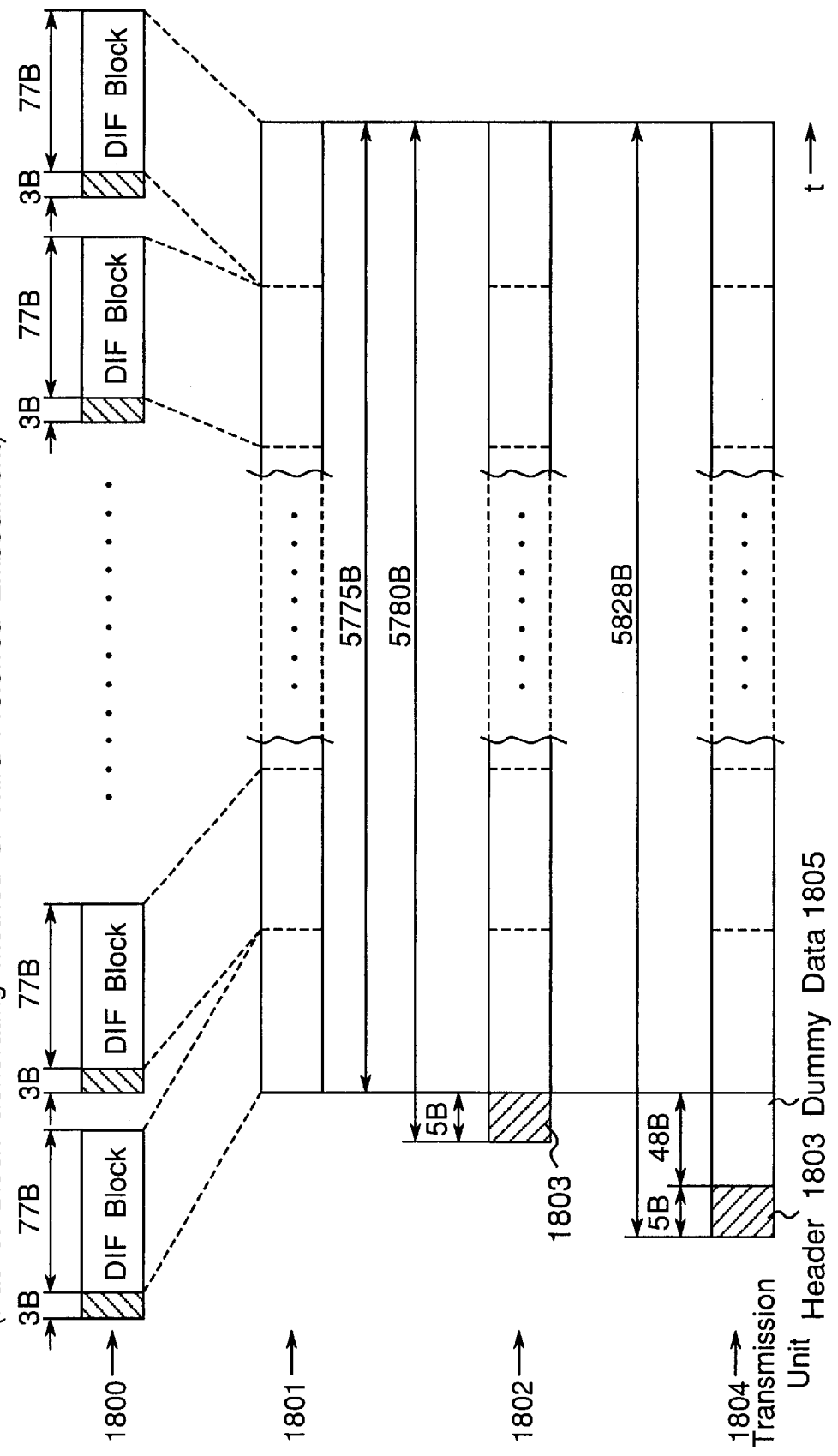
FIG. 19 is a block diagram showing a packet block generating method executed by an ATM transmission apparatus provided with a DIF data processing circuit 104e of FIG. 18.
Figure 20:
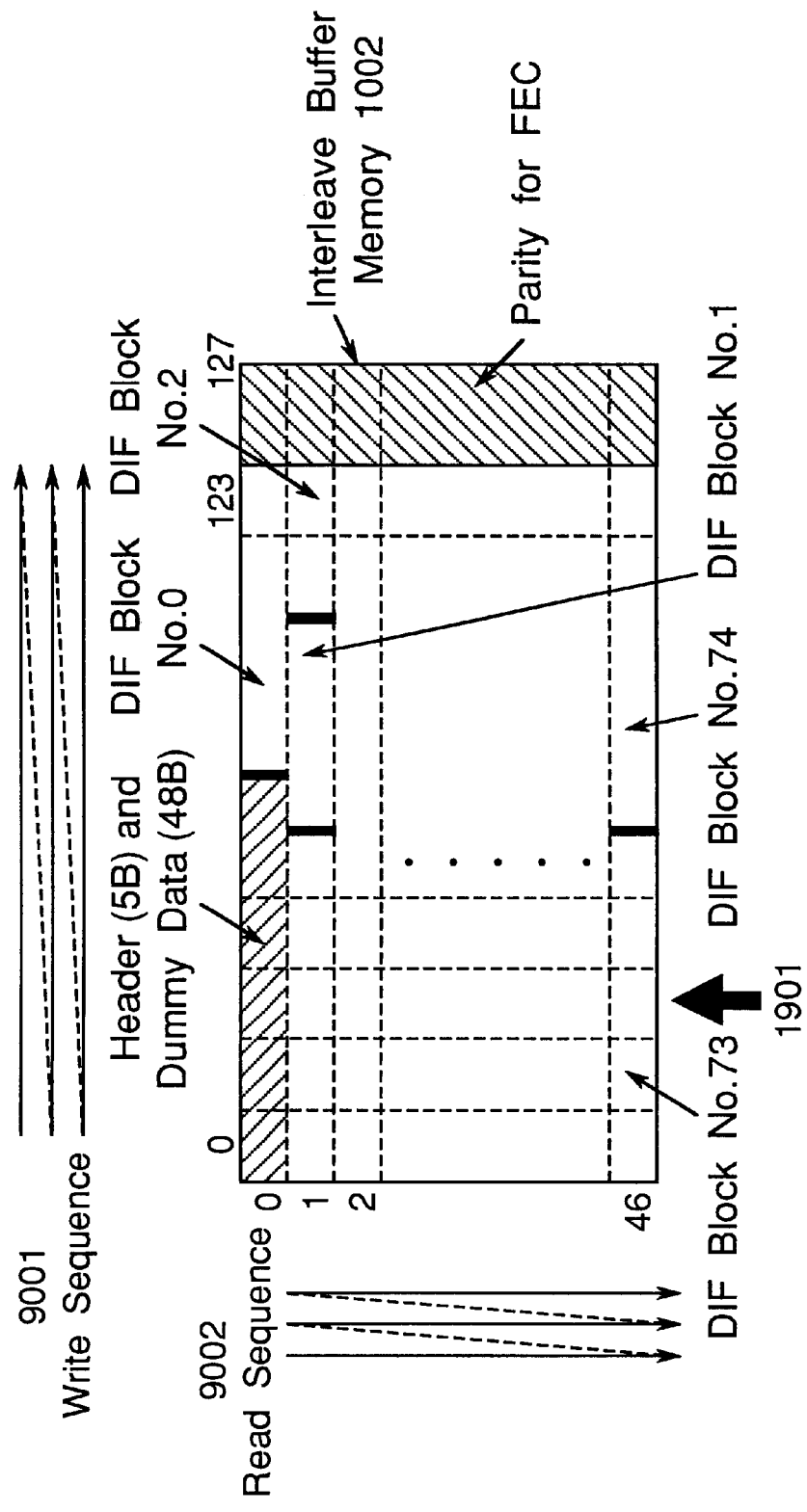
FIG. 20 is a memory map showing storage contents of the interleave buffer memory 1002 according to an interleave method executed by an interleave control circuit 1003a of FIG. 18.

FIG. 20 is a memory map showing storage contents of the interleave buffer memory 1002 according to an interleave method executed by the interleave control circuit 1003a of FIG. 18. That is, FIG. 20 shows the memory map of the interleave buffer memory 1002 when the data 1804 of FIG. 19 is written in the interleave unit of FIG. 17. In this case, the writing is executed in the row direction 9001 of the matrix of FIG. 20, and therefore, 5-byte header and 48-byte dummy data are written into the head of the first row of the matrix of FIG. 20. Subsequently, data are sequentially written in the row direction, and when the writing of data into each row is completed, writing of data in the row direction of the next column is executed. As shown in FIG. 19, the transmission unit 1804 has a total of 5828 bytes, and therefore, the transmission unit is stored in the interleave unit into the matrix of FIG. 20 without excess nor deficiency. Reading is executed in a unit of 47 bytes in the column direction of the matrix of FIG. 20 as described above. Thereafter, the ATM cell formation process is executed as denoted by 8003, 8004 and 8005 in FIG. 16, and the resulting data is finally transmitted as an ATM cell.

The circuit of the sixth preferred embodiment can be constructed by combining the DIF data processing circuit 104b of the third preferred embodiment of FIG. 10 with the DIF data processing circuit 104d of the fifth preferred embodiment of FIG. 15, and the block buffer memory control circuit 6003b and the interleave control circuit 1003a are employed in this case. Then, according to the sixth preferred embodiment, an effect similar to that of the fifth preferred embodiment is obtained.

The subject matter of the sixth preferred embodiment of the present invention is to obtain a reduction effect by reducing the times of transmission (two times in the fifth preferred embodiment and the sixth preferred embodiment) in a unit of matrices through reduction in the amount of information from the number of times of transmission (three times in the fifth preferred embodiment and the sixth preferred embodiment) in a unit of matrices, which must be transmitted when a predetermined unit of data amount (subsequence in the present preferred embodiment) is mapped directly on the matrix in the case where data that is conceptually theoretically arranged in a matrix form is transmitted by an interleave means with an error correcting means provided. Therefore, although the present preferred embodiment has been described by the method standardized as an option of the AAL TYPE 1 shown in FIG. 17 as the interleave and error correction methods, the present preferred embodiment is not limited to this method.

Seventh Preferred Embodiment

Figure 21:
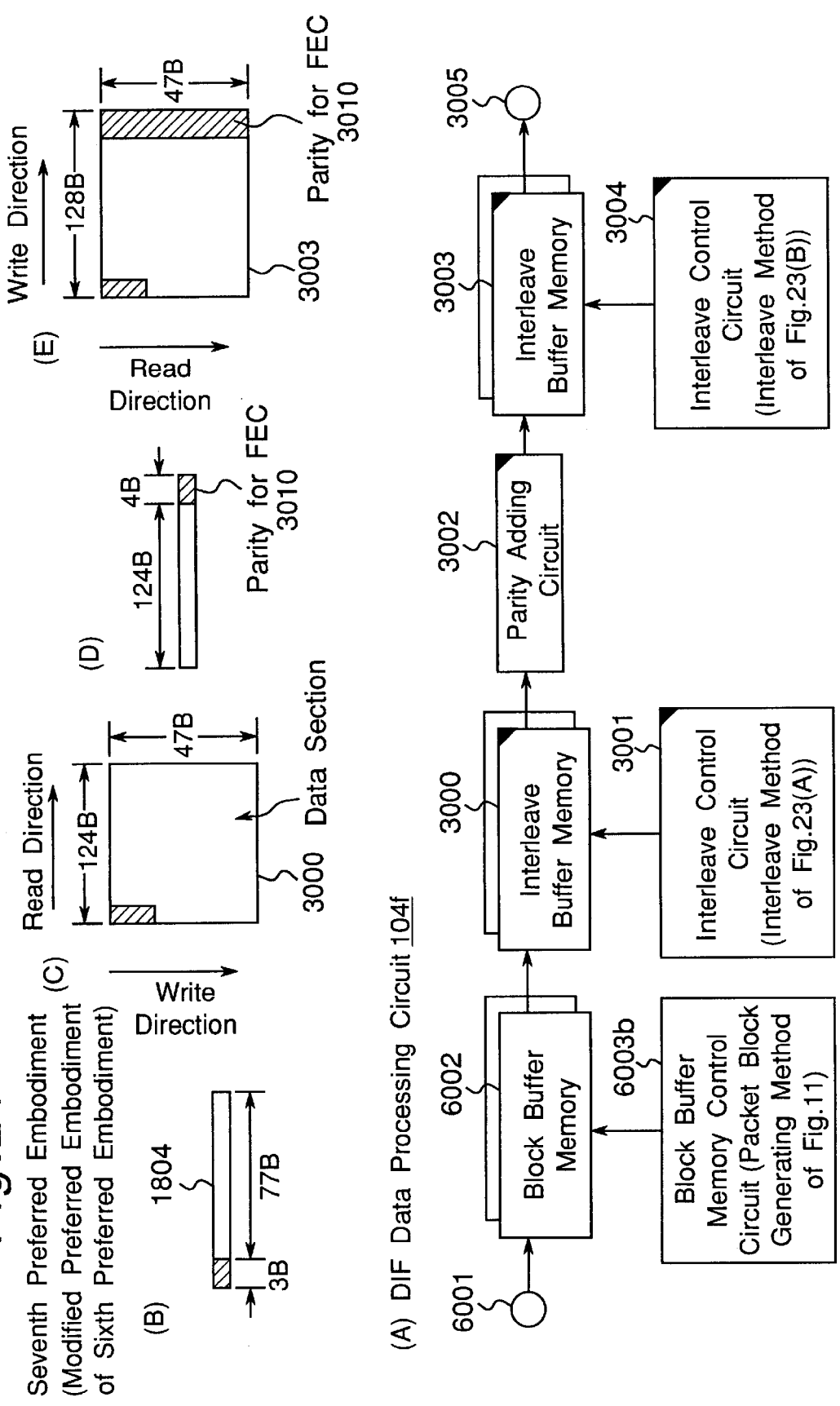

FIGS. 21(A)–21(E) are views showing a construction of a seventh preferred embodiment of the present invention, wherein FIG. 21(A) is a block diagram showing a construction of the DIF data processing circuit 104f of the seventh preferred embodiment, FIG. 21 (B) is a block diagram showing data inputted from the block buffer memory 6002 to the interleave buffer memory 3000 of FIG. 21(A), FIG. 21(C) is a memory map showing storage contents of the interleave buffer memory 3000 according to an interleave method executed by the interleave control circuit 3001 of FIG. 21(A), FIG. 21(D) is a block diagram showing data inputted from the parity adding circuit 3002 to the interleave buffer memory 3003 of FIG. 21(A) and FIG. 21(E) is a memory map showing storage contents of the interleave buffer memory 3003 according to an interleave method executed by the interleave control circuit 3004 of FIG. 21(A).

This seventh preferred embodiment is a modified preferred embodiment of the sixth preferred embodiment and is characterized in that the DIF data processing circuit 104b of the third preferred embodiment of FIG. 10 is further provided with an interleave buffer memory 3000, an interleave control circuit 3001, a parity adding circuit 3002, an interleave buffer memory 3003 and an interleave control circuit 3004 as shown in FIG. 21(A). In particular, the preferred embodiment is characterized in that a transmission system which is more tolerant of errors and is more appropriate for the DVC transmission system than the third aspect of the present invention as shown in the fifth preferred embodiment and the sixth preferred embodiment that use the long interleave and the error correction system described with reference to FIG. 17 is provided.

The DIF data processing circuit 104f of the seventh preferred embodiment is provided with:

(a) an interleave control circuit 3001 that executes a first interleave process by writing the data string outputted from the block buffer memory 6002 into an interleave buffer memory 3000 having a first matrix form in a first direction (write direction of FIG. 21(C)) of the first matrix, and thereafter, reading the data from the interleave buffer memory 3000 in a second direction (read direction of FIG. 21(C)) perpendicular to the first direction of the first matrix, and then, outputs the data obtained after the first interleave process in a unit of data in the second direction;

(b) a parity adding circuit 3002 that adds a predetermined Parity for FEC to the data outputted from the interleave buffer memory 3000 in a unit of data in the second direction, and then, outputs the data to which the Parity for FEC is added; and (c) an interleave control circuit 3004 that executes a second interleave process by writing data outputted from the parity adding circuit 3002 into the interleave buffer memory 3003 having a second matrix form in a fourth direction (write direction of FIG. 21(E)) of the second matrix coinciding with the second direction of the first matrix, and thereafter, reading the data from the interleave buffer memory 3003 in a third direction (read direction of FIG. 21(E)) perpendicular to the fourth direction of the second matrix, and then, outputs the data obtained after the second interleave process in a unit of data in the third direction.

For example, it is sometimes the case where cell loss (burst cell loss) continuously occurs in the ATM transmission line of a degraded quality and goes beyond the error correction capacity of the ATM transmission apparatus by means of the parity shown in FIG. 20 or FIG. 17. For example, in the case where the cell 1901 shown in FIG. 20 becomes one of cells that cannot be corrected and if part of the data of the DIF block is included in the cell 1901, then all the DIF block data become errors according to the method as described in the sixth preferred embodiment.

Figure 22:
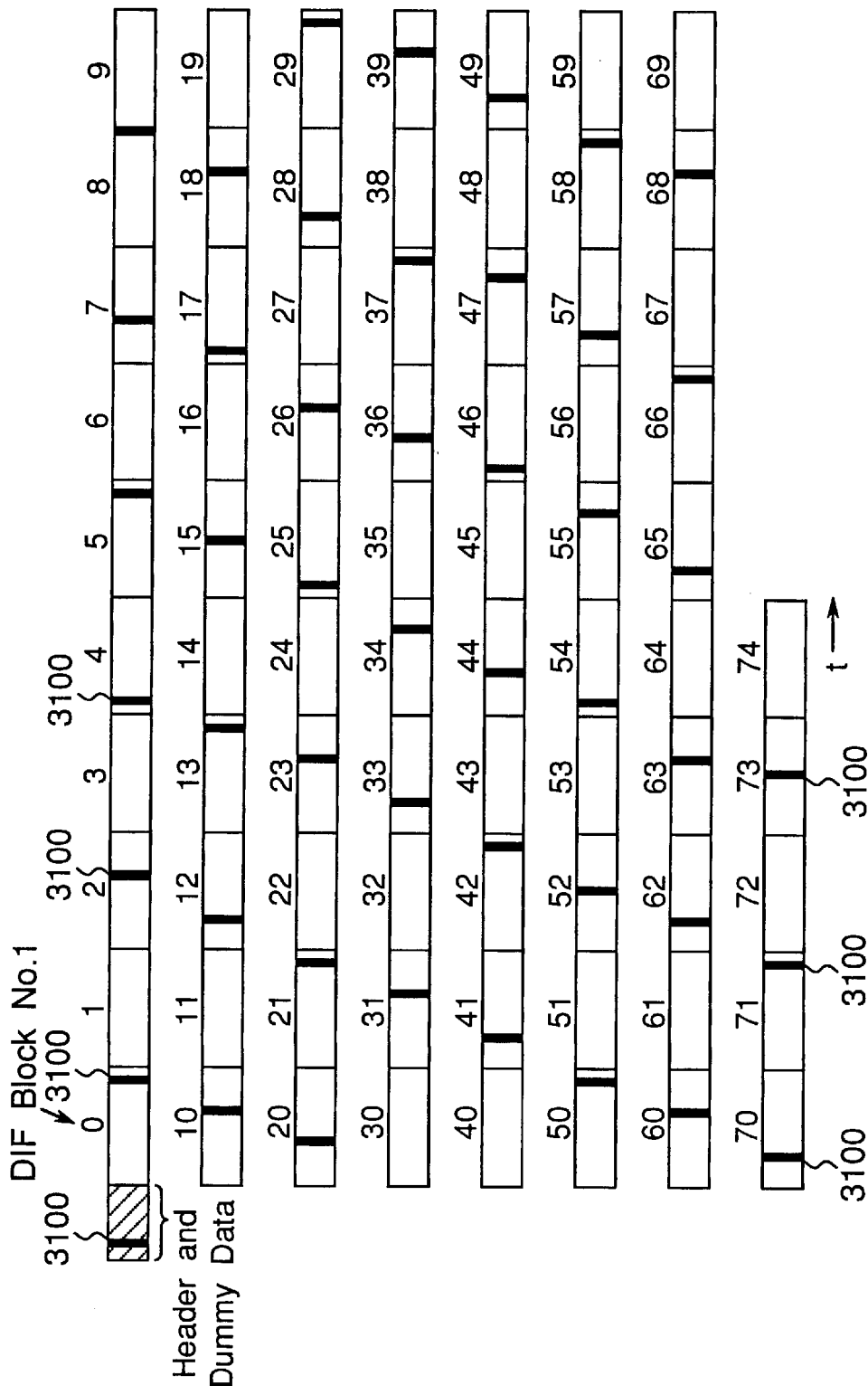
FIG. 22 is a block diagram showing an error distribution when cell loss occurs in an ATM transmission apparatus provided with the DIF data processing circuit 104f of FIG. 21.

FIG. 22 is a block diagram showing an error distribution when cell loss occurs in the ATM transmission apparatus provided with the DIF data processing circuit 104*f* of FIG. 21. In FIG. 22, DIF block numbers are provided above the DIF blocks. In this case, the DIF block numbers are 0 to 74 numbering 75 DIF blocks included in the transmission unit 1804 of FIG. 19 from the head, and the byte numbers are 0 to 76 numbering the 77-byte DIF blocks shown in FIG. 19 from the head. In FIG. 22, the errors included in the DIF blocks are indicated by the black lines. As shown in FIG. 22, if the cell 1901 cannot be corrected, then the header and the 46 DIF blocks include errors.

This case has the problem that the processing of DVC is executed in a unit of macro blocks shown in FIG. 3 and only one error status (STA) is owned by the macro block as described above. Therefore, if each DIF block (macro block) has at least one byte of error, then the whole DIF block is treated as an error. Therefore, 46 DIF blocks become errors in FIG. 22.

In FIG. 22, concrete errors exist in the third byte (byte number 2) of the header, the byte number 73 of the DIF block number 0, the byte number 43 of the DIF block number 2, the byte number 13 of the DIF block number 4, the byte number 60 of the DIF block number 5, the byte number 30 of the DIF block number 7, the byte number 0 of the DIF block number 9, the byte number 47 of the DIF block number 10, the byte number 17 of the DIF block number 12, the byte number 64 of the DIF block number 13, the byte number 34 of the DIF block number 15, the byte number 4 of the DIF block number 17, the byte number 15 of the DIF block number 18, the byte number 21 of the DIF block number 20, the byte number 68 of the DIF block number 21, the byte number 38 of the DIF block number 23, the byte number 8 of the DIF block number 25, the byte number 55 of the DIF block number 26, the byte number 25 of the DIF block number 28, the byte number 72 of the DIF block number 29, the byte number 42 of the DIF block number 31, the byte number 12 of the DIF block number 33, the byte number 59 of the DIF block number 34, the byte number 29 of the DIF block number 36, the byte number 76 of the DIF block number 37, the byte number 46 of the DIF block number 39, the byte number 16 of the DIF block number 41, the byte number 63 of the DIF block number 42, the byte number 33 of the DIF block number 44, the byte number 3 of the DIF block number 46, the byte number 50 of the DIF block number 47, the byte number 20 of the DIF block number 49, the byte number 67 of the DIF block number 50, the byte number 37 of the DIF block number 52, the byte number 7 of the DIF block number 54, the byte number 54 of the DIF block number 55, the byte number 24 of the DIF block number 57, the byte number 71 of the DIF block number 58, the byte number 41 of the DIF block number 60, the byte number 11 of the DIF block number 62, the byte number 58 of the DIF block number 63, the byte number 28 of the DIF block number 65, the byte number 75 of the DIF block number 66, the byte number 45 of the DIF block number 68, the byte number 15 of the DIF block number 70, the byte number 62 of the DIF block number 71 and the byte number 32 of the DIF block number 73.

As described above, when one arbitrary cell loss cannot be corrected, the error propagates, consequently significantly disturbing the image. This is unacceptable in the field of, for example, broadcasting stations requiring a high image quality.

Substantially, the above problem is attributed to the ATM cell finally processed so that the direction thereof is processed to be perpendicular to the direction of the DIF block data string through the long interleave (FIG. 20) of the AAL TYPE 1. If the error correction capacity is improved, then the above problem will occur when the error goes beyond the error correction capacity. If the error correction is not executed, then the problem will become more serious.

In view of the above problem, this seventh preferred embodiment solves the problem by using the long interleave of the AAL TYPE 1 which is currently the mainstream as the standard and of which the equipments are popularized at low cost and processing the upper layer of the long interleave (See FIG. 20) of the AAL TYPE 1, thereby making the direction of the DIF block data string coincide with the direction of the ATM cell that is practically used as a transmitting means.

FIGS. 23(A) and 23(B) are views showing an interleave method of the DIF data processing circuit 104*f* of FIG. 21(A), wherein FIG. 23(A) is a memory map showing storage contents of the interleave buffer memory 3000 according to the interleave method executed by the interleave control circuit 3001 of FIG. 21(A) and FIG. 23(B) is a memory map showing storage contents of the interleave buffer memory 3003 according to the interleave method executed by the interleave control circuit 3004 of FIG. 21(A).

The reference numeral 2100 shown in FIG. 23(A) denotes the process in the upper layer of the long interleave for canceling the long interleave of the AAL TYPE 1 to be executed by the interleave buffer memory 3000. The reference numeral 2101 shown in FIG. 23(B) denotes the long interleave of the AAL TYPE 1 to be executed by the interleave buffer memory 3000 and is the same processing as in FIG. 20 (or FIG. 17).

In FIG. 23(A) and FIG. 23(B), the data processed in the interleave unit are numbered from 0 to 5827. The numbers 0, 1, 2, ... , 5827 indicate the direction of the data string of the DIF block indicated by, for example, the transmission unit 1804 of FIG. 19.

As shown in FIG. 23(A), the data string 1804 is written in the column direction into the interleave buffer memory 3000, and then is read out from the interleave buffer memory 3000 in the row direction. As shown in FIG. 23(B), the read data is written into the interleave buffer memory 3003 in the row direction, and then, is read out from the interleave buffer memory 3003 in the column direction in conformity to the long interleave standard (FIG. 17). The read direction from the interleave buffer memory 3000 becomes the ATM cell direction, and consequently the DIF block direction and the ATM cell direction coincide with each other.

Figure 23:
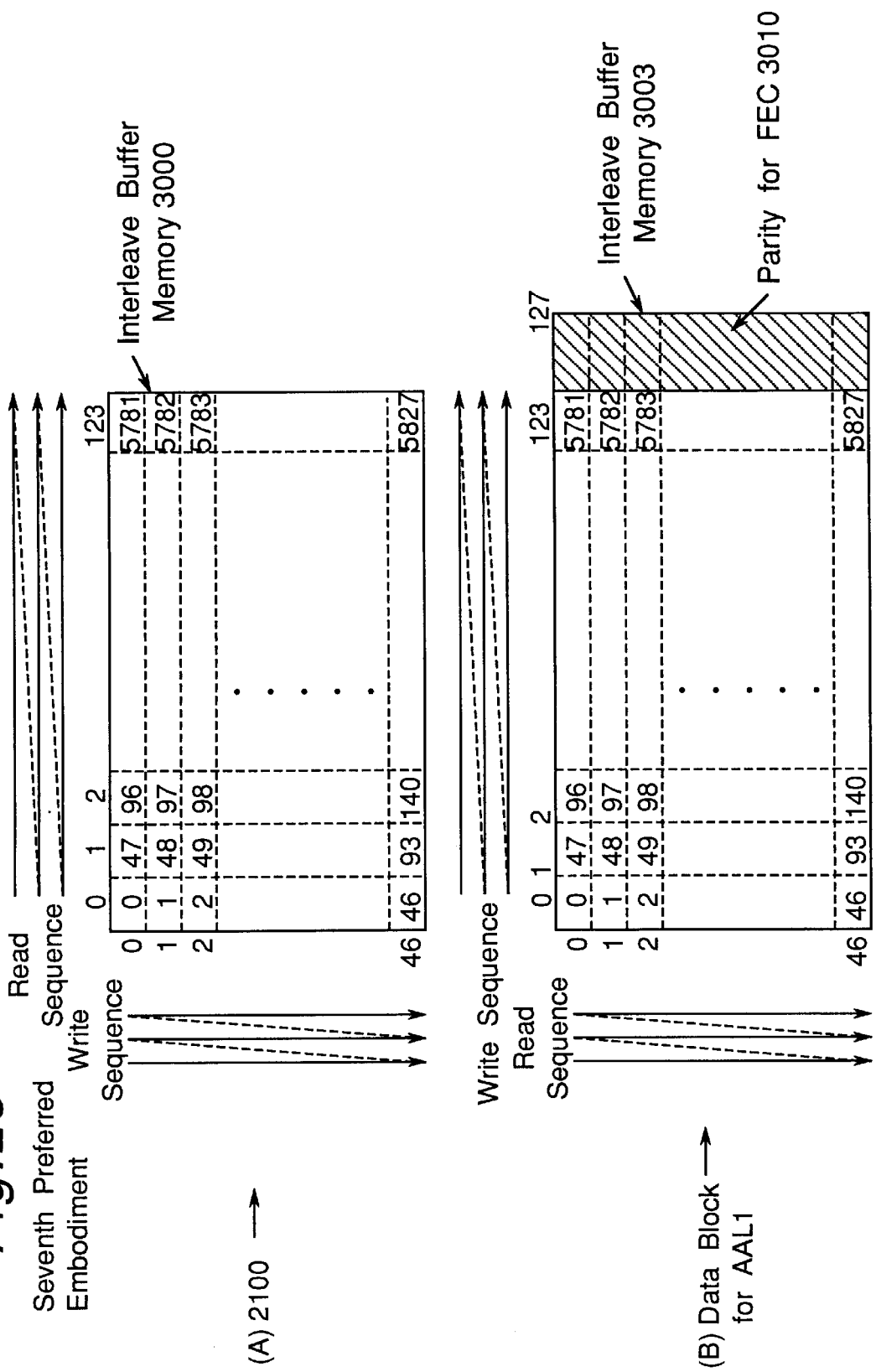
Figure 24:
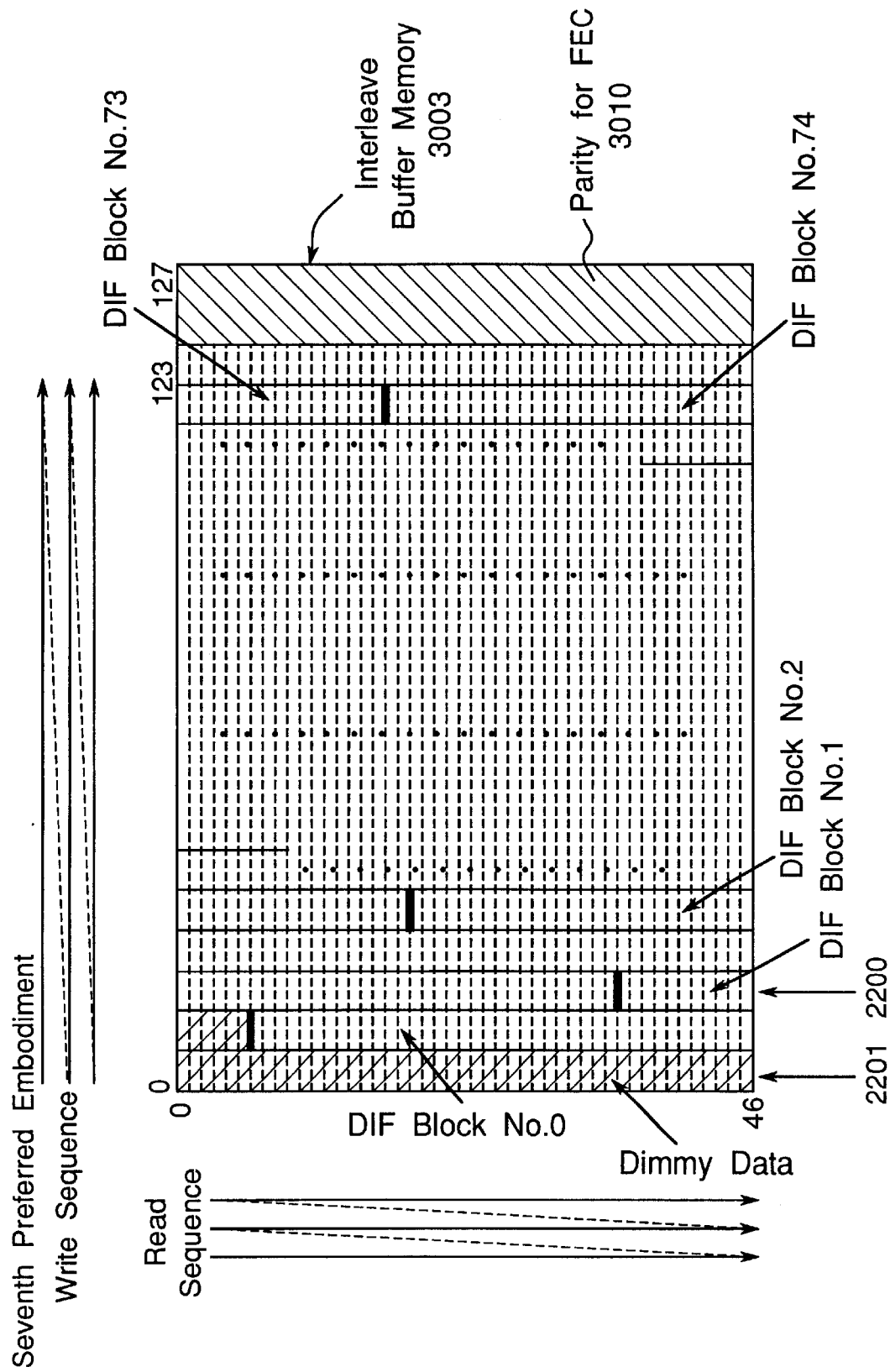
FIG. 24 is a memory map showing the detail of the storage contents of the interleave buffer memory 3003 according to the interleave method executed by the interleave control circuit 3004 of FIG. 21(A)

FIG. 24 is a memory map showing the detail of the storage contents of the interleave buffer memory 3003 according to the interleave method executed by the interleave control circuit 3004 of FIG. 21(A). FIG. 24 illustrates in more detail the same thing as 2101 of FIG. 23. FIG. 24 illustrates an example in which the transmission unit 1804 of FIG. 19 is stored, where the data string 1804 is stored from the head via the header, dummy, subsequent DIF block 0, DIF block 1, . . .

Figure 25:
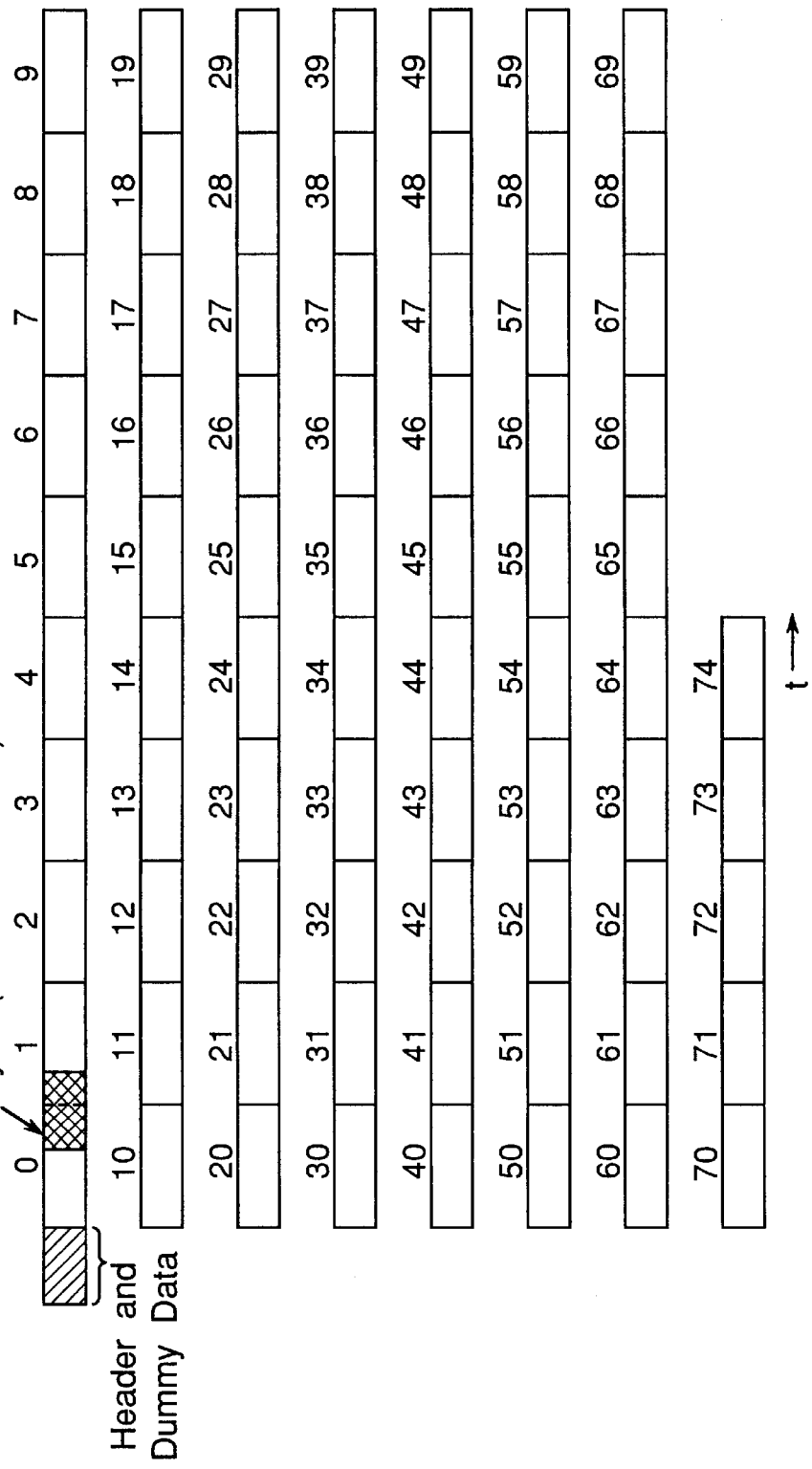
FIG. 25 is a block diagram showing an error cell when cell loss occurs in an ATM transmission apparatus provided with the DIF data processing circuit 104f of FIG. 21(A)

It is now assumed that, for example, cell loss that cannot be corrected occurs in a position 2200 identical to the position described with reference to FIG. 20. In this case, the direction of the transmission unit 1804 coincides with the direction of the ATM cell, and therefore, the ATM cell 2200 includes only part of the DIF block 0 and part of the DIF block 1. The data block diagram of the data string 1804 in this case is shown in FIG. 25. FIG. 25 shows the error cell (ATM cell 2200) by the cross hatching. In this example, only the two DIF blocks of the DIF block 0 and the DIF block 1 have errors.

As described above, according to the seventh preferred embodiment, the error propagation can be suppressed to the minimum even when an uncorrectable cell loss occurs, thereby allowing a high image quality to be maintained. It is to be noted that the macro block that becomes an error can be made less conspicuous by being corrected by the previous frame or the like.

FIG. 21(A) shows the construction of the DIF data processing circuit 104f of the seventh preferred embodiment. In FIG. 21(A), a DIF block data string is inputted via the input terminal 6001. In FIG. 21(A), a DIF block data string as denoted by 1804 in FIG. 11 is first of all obtained by the block buffer memory 6002 and the block buffer memory control circuit 6003b of FIG. 4 similar to those of the third preferred embodiment. In this case, the block diagram of the data outputted from the block buffer memory 6002 is shown in FIG. 21(B). This is the same as the transmission unit 1804 of FIG. 11.

The interleave buffer memory 3000 has a storage capacity for storing therein the data 2100 of FIG. 23, and the data outputted from the block buffer memory 6002 is written in the column direction into the interleave buffer memory 3000 while shifting the column from the left to the right of the figure in terms of the conception of a two-dimensional matrix as shown in FIG. 21(C). For the reading, the data is read in the row direction while shifting the row from the upside to the downside of the figure. The write and read control of the interleave buffer memory 3000 is executed by the interleave buffer memory control circuit 3001. These are the fixed write and read methods, and therefore, the methods can be easily implemented by storing a program of the methods in, for example, a ROM of a small storage capacity and providing the interleave control circuit 2601 with the ROM.

The conceptual view of the data written in the interleave buffer memory 3000 is shown in FIG. 21 (C). This corresponds to the data 2100 of FIG. 23(A). The data outputted from the interleave buffer memory 3000 is transmitted to the parity adding circuit 2602, and a parity for FEC is added to the 124-byte data. The block diagram of the data is shown in FIG. 21(D).

The data outputted from the parity adding circuit 3002 is written into the interleave buffer memory 3003. For the writing, data are written in the row direction while shifting the row from the upside to the downside of the figure in terms of the conception of the two-dimensional matrix as shown in FIG. 21(E). For the reading, the data are read in the column direction while shifting the column from the left to the right of the figure.

The write and read control of the interleave buffer memory 3003 is executed by the interleave buffer memory control circuit 3004. These are the fixed write and read methods, and therefore, the methods can be easily implemented by storing a program of the methods in, for example, a ROM of a small storage capacity and providing the interleave control circuit 3004 with the ROM.

The block diagram of the data written in the interleave buffer memory 3003 is shown in FIG. 21 (E). This corresponds to the data 2101 of FIG. 23. The data outputted from the interleave buffer memory 3003 is outputted via an output terminal.

The processing of the AAL TYPE 1 is executed by the ATM cell forming circuit 105 similar to the description of the fifth preferred embodiment. In this case, a sequence number SN and a sequence number protection SNP are added, and thereafter, the processed data packet is transmitted to the ATM network 100 via the network interface 106.

As shown in FIG. 17, the above has described the case where the data string is divided into 124 packets as a lower layer, an error correcting code is added and a second packet of 47 is formed in the second direction when i=124 and j=47.

As described above, according to the seventh preferred embodiment, the cell loss and bit error within the error correction capacity are corrected by the error correction, and even if the cell loss and the bit error beyond the error correction capacity occur, the error does not propagate. Accordingly, high-quality image and sound transmission tolerant of the cell loss and bit error can be provided.

Although the seventh preferred embodiment has been described taking the case where the DIF data string 1804 of FIG. 19 is transmitted as an example, the execution of data deletion is not the subject matter of the present invention. By making the direction of the data string (DIF block data string) coincide with the direction of the packet (ATM cell) that is actually transmitted, the error propagation can be suppressed to the minimum for the obtainment of an effect. Therefore, even the case where no data deletion is executed is not excluded from the scope of the present invention.

The seventh preferred embodiment is based on the example in which the data 1901 of FIG. 20 cannot be corrected and the error propagates to a plurality of DIF blocks. However, this is the example in which the errors go beyond the error correction range due to a burst-like cell loss. It is sometimes the case where cell loss continuously occurs in the ATM when the network is congested, and the present invention leads to very great effect when used.

Eight Preferred Embodiment

Figure 26:
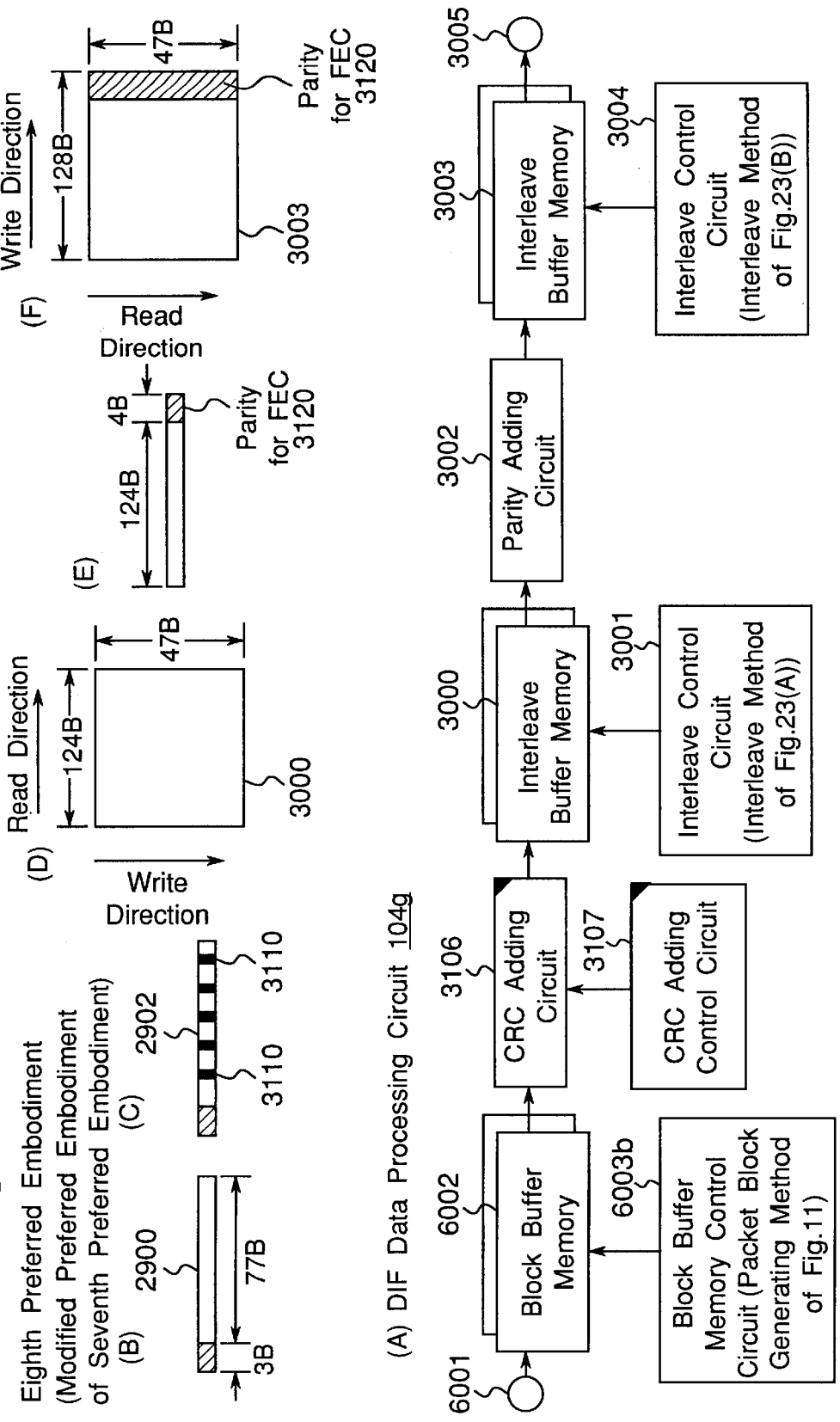

FIGS. 26(A)–26(F) are views showing a construction of an eighth preferred embodiment of the present invention, wherein FIG. 26(A) is a block diagram showing a construction of the DIF data processing circuit 104g of the eighth preferred embodiment, FIG. 26(B) is a block diagram showing data inputted from the block buffer memory 6002 to the CRC adding circuit 3106 of FIG. 26(A), FIG. 26(C) is a block diagram showing data inputted from the CRC adding circuit 3106 to the interleave buffer memory 3000 of FIG. 26(A), FIG. 26(D) is a memory map showing storage contents of the interleave buffer memory 3000 according to the interleave method executed by the interleave control circuit 3001 of FIG. 26(A), FIG. 26(E) is a block diagram showing data inputted from the parity adding circuit 3002 to the interleave buffer memory 3003 of FIG. 26(A) and FIG. 26(F) is a memory map showing storage contents of the interleave buffer memory 3003 according to the interleave method executed by the interleave control circuit 3004 of FIG. 26(A).

This eighth preferred embodiment is a modified preferred embodiment of the seventh preferred embodiment, and as shown in FIG. 26(A), the preferred embodiment is characterized in that a CRC adding circuit 3106 and a CRC addition control circuit 3107 are further inserted between the block buffer memory 6002 and the interleave buffer memory 3000 as compared with the DIF data processing circuit 104f of FIG. 21(A). In this case, the CRC adding circuit 3106 adds a parity for error detection to the data string outputted from the block buffer memory 6002 in a direction in which the data string is aligned, and then, outputs the data string to which the parity for error detection is added in a predetermined unit of data.

In this eighth preferred embodiment, a transmission system for providing the transmission system of a higher image quality than those of the transmission system by the long interleave of the AAL TYPE 1 and the error correction and the transmission system for executing a similar error correction will be described. That is, a transmission system that copes with not only the cell loss but also the bit error is provided.

The description of the preferred embodiment is based on an example of the transmission system by the long interleave of the AAL TYPE 1 and the error correction. It is to be noted that the execution of the long interleave itself is not the subject matter of the present invention, and the present invention is effective for the transmission system provided with a system for correcting errors in a predetermined unit. Therefore, the scope of the present invention excludes neither one of the case where the long interleave is executed, the case where the long interleave is not executed and even the case where a process for canceling the long interleave in the upper layer of the long interleave of the AAL TYPE 1 as described in the seventh preferred embodiment.

Figure 27:
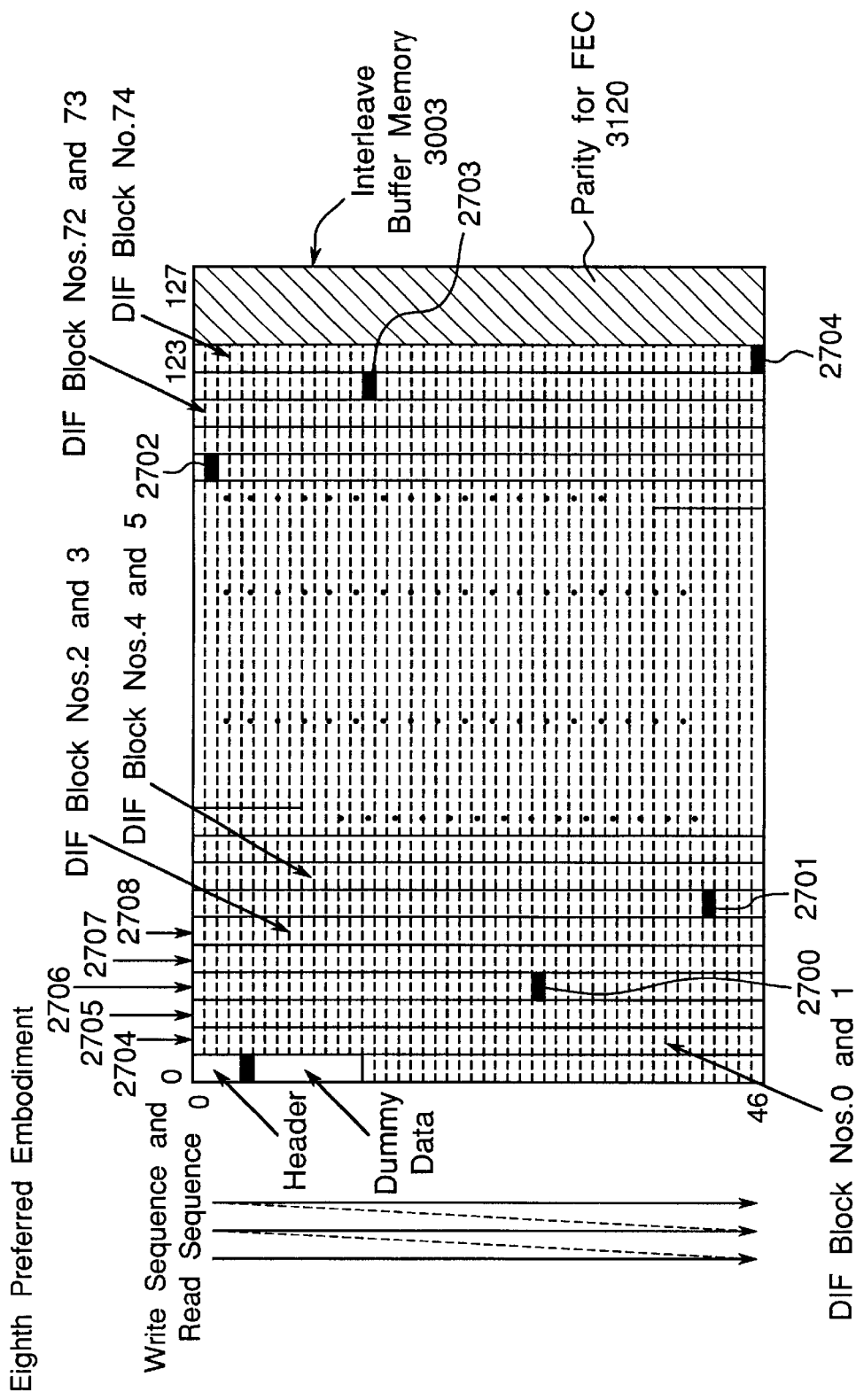
FIG. 27 is a memory map showing storage contents of the interleave buffer memory 3003 according to the interleave method executed by the DIF data processing circuit 104g of FIG. 26(A)

FIG. 27 is a memory map showing storage contents of the interleave buffer memory 3003 according to an interleave method executed by the DIF data processing circuit 104g of FIG. 26(A). The interleave unit illustrated in FIG. 27 is identical to the above-mentioned long interleave unit of FIG. 17. In FIG. 27, an error correcting code is added in the row direction (longitudinal direction in the figure) of the matrix of the interleave buffer memory 3003, and therefore, double error correction and quadruple loss correction can be technically achieved.

In the ATM transmission system, the cell loss meaning the loss of an ATM cell during the transmission, the bit error in the optical fiber cable or a twisted pair cable or the like occurs. In particular, with regard to the cell loss, there is a high probability of the occurrence of an error due to the cell loss of continuous cells when the network is congested. In particular, in the case of transmission based on the standard of the AAL TYPE 1, each ATM cell is transmitted with a sequence number added thereto. Therefore, by checking their continuity on the receiving side, it is enabled to identify the lost cell and the position of the cell (cell loss).

Referring to FIG. 27, each column is the payload of the ATM cell, which is transmitted with one byte of the sequence number (SN of FIG. 14) for the formation of 48 bytes and five bytes of the ATM cell header attached. Therefore, if, for example, the cell 2704 of FIG. 27 is lost, then the position can be identified by the check of the continuity of the cells. If there are not more than two cases of cell loss and bit error, the position and error can be detected and corrected by the 4-it parity even though the position of cell loss and bit error cannot be found.

However, when not less than four cases of cell loss occur, although the position of the cell loss can be found by the above-mentioned check of continuity of cells, the presence or absence of the bit error cannot be detected. Accordingly, there is the possibility of the occurrence of erroneous correction if loss correction is executed. When not less than five cases of cell loss occur, the loss correction cannot be executed due to a shortage of parity capacity.

Generally speaking, the probability of the occurrence of bit error is extremely smaller than the probability of the occurrence of cell loss. Therefore, if, for example, the cells 2704 and 2708 are lost, there is a high probability of the inclusion of a bit error in the other cells. However, the bit error exists even with little probability, and therefore, if an image is displayed on a screen with a bit error missed, then incorrect data is outputted onto the screen, causing a significant deterioration of the image quality.

Furthermore, when the cells 2704 and 2707 are errors in FIG. 27, there is very little probability of the inclusion of a bit error in the other cells. However, so long as there is a probability of the inclusion of a bit error, this results in an erroneous correction if the loss correction is effected on the error cell, so that an incorrect image is consequently displayed on the screen, resulting in a destroyed image.

In the eighth preferred embodiment, the presence or absence of the bit error is surely detected, so that the DIF blocks including no bit error are outputted as they are, thereby utilizing the greater part of data and treating each DIF block including a bit error as an error. For example, by treating the status bit (SAT) of FIG. 3 as an error, the error correcting process is executed to allow a high image quality and a high sound quality to be maintained.

For the above purpose, the eighth preferred embodiment of the present invention executes error check by CRC in the ATM cell transmission direction. The example shown in FIG. 27 adopts 8-bit CRC (one byte) by assigning one CRC to the header and assigning one CRC to two DIF blocks. It is to be noted that one CRC is assigned to one DIF block for the last DIF block. The assignment of CRC is not limited to this, and when assigning CRC to an ATM cell, the scope of the present invention does not exclude the assignment of an arbitrary number of CRCs as in the case where one CRC is assigned to one DIF block.

In FIG. 27, one-byte CRC is added next to the 5-byte header, which is followed by nine bytes of dummy bit and a one-byte CRC added to every two DIF blocks. It is to be noted that a CRC is assigned to one DIF block for the last DIF block. In FIG. 27, the CRCs are painted in black.

In FIG. 27, the concrete CRC positions are as follows. The 6th byte of the 1st column is used as the CRC for the header. The 29th byte of the 4th column is used as the CRC for the DIF block 0 and the DIF block 1. The 43rd byte of the 7th column is used as the CRC for the DIF block 2 and the DIF block 3. The 10th byte of the 11th column is used as the CRC for the DIF block 4 and the DIF block 5. The 24th byte of the 14th column is used as the CRC for the DIF block 6 and the DIF block 7. The 38th byte of the 17th column is used as the CRC for the DIF block 8 and the DIF block 9. The 5th byte of the 21st column is used as the CRC for the DIF block 10 and the DIF block 11. The 19th byte of the 24th column is used as the CRC for the DIF block 12 and the DIF block 13. The 33rd byte of the 27th column is used as the CRC for the DIF block 14 and the DIF block 15. The 47th byte of the 30th column is used as the CRC for the DIF block 16 and the DIF block 17. The 14th byte of the 34th column is used as the CRC for the DIF block 18 and the DIF block 19. The 28th byte of the 37th column is used as the CRC for the DIF block 20 and the DIF block 21. The 42nd byte of the 40th column is used as the CRC for the DIF block 22 and the DIF block 23. The 9th byte of the 44th column is used as the CRC for the DIF block 24 and the DIF block 25. The 23rd byte of the 47th column is used as the CRC for the DIF block 26 and the DIF block 27. The 37th byte of the 50th column is used as the CRC for the DIF block 28 and the DIF block 29. The 4th byte of the 54th column is used as the CRC for the DIF block 30 and the DIF block 31. The 18th byte of the 57th column is used as the CRC for the DIF block 32 and the DIF block 33. The 32nd byte of the 60th column is used as the CRC for the DIF block 34 and the DIF block 35. The 46th byte of the 63rd column is used as the CRC for the DIF block 36 and the DIF block 37. The 13th byte of the 67th column is used as the CRC for the DIF block 38 and the DIF block 39. The 27th byte of the 70th column is used as the CRC for the DIF block 40 and the DIF block 41. The 41st byte of the 73rd column is used as the CRC for the DIF block 42 and the DIF block 43. The 8th byte of the 77th column is used as the CRC for the DIF block 44 and the DIF block 45. The 22nd byte of the 80th column is used as the CRC for the DIF block 46 and the DIF block 47. The 36th byte of the 83rd column is used as the CRC for the DIF block 48 and the DIF block 49. The 3rd byte of the 87th column is used as the CRC for the DIF block 50 and the DIF block 51. The 17th byte of the 90th column is used as the CRC for the DIF block 52 and the DIF block 53. The 31st byte of the 93rd column is used as the CRC for the DIF block 54 and the DIF block 55. The 45th byte of the 96th column is used as the CRC for the DIF block 56 and the DIF block 57. The 12th byte of the 100th column is used as the CRC for the DIF block 58 and the DIF block 59. The 26th byte of the 103rd column is used as the CRC for the DIF block 60 and the DIF block 61. The 40th byte of the 106th column is used as the CRC for the DIF block 62 and the DIF block 63. The 7th byte of the 110th column is used as the CRC for the DIF block 64 and the DIF block 65. The 21st byte of the 113th column is used as the CRC for the DIF block 66 and the DIF block 67. The 35th byte of the 116th column is used as the CRC for the DIF block 68 and the DIF block 69. The 2nd byte of the 120th column is used as the CRC for the DIF block 70 and the DIF block 71. The 16th byte of the 123rd column is used as the CRC for the DIF block 72 and the DIF block 73. The 47th byte of the 124th column is used as the CRC for the DIF block 74.

It is proper to execute the data write and read in FIG. 27 conceptually in the column direction (longitudinal direction in FIG. 27) of the matrix of the interleave buffer memory 3003. That is, if the DIF block data is written in the column direction, and thereafter, read in the column direction on the matrix shown in FIG. 27, then the invention as described in the seventh preferred embodiment may be applied according to the preceding processing. In this case, it is proper for the data string to have a sequence of the header (5 bytes), header use CRC (1 byte), dummy (9 bytes), DIF block 0 (77 bytes), DIF block 1 (77 bytes), CRC (1 byte) for DIF block 0 and DIF block 1, DIF block 2 (77 bytes), DIF block 3 (77 bytes), CRC (1 byte) for DIF block 2 and DIF block 3, DIF block 4 (77 bytes), . . . , DIF block 74 (77 bytes) and CRC (1 byte) for DIF block 74.

Figure 28:
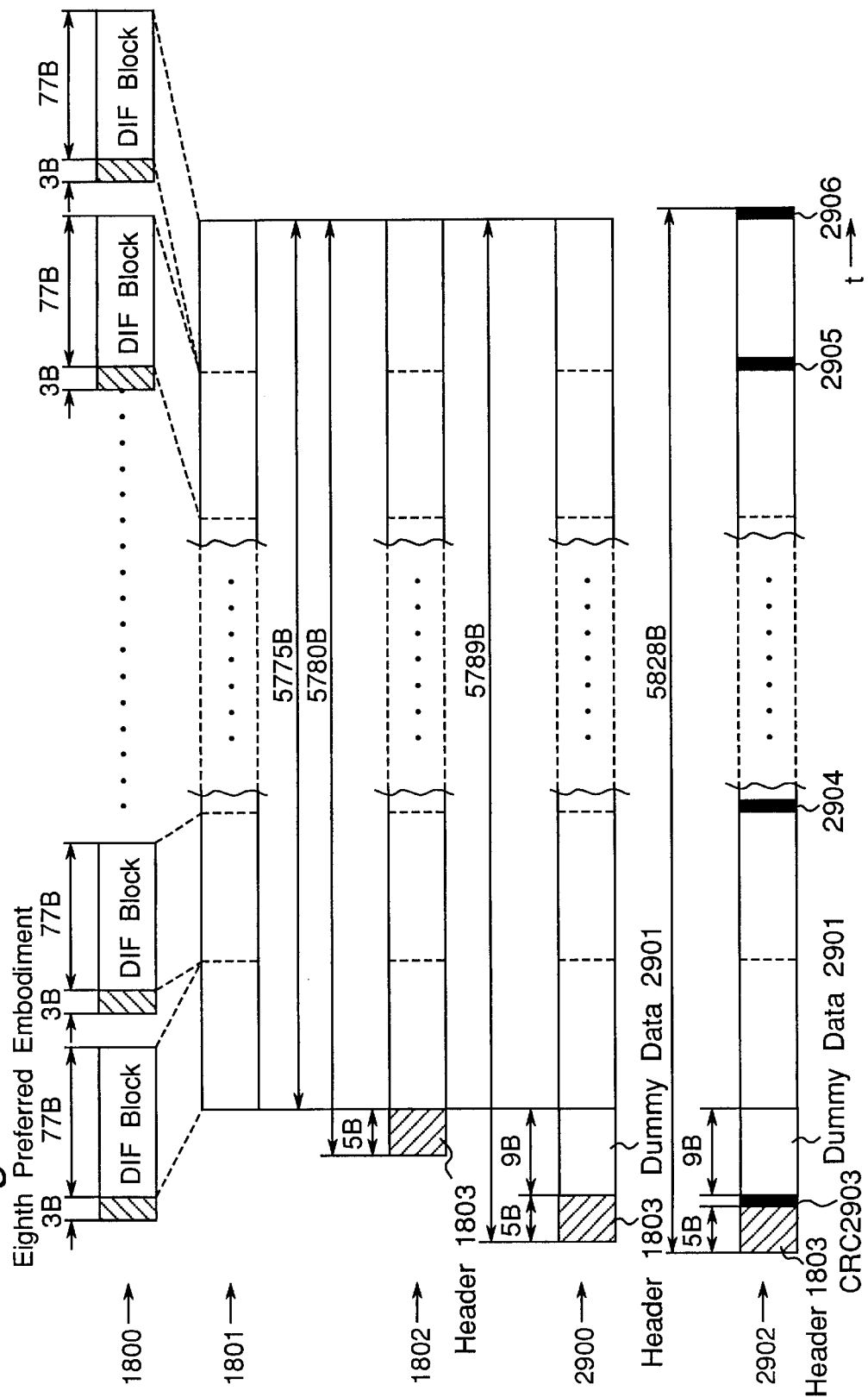
FIG. 28 is a block diagram showing a packet block generating method executed by an ATM transmission apparatus provided with the DIF data processing circuit 104g of FIG. 26(A)

FIG. 28 is a block diagram showing a packet block generating method executed by an ATM transmission apparatus provided with the DIF data processing circuit 104g of FIG. 26(A).

In FIG. 26(A), the DIF block data string is inputted via an input terminal. Next, based on the inputted data string, the block buffer memory 6002 and block buffer memory control circuit 6003a obtain the DIF block data string that is shown in FIG. 26(B) and denoted by 2900 in FIG. 28, and then, output the data string. The construction of the data outputted from the block buffer memory 6002 is shown in FIG. 26(B). This is identical to 2900 of FIG. 28. The data string 2900 shown in FIG. 26(B) differs from the data string 1804 of FIG. 19 only in the number of bytes of the dummy. Therefore, the circuit can be easily realized by merely slightly changing the block buffer memory control circuit 6003b of FIG. 10.

The CRC adding circuit 3106 is a circuit for adding an 8-bit CRC to the data string outputted from the block buffer memory 6002, and the operation thereof is controlled by the CRC addition control circuit 3107. The CRC addition control circuit 3107 executes a CRC adding process by controlling the CRC adding circuit 3106 with regard to the reset timing of the CRC adding circuit, the CRC adding timing, a dummy adding timing and so on.

According to the CRC adding method, the CRC addition control circuit 3107 resets the CRC adding circuit 3106 at the head of the header and adds one byte of CRC to the tail of the 5-byte header. The CRC adding circuit 3106 is reset at the head of the DIF block 0, and 1-byte CRC is added next to the DIF block 1. Likewise, the CRC adding circuit 3106 is reset for the DIF blocks of the even numbers, 1-byte CRC is added behind the DIF blocks of the odd numbers, and the 1-byte CRC is added to every two DIF blocks. A CRC is added to one DIF block for only the last DIF block.

The CRC addition control circuit 3107 resets the CRC adding circuit 3106 in accordance with the above-mentioned reset timing to execute control so as to output eight bits (one byte) of CRC from the CRC adding circuit 3106 in accordance with the CRC adding timing. The output data of the CRC adding circuit 3106 is shown in FIG. 26(C) FIG. 26(C) is identical to 2902 of FIG. 21.

Subsequently, the interleave buffer memory 3000, interleave buffer memory control circuit 3001, parity adding circuit 3002, interleave buffer memory 3003 and interleave control buffer memory circuit 3004 have the same processes as those of the seventh preferred embodiment of FIG. 21.

As described above, according to the eighth preferred embodiment of the present invention, the cell loss and bit error are corrected by error correction within the error correction range. When cell loss or bit error out of the error correction range occurs, the presence or absence of the bit error is securely detected by the CRC, and the DIF blocks including no bit error are outputted as they are for the utilization of the greater part of the data. Any DIF block including a bit error is treated as an error and subjected to error correction, thereby allowing a transmission system maintaining a high image quality and a high sound quality to be provided.

Although the eighth preferred embodiment has been described by means of the data reducing means shown in FIG. 28, the subject matter of the present invention is to provide a CRC adding means (CRC adding circuit 3106) in the direction identical to that of the data string to be transmitted and obtain an effect by adding the error correcting code in the directions perpendicular to each other conceptually on the two-dimensional matrix. Therefore, the present invention has an effect regardless of the presence or absence of the data reducing means, and the scope of the present invention does not exclude even the case where no data reducing means is provided.

Although the eighth preferred embodiment takes the case where the AAL TYPE 1 of the ATM is used as an example, the present invention can be realized by incorporating header information into a varied protocol data unit (PDU) when using the AAL TYPE 5.

Ninth Preferred Embodiment

FIGS. 29(A)–29(E) are views showing a construction of a ninth preferred embodiment of the present invention, wherein FIG. 29(A) is a block diagram showing a construction of the DIF data processing circuit 104*h* of the ninth preferred embodiment, FIG. 29(B) is a block diagram showing data inputted from the block buffer memory 6002 to the interleave buffer memory 3000 of FIG. 29(A), FIG. 29(C) is a memory map showing storage contents of the interleave buffer memory 3000 according to an interleave method executed by the interleave control circuit 3001 of FIG. 29(A), FIG. 29(D) is a block diagram showing data inputted from the parity adding circuit 3002 to the interleave buffer memory 3003 of FIG. 29(A) and FIG. 29(E) is a memory map showing storage contents of the interleave buffer memory 3003 according to an interleave method executed by the interleave control circuit 3004 of FIG. 29(A).

This ninth preferred embodiment is a modified preferred embodiment of the seventh preferred embodiment, and as shown in FIG. 29(A), the preferred embodiment is characterized in that a block buffer memory control circuit 6003*c* is provided as compared with the DIF data processing circuit 104*f* of FIG. 21. In this case, the block buffer memory control circuit 6003*c* is characterized in generating two transmission headers having a new identifier by reducing the predetermined redundancy information from the block information belonging to a plurality of blocks based on the data string inputted via the input terminal 6001, then outputs data including the transmission unit having the generated two transmission headers and arranges the above two transmission headers in the data including the above transmission unit so that the two transmission headers are positioned at the head of the data unit in the column direction of the matrix of the interleave buffer memory 3003 of FIG. 30. These features are provided for the protection of the header information.

Figure 29:
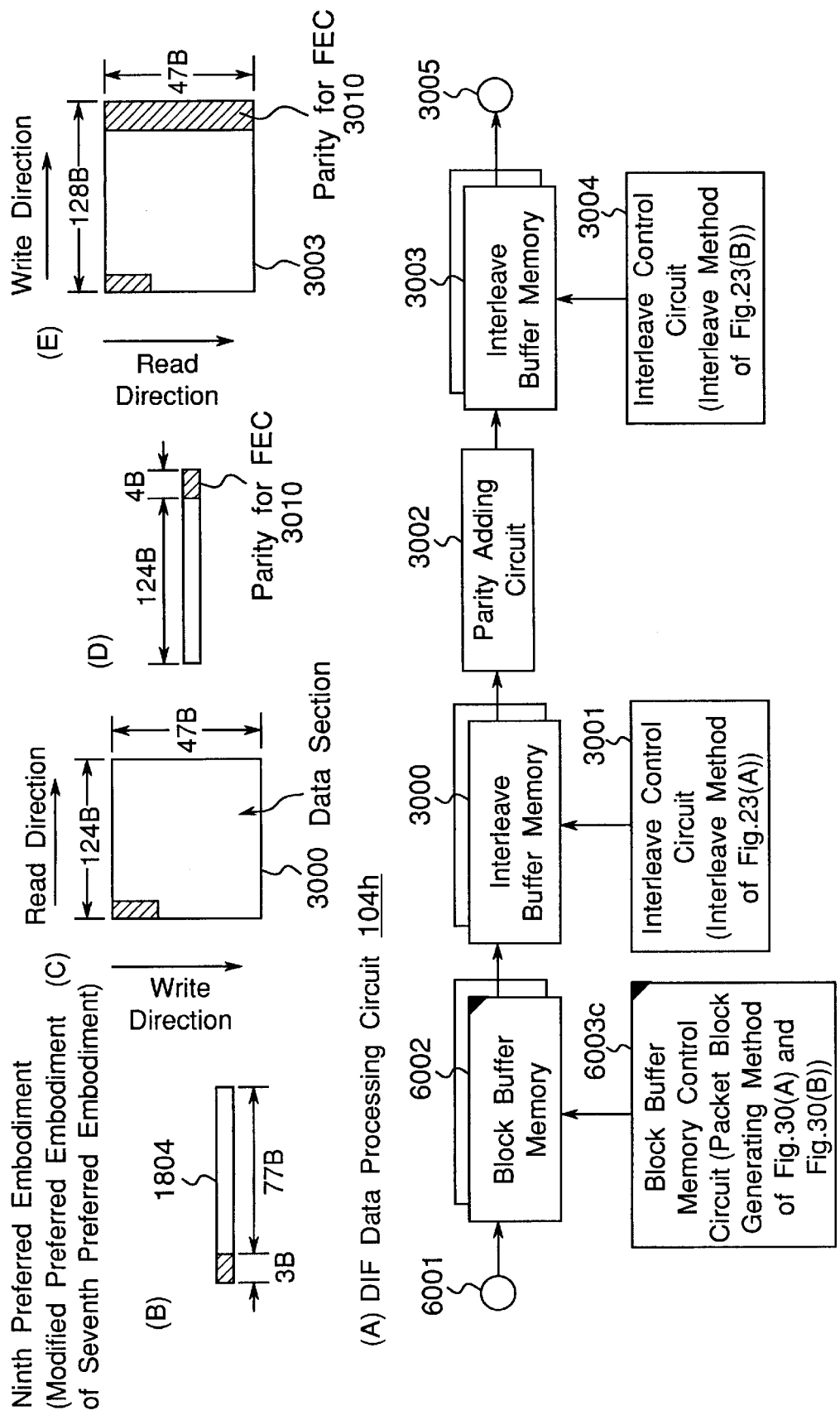
Figure 30:
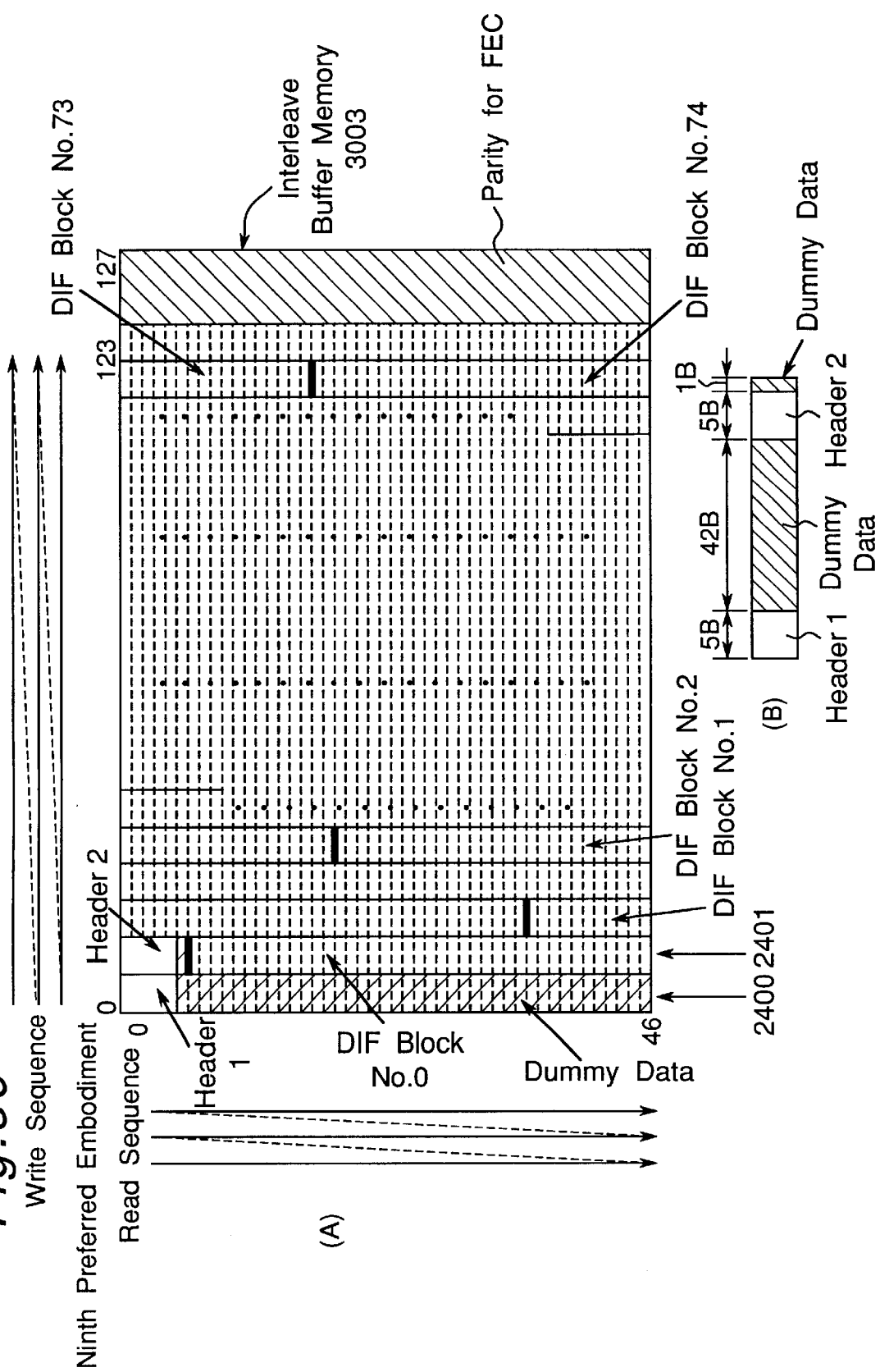
FIG. 30 is a memory map that shows a packet block generating method executed by the DIF data processing circuit 104h of FIG. 29(A), and that shows the detail of the storage contents stored in an interleave buffer memory 3003 of FIG. 29(A)

FIG. 30 is a memory map that shows a packet block generating method executed by the DIF data processing circuit 104*h* of FIG. 29(A) and shows the detail of the storage contents stored in the interleave buffer memory 3003 of FIG. 29(A). In the ninth preferred embodiment, the header is protected by transferring two times the header information including the time code through the long interleave of the AAL TYPE 1.

As described above, when the cell loss rate and the error rate of the ATM network are extremely bad, it is sometimes the case where the cell loss or the like goes beyond the error correction capacity and no correction can be effected. For example, in FIG. 24, if the ATM cell 2201 is lost and no correction can be executed, since the ATM cell 2201 includes the header information of time code information and so on, the position of the image to which all of the 75 DIF blocks belonging to the long interleave unit belong cannot be identified, then all the 75 DIF blocks are to be consequently treated as errors, resulting in a remarkably deteriorated image. In particular, when a high image quality is required by a broadcasting station or the like, the image cannot be accepted. Therefore, in the preferred embodiment of the present invention, the detection probability of the header information in the interleave unit is improved by incorporating the header information into two ATM cells in each interleave unit.

As shown in FIG. 30(A), header information is incorporated into the head sections of an ATM cell 2400 and an ATM cell 2401. In order to incorporate the header information into the positions, the header and dummy information are to be arranged as shown in FIG. 30(B) in the transmission unit 1804 of FIG. 19.

Although the ninth preferred embodiment has two pieces of header information, the header information is not limited in number to two. The positions in which the plurality of headers are stored may be located in any ATM cells so long as the ATM cells are different. The header inside each ATM cell may be located in an arbitrary position.

As described above, the present preferred embodiment is a modified preferred embodiment of the seventh preferred embodiment, and the difference to the seventh preferred embodiment is that this preferred embodiment can be realized by executing control so that the header is transmitted two times to the dummy section as shown in FIG. 30(B) by means of the block buffer memory control circuit 6003*c* of FIG. 29. In this case, the time code can be easily realized by providing a register inside the block buffer memory 6002 and storing the time code in the register. In a similar manner to that of the seventh preferred embodiment, the processing of the block buffer memory control circuit 6003*c* is fixed, and therefore, this preferred embodiment can be easily realized by providing a ROM inside the block buffer memory control circuit 6003*c*.

According to the present invention, the data are transmitted by mounting the plurality of cells with the header of the time code information or the like for the data in the predetermined processing unit (in the interleave unit of the AAL TYPE 1 in the ninth preferred embodiment), so that the image position or sound position in the processing unit can be securely detected, thereby allowing high-quality image and sound to be transmitted.

Although the ninth preferred embodiment has been described taking the case where the time code is incorporated two times through the data reducing process shown in FIG. 19 as an example, the subject matter of the present invention is to allow the obtainment of the characteristic effect by writing the time code into the plurality of different packets (ATM cells) inside the transmission process unit (interleave unit of the AAL TYPE 1). Therefore, the present invention has the characteristic effect regardless of the presence or absence of the data reducing process, and the scope of the present invention does not exclude even the case where no data reducing process is executed.

As described above, according to the ninth S preferred embodiment of the present invention, the header information of the time code or the like can be surely detected even when the cell loss or bit error occurs, so that the position of the transmitted image information can be surely detected, thereby allowing the transmission of the high-quality image and sound to be achieved.

Tenth Preferred Embodiment

Figure 31:
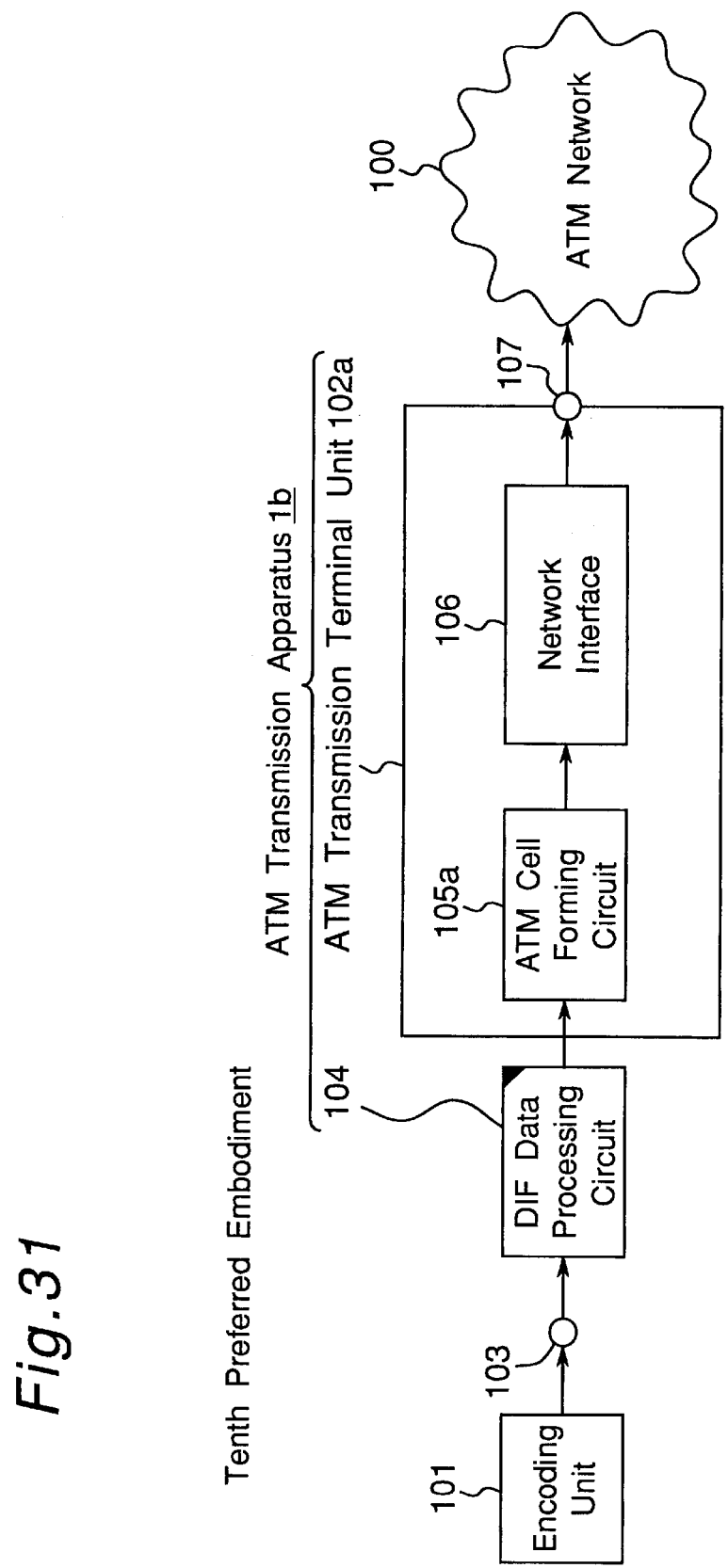
FIG. 31 is a block diagram showing a construction of an ATM transmission apparatus 1b according to a tenth preferred embodiment of the present invention.
Figure 32:
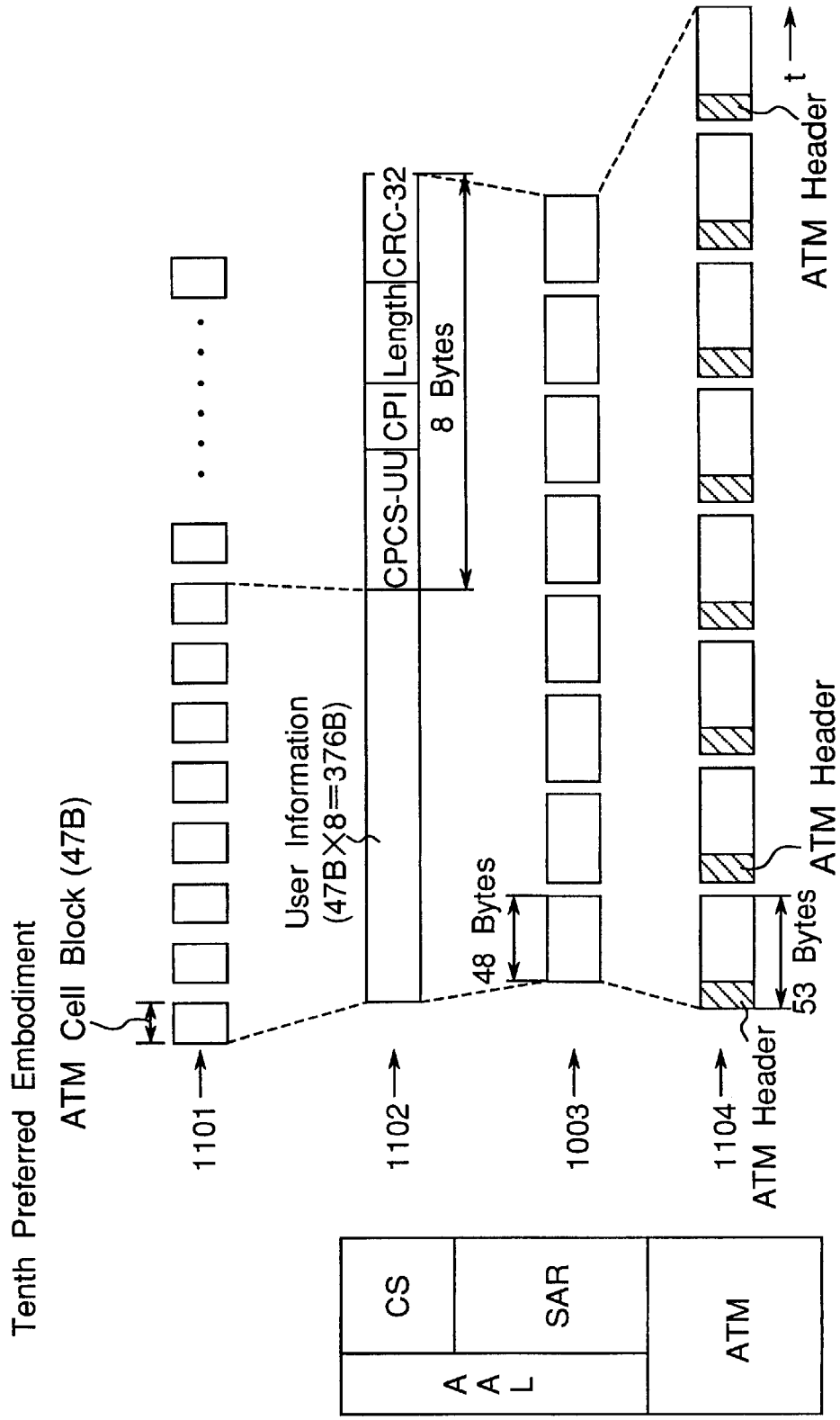
FIG. 32 is a block diagram showing an ATM cell formation process executed by the ATM cell forming circuit 105a of FIG. 31.

FIG. 31 is a block diagram showing a construction of an ATM transmission apparatus 1*b* according to a tenth preferred embodiment of the present invention. FIG. 32 is a block diagram showing an ATM cell formation process executed by the ATM cell forming circuit 105*a* of FIG. 31.

This tenth preferred embodiment is characterized in that the ATM cell forming circuit 105*a* is provided as compared with the first preferred embodiment of FIG. 1 and transmission is executed by means of the protocol of the AAL TYPE 5 of the ATM.

In FIG. 32, the reference numeral 1101 denotes an ATM cell block sequence described in the first preferred embodiment. The reference numeral 1102 denotes an AAL layer CS user information and additional information. The additional information of the AAL TYPE 5 is constructed of:

(a) padding (not shown, referred to as PAD hereinafter) of 0 to 47 bytes for such adjustment that the frame becomes the multiple of 48 bytes;

(b) CPCS (Common Part Convergence Sublayer) inter-user information (CPCS-UU) for transferring information to be used for the upper layer;

(c) common part indicator (CPI) that currently has no predetermined use and set to zero in every case under present conditions;

(d) Length for indicating a user information length in a unit of bytes; and (e) an error detection use code (CRC-32) of four bits (32 bites) for executing error detection of the whole CPCS frame. Eight bytes of the above CPCS-UU, CPI, Length and CRC-32 are referred to as a trailer in the following description.

The tenth preferred embodiment of the present invention has a relevance to the user information region, PAD and Length. According to the standard of the AAL TYPE 5 protocol, the PAD must be inserted for achieving the adjustment so that a total of the user information region and the additional information comes to have the multiple of 48 bytes. The PAD is meaningless data, which causes an increase in the amount of data to be transmitted, must be made as small as possible. When inserting the PAD, it is inserted between the user information region and the CPCS-UU The reference numeral 1103 denotes the data construction of SAR (Segmentation and Re-assembly) sublayer of the AAL layer. The reference numeral 1104 denotes the cell of the ATM layer. The reference numeral 1101 denotes data constructed of 248 ATM cell blocks of 47 bytes as described in the first preferred embodiment.

In the CS, user information is constructed of eight ATM cell blocks. In this case, the user information comes to have 376 bytes, and therefore, the Length stores therein the state of being 376 bytes. The additional information has eight bytes, and therefore, this results in a total of 384 bytes, which is the multiple of 48 bytes of the payload, requiring no useless PAD. When the processing of the data 1102 is completed, the data is transmitted to the SAR layer. In the SAR layer, the data is divided into groups of 48 bytes according to the AAL TYPE 5 protocol and transmitted to the ATM layer. In the ATM layer, as shown in FIG. 32, an ATM cell is formed by attaching the 5-byte cell header as indicated by the hatched section of 1104.

The ATM cell block sequence is constructed of 248 ATM cell blocks, and therefore, the protocol data unit of 1102 is processed exactly in the number of 248/8=31. Accordingly, there is no need for adding the dummy data (PAD) for establishing the protocol data unit, so that very efficient transmission can be achieved.

The ATM cell forming circuit 105*a* executes the processing of the AAL layer and the ATM layer. In regard to circuits for the processing, equipments for the transmission according to the AAL TYPE 5 protocol are currently popularized, and the circuits can be easily realized by using those equipments. In regard to the network interface 106, ATM physical layer LSIs and the like are popularized, and the interface can be easily realized by using those equipments. Therefore, the AAL layer, the ATM layer and the ATM physical layer can be easily achieved at low cost.

As described above, in the present preferred embodiment, a data amount reduction of 2.87% can be achieved in a similar manner to that of the first preferred embodiment, so that the communications load can be remarkably reduced and the use of the resources of the communications network can be reduced. By virtue of the reduction in the amount of communications, the communications time is reduced and the reliability of the real-time communications is improved by that much or degree. Furthermore, the load applied on the ATM network is reduced, the load applied on the ATM switch inside the network is reduced and the probability of the occurrence of the cell loss is also reduced, so that very reliable communications with respect to errors can be achieved. Furthermore, the user information section of CS of the TYPE 5 can be effectively used, so that transmission of a high efficiency can be achieved.

The data are delivered after the processing in the upper layer in a form for very easy processing in the AAL layer, and therefore, the preferred embodiment can be used necessitating no additional circuit for the processing of the AAL layer and the subsequent stages. Furthermore, by virtue of the execution of the processing based on the standard of the AAL TYPE 5, the currently popularized equipments can be used as they are. The circuit to be added can be realized with a very simple circuit construction, and therefore, the circuit can be very easily achieved at low cost.

Eleventh Preferred Embodiment

Figure 33:
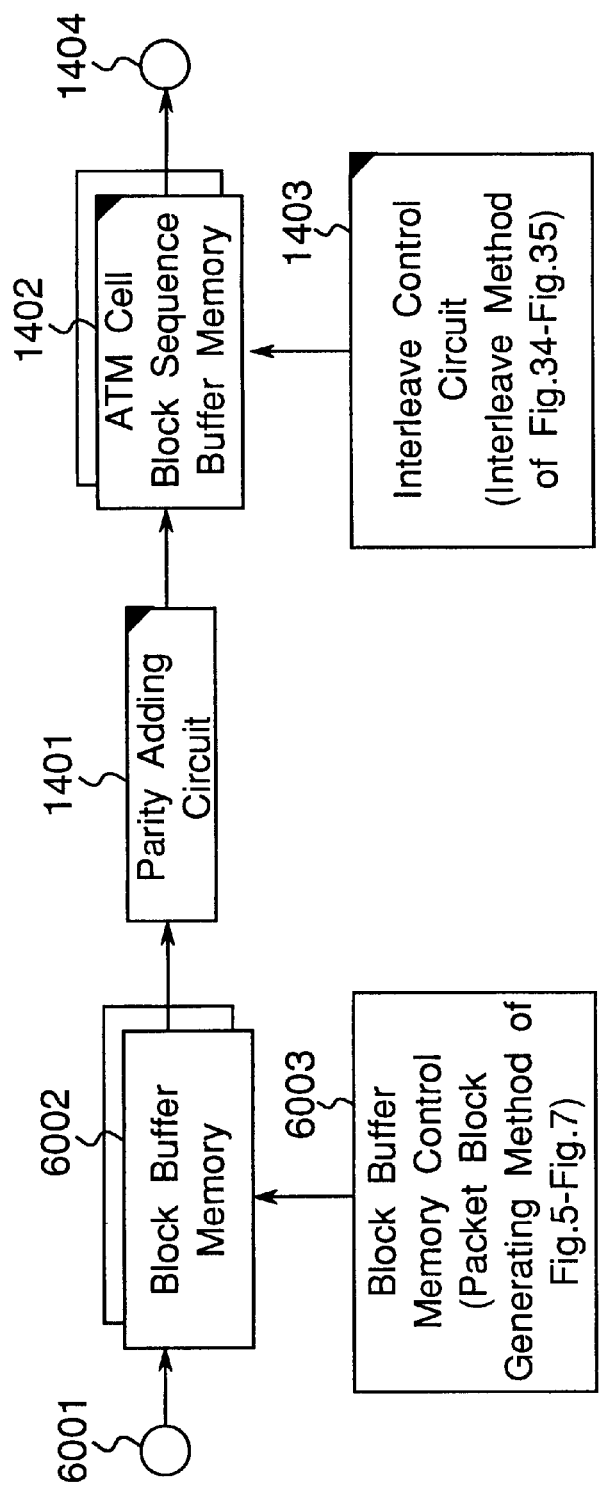
FIG. 33 is a block diagram showing a construction of a DIF processing circuit 104i according to an eleventh preferred embodiment of the present invention.

FIG. 33 is a block diagram showing a construction of a DIF processing circuit 104*i* according to an eleventh preferred embodiment of the present invention, while FIG. 34 is a block diagram showing a packet block generating method executed by an ATM transmission apparatus provided with the DIF data processing circuit 104*i* of FIG. 33.

This eleventh preferred embodiment is characterized in that a parity adding circuit 1401, an ATM cell block sequence buffer memory 1402 and an interleave control circuit 1403 are further provided as compared with the DIF data processing circuit 104 of FIG. 4. In this case, the parity adding circuit 1401 adds a predetermined Parity for FEC to the data string outputted from the block buffer memory 6002 in a predetermined unit of data, and then, outputs data to which the Parity for FEC is added. Next, the interleave control circuit 1403 executes an interleave process by writing the data outputted from the parity adding circuit 1401 into the ATM cell block sequence buffer memory 1402 having a matrix form in the first direction of the matrix, and thereafter, reading the data from the ATM cell block sequence buffer memory 1402 in the second direction perpendicular to the first direction of the matrix, and then, outputs the data obtained after the interleave process in a unit of data in the second direction. Further, the ATM cell forming circuit 105*a* and the network interface 106 transmit the inputted data to the ATM network 100 with the data unit in the second direction used as a transmission unit.

FIG. 34 shows the data processing of the eleventh preferred embodiment of the present invention. The eleventh preferred embodiment has the effect that the error correction effect can be improved by executing the data interleave and effectively utilizing the error detection by CRC executed by the AAL TYPE 5 protocol.

In FIG. 34, the reference numeral 1201 denotes the ATM cell block sequence described in the first preferred embodiment. The reference numeral 1202 denotes data obtained by subjecting the ATM cell block sequence 1201 to an interleave process and a parity for FEC adding process according to a method as described later, and the hatched section is the Parity for FEC.

The reference numeral 1203 denotes the CS of the AAL layer. The reference numeral 1204 denotes the data construction of the SAR sublayer of the AAL layer. The reference numeral 1205 denotes the cells of the ATM layer. The processes of 1203, 1204 and 1205 are the same as those described in the fourth preferred embodiment. What is different from the fourth preferred embodiment is only the point that the amount of information is increased by the Parity for FEC and the number of processing times is increased.

FIG. 35 is a memory map showing storage contents of an ATM cell block sequence buffer memory 1402 according to a packet block generating method executed by the interleave control circuit 1403 of FIG. 33

According to the method shown in FIG. 35, the data write direction and read direction are shown by the conception of the two-dimensional matrix on the ATM cell block sequence buffer memory 1402. Each piece of user information has 376 bytes, and the data of the ATM cell block sequence is stored into 31 pieces of user information. Therefore, the data has a total of 376×31=11656 bytes corresponding to the data amount of the ATM cell block sequence. Accordingly, the processing can be achieved without incorporating dummy data, so that effective transmission can be achieved.

The writing of data into the ATM cell block sequence buffer memory 1402 is executed in the column direction (longitudinal direction in the figure) as denoted by 9001 in FIG. 35. The parity amount may have any value corresponding to the required error correction capacity, and four bytes are provided for 31-byte information in the present preferred embodiment.

A 4-byte Parity for FEC is added to the 31-byte data. When the writing in the column direction is completed up to the Parity for FEC, then the data obtained by adding the 4-byte Parity for FEC to the next 31-byte data is written in the column direction so that the address in the row direction increases. When the writing of all the data and parities for FEC is completed, then the next reading is executed.

On the other hand, the reading is executed in the direction (horizontal direction in FIG. 35) that is two-dimensionally perpendicular to the write direction as shown in FIG. 35. In this case, the reading is executed from the user information 0, user information 1 and user information 2 to the Parity for FEC 3.

Furthermore, as denoted by 1203 in FIG. 34, processing of additional information of CRC and so on is executed through the AAL process for every read of the user information. On the receiver side of the ATM transmission terminal apparatus, the error detection can be executed by the CRC error check, allowing the loss correction to be achieved by the added parity. Therefore, the correction capacity is increased taking advantage of the AAL standard. It is to be noted that the correction of up to double error can be achieved by the added parity.

In the DIF data processing circuit 104i shown in FIG. 33, to the ATM cell block sequence outputted from the block buffer memory 6002 is added the 4-byte Parity for FEC by the parity adding circuit 1401 every 31 bytes, and thereafter, is inputted to the ATM cell block sequence buffer memory 1402. The ATM cell block sequence buffer memory 1402 is constructed of two memories capable of storing therein the user information and the Parity for FEC shown in FIG. 35 and alternately used for writing use and reading use. The data writing and reading of the ATM cell block sequence buffer memory 1402 are executed by the interleave control circuit 1403.

The interleave control circuit 1403 generates an address so that 35-byte data obtained by adding the 4-byte parity to the 31-byte data outputted from the parity adding circuit 1401 is written into the ATM cell block sequence buffer memory 1402 in the column direction (longitudinal direction in FIG. 35) and executes the writing of the data. When the writing of data into each column is completed, the writing is advanced in the column direction of the data in a direction in which the row address increases, and the writing is switched to the reading when the writing of the memory shown in FIG. 35 is completed (except for the 8-byte additional information). For the reading, the interleave control circuit 1403 generates an address so that the data is read in the row direction of the matrix of FIG. 35 from the ATM cell block sequence buffer memory 1402, thereby sequentially reading the data in a unit of user information (376 bytes).

The interleave control circuit 1403 repeatedly executes the generation of fixed addresses for interleave, and therefore, the circuit can be constructed of a simple circuit with a ROM in which the addresses of one-time sequence are stored. The data read out from the ATM cell block sequence buffer memory 1402 is outputted from an output terminal 1404. The output from the output terminal 1404 becomes the output of the DIF data processing circuit 104 of FIG. 1, and therefore, the next processing proceeds to the ATM cell forming circuit 105a of FIG. 1.

The ATM cell forming circuit 105a executes the processing of the AAL layer and the ATM layer as described above. In regard to circuits for the above processing, equipments for the transmission according to the AAL TYPE 5 protocol are currently popularized, and the circuits can be easily realized by using those equipments. In regard to the network interface 106, ATM physical layer LSIs and the like are popularized, and the interface can be easily realized by using those equipments. Therefore, the AAL layer, the ATM layer and the ATM physical layer can be easily realized at low cost.

As described above, according to the eleventh preferred embodiment, the error correction effect is improved by taking advantage of the result of the error detection of the AAL TYPE 5 based on the ATM standard and adding the Parity for FEC so that the parity becomes perpendicular to the conceptual direction of error detection of AAL TYPE 5. In particular, the cell loss (packet loss) that is the error characteristic of the ATM communications (packet communications) can be detected by the error check of the AAL TYPE 5 and the loss correction of the CS block of which an error is detected can be achieved. Therefore, highly-reliable communications tolerant particularly of the cell loss can be achieved.

Furthermore, the interleave process is executed by the interleave control circuit 1003, and therefore, the effect of dispersing errors in a unit of ATM cell block sequence is very great. Furthermore, there are many equipments based on the ATM standard and those equipments can be utilized for the AAL processing, and therefore, the present invention can be easily achieved at low cost.

Furthermore, a data amount reduction of 2.87% can be achieved in a similar manner to that of the first preferred embodiment, so that the communications load can be remarkably reduced and the use of the resources of the communications network can be reduced. By virtue of the reduction in the amount of communications, the communications time is reduced and the reliability of the real-time communications is improved by that much or degree.

Furthermore, the interleave unit is made equal to the data amount of the ATM cell block sequence, and therefore, the data transmission can be efficiently executed without adding the dummy data or the like. Consequently, the communications load can be remarkably reduced and the use of the resources of the communications network can be reduced. By virtue of the reduction in the amount of communications, the communications time becomes short, thereby improving the reliability of the real-time communications by that much or degree.

The data are delivered after the processing in the upper layer in a form for very easy processing in the AAL layer, and therefore, the preferred embodiment can be used necessitating no additional circuit for the processing of the AAL layer and the subsequent stages. That is, the currently popularized equipments can be used as they are, and the circuit to be added can be realized with a very simple circuit construction, and therefore, the circuit can be very easily realized at low cost. Furthermore, the error detection by CRC is executed, and therefore, not only the cell loss but also the bit error are surely detected, so that a high-quality transmission system free of erroneous correction can be provided.

Although the interleave is executed in the eleventh preferred embodiment, the scope of the present invention does not exclude the form in which no interleave is executed. In such a case, it is proper to make the direction in which the Parity for FEC is added as in, for example, FIG. 35 is made identical to the direction of the present preferred embodiment and make the data write direction and read direction identical to each other. Even in such a case, the effect that the cell loss correction capacity is high is not lost.

The eleventh preferred embodiment takes the case where the compressed image is transmitted as an example. In regard to, for example, uncompressed image and sound information, the error does not propagate to every compressed packet, and the error is dispersed by the interleave effect, so that specially high-quality transmission can be achieved.

Twelfth Preferred Embodiment

FIG. 36 is a view showing a construction of a twelfth preferred embodiment of the present invention, wherein FIG. 36(A) is a block diagram showing a construction of the DIF data processing circuit 104j of the twelfth preferred embodiment, FIG. 36(B) is a block diagram showing data inputted from the block buffer memory 6002 to the interleave buffer memory 2600 of FIG. 36(A), FIG. 36(C) is a memory map showing storage contents of the interleave buffer memory 2600 according to an interleave method executed by the interleave control circuit 2601 of FIG. 36(A), FIG. 36(D) is a block diagram showing data inputted from the parity adding circuit 2602 to the interleave buffer memory 2603 of FIG. 36(A) and FIG. 36(E) is a memory map showing storage contents of the interleave buffer memory 2603 according to an interleave method executed by the interleave control circuit 2604 of FIG. 36(A).

This twelfth preferred embodiment is characterized in that an interleave buffer memory 2600, an interleave control circuit 2601, a parity adding circuit 2602, an interleave buffer memory 2603 and an interleave control circuit 2604 are provided in place of the circuits 1401, 1402 and 1403 as compared with the DIF data processing circuit 104i of the eleventh preferred embodiment of FIG. 33.

The DIF data processing circuit 104i of this twelfth preferred embodiment is provided with:

(a) an interleave control circuit 2601 that executes a first interleave process by writing the data string outputted from the block buffer memory 6002 into the interleave buffer memory 2600 having a first matrix form in the first direction of the first matrix, and thereafter, reading the data from the interleave buffer memory 2600 in the second direction perpendicular to the first direction of the first matrix, and then, outputs the data obtained after the first interleave process in a unit of data in the second direction;

(b) a parity adding circuit 2602 that adds a predetermined Parity for FEC to the data outputted from the interleave buffer memory 2600 in a unit of data in the second direction, and then, outputs the data to which the Parity for FEC is added; and (c) an interleave control circuit 2604 that executes a second interleave process by writing the data outputted from the parity adding circuit 2602 into the interleave buffer memory 2603 having a second matrix form in a fourth direction of the second matrix coinciding with the second direction of the first matrix, and thereafter, reading the data from the interleave buffer memory 2603 in a third direction perpendicular to the fourth direction of the second matrix, and then, outputs the data obtained after the second interleave process in a unit of data in the third direction.

This twelfth preferred embodiment will be described based on the case where the interleave is not executed according to the system of the eleventh preferred embodiment. The present preferred embodiment will also be described taking the case where the DIF data string 1702 of FIG. 37 is transmitted as an example.

Figure 38:
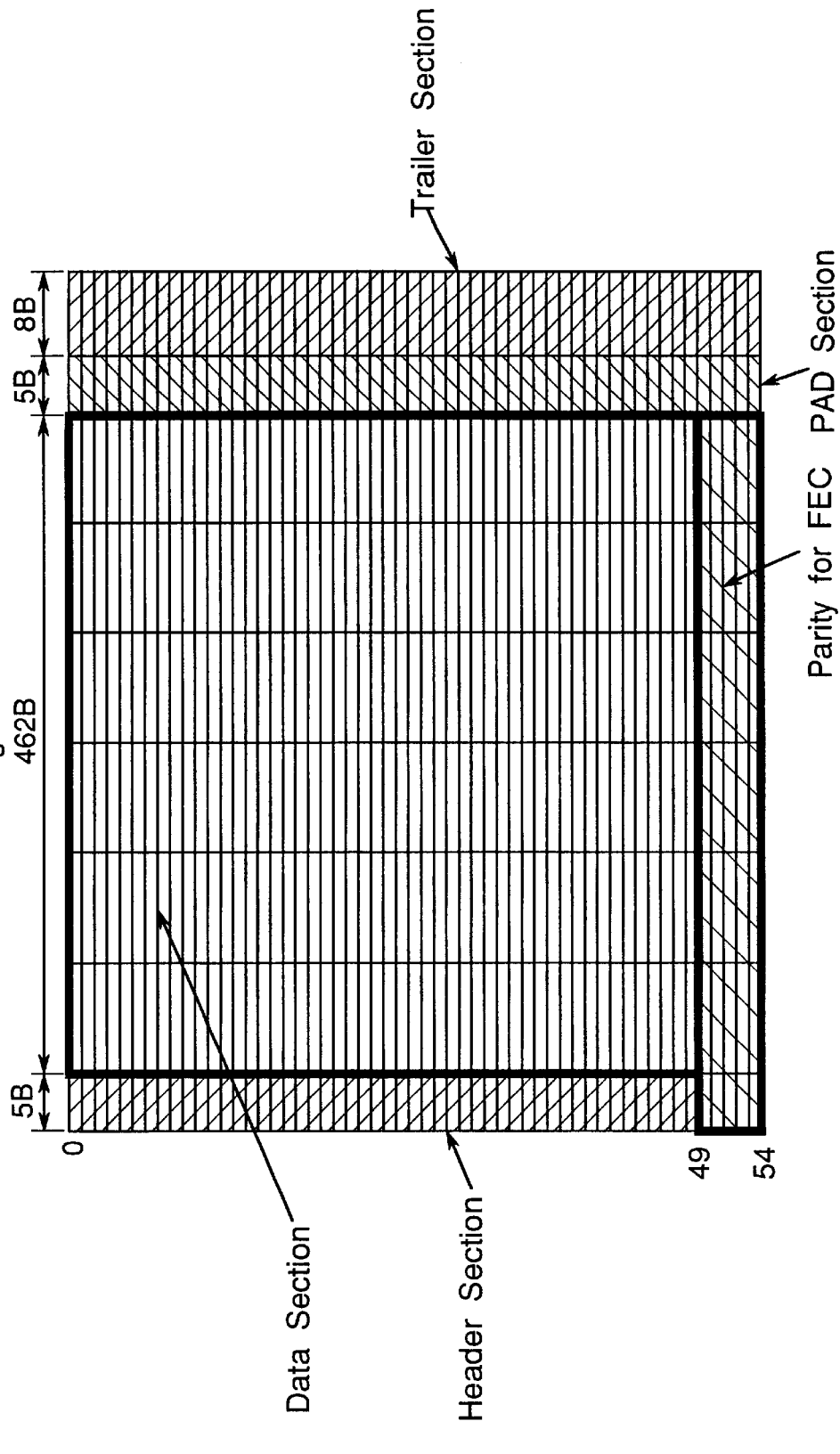
FIG. 38 is a block diagram showing a structure of data outputted from the ATM cell forming circuit 105 of the ATM transmission apparatus provided with the DIF data processing circuit 104j of FIG. 36(A)

FIG. 38 is a block diagram showing a structure of data outputted from the ATM cell forming circuit 105 of the ATM transmission apparatus provided with the DIF data processing circuit 104j of FIG. 36(A). In the conceptual two-dimensional matrix shown in FIG. 38, the write direction and the read direction of the DIF data string coincide with each other. The DIF data string 1702 outputted from the block buffer memory 6002 is written in the row direction of the above matrix. The DIF data string 1702 has 467 bytes, and therefore, 5-byte dummy data (PAD) is added through the processing of the AAL TYPE 5 for the adjustment to the valid data length of 48 bytes of the ATM cell, and a 8-byte trailer including CRC and the like is added in a similar manner through the processing of the AAL TYPE 5 for the formation of a total of 480 bytes. Then, one PDU is transmitted with 10 ATM cells.

Finally, the DIF block data of 77 bytes is stored into the data section indicated by the thick lines in FIG. 38. A header is added to each DIF data string, which becomes the header section indicated by the right-side-down hatching. Based on the AAL TYPE 5 transmission protocol, the PAD indicated by the PAD section and the trailer indicated by the trailer section are added to the tail in the row direction of the matrix for each DIF block data string, header and Parity for FEC.

In the twelfth preferred embodiment, five parities for FEC are added to 50 PDUs for the transmission, however, the unit of addition of the Parity for FEC is not limited to this.

One PDU is constructed of six DIF blocks as described with reference to FIG. 37, and the transmission unit shown in FIG. 38 is constructed of a valid data section of 50 rows, and therefore, one PDU is constructed of 6×50=300 DIF blocks. One frame is constructed of 1500 DIF blocks, and therefore, this results in 1500/300=5, so that the DVC data of one frame can be transmitted by five times the transmission unit of FIG. 38.

In FIG. 36(A), the inputting of the DIF block data string is executed via the input terminal 6001. In FIG. 36(A), the DIF block data string 1702 shown in FIG. 9 and FIG. 36(B) is obtained by the block buffer memory 6002 and the block buffer memory control circuit 6003. This data string 1702 is the same as 1702 of FIG. 9. The interleave buffer memory 2600 has a size for storing the data section and header section of FIG. 38, and the data outputted from the block buffer memory 6002 is sequentially written into the interleave buffer memory 2600 in the row direction while shifting the row from the left to the right in terms of the conception of the two-dimensional matrix. The data reading from the interleave buffer memory 2600 is executed in the column direction while shifting the column from the upside to the downside. The control of writing and reading of the interleave buffer memory 2600 is executed by the interleave buffer memory control circuit 2601. These are the fixed writing and reading methods, and therefore, the methods can be easily implemented by storing a program of the methods in, for example, a ROM of a small storage capacity and providing the interleave control circuit 2601 with the ROM.

The structural view of the data written in the interleave buffer memory 2600 is shown in FIG. 36(C). This corresponds to the data section and the header section of FIG. 38.

The output data from the interleave buffer memory 2600 is transmitted to the parity adding circuit 2602, and as shown in FIG. 36(D), the 5-byte Parity for FEC is added to the 50-byte data conceptually in the column direction.

The output data from the parity adding circuit 2602 is written into the interleave buffer memory 2603. The writing is executed conceptually in the column direction while shifting the column from the left to the right. The data reading is sequentially executed in the row direction while shifting the row from the upside to the downside. The write and read control of the interleave buffer memory 2603 is executed by the interleave control circuit 2604. These are the fixed write and read methods, and therefore, the methods can be easily achieved by storing a program of the methods in, for example, a ROM of a small storage capacity and providing the interleave control circuit 2604 with the ROM.

The structural view of the data written in the interleave buffer memory 2603 is shown in FIG. 36(E). This corresponds to the data section, the header section and the error correction parity section of FIG. 38. The outputting from the interleave buffer memory 2603 is executed via an output terminal 2605.

The processing of the AAL TYPE 5 is executed in a similar manner to the description of the tenth preferred embodiment, whereby the ATM cell forming circuit 105*a* executes addition of the PAD, addition of the trailer of CRC and the like, and the processed ATM cell block is transmitted to the ATM network 100 via the network interface 106.

As described above, according to the twelfth preferred embodiment of the present invention, the error correction by CRC is executed effectively utilizing the AAL protocol function. Therefore, a high-quality transmission system free of error correction can be provided by surely detecting not only the cell loss but also the bit error and executing the loss correction in the upper layer.

The twelfth preferred embodiment has been described taking the case where the DIF data string 1702 of FIG. 9 is transmitted as an example. However, the data deletion is not the subject matter of the present invention, and an effect is obtained by executing error check conceptually in one direction of the two-dimensional matrix and executing the error correction perpendicularly to the above direction. Therefore, the scope of the present invention does not exclude the case where no data deletion is executed.

Thirteenth Preferred Embodiment

Figure 39:
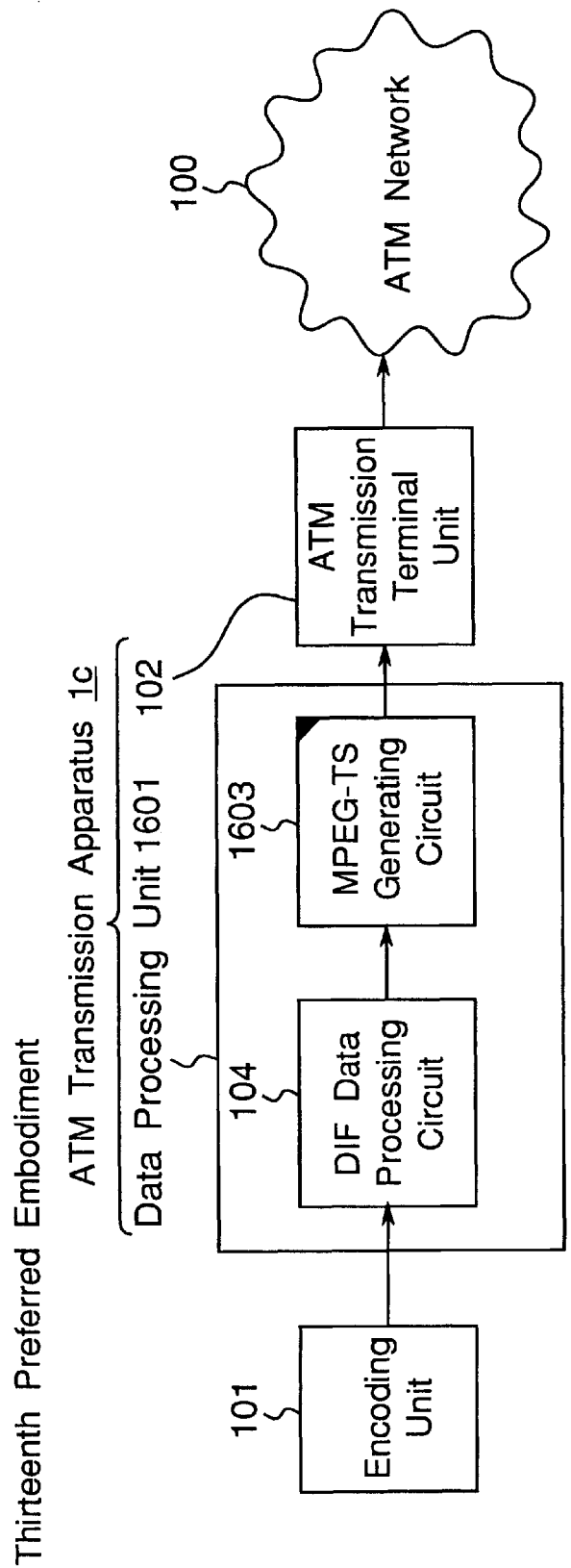
FIG. 39 is a block diagram showing a construction of an ATM transmission apparatus 1c according to a thirteenth preferred embodiment of the present invention.

FIG. 39 is a block diagram showing a construction of an ATM transmission apparatus 1*c* according to a thirteenth preferred embodiment of the present invention, while FIG. 40 is a block diagram showing a packet block generating method executed by the ATM transmission apparatus 1*c* of FIG. 39.

The ATM transmission apparatus 1*c* of the thirteenth preferred embodiment is provided with a data processing unit 1601 and an ATM transmission terminal unit 102. In this case, the data processing unit 1601 is provided with a DIF data processing circuit 104 similar to that of FIG. 1 and an MPEG-TS generating circuit 1603.

The thirteenth preferred embodiment is characterized by being provided with:

(a) a DIF data processing circuit 104 that generates a transmission header having a new identifier by deleting predetermined redundancy information from block information belonging to a plurality of blocks based on data string outputted from the encoding unit 101, and generates a transmission unit having the generated transmission header;

(b) an MPEG-TS generating circuit 1603 that outputs the data string including the transmission unit generated by the DIF data processing circuit 104 while dividing the data string into a plurality of packets in a unit of MPEG transport stream packets; and (c) an ATM transmission terminal unit 102 that transmits the plurality of packets outputted from the MPEG-TS generating circuit 1603 via a transmission line.

The thirteenth preferred embodiment provides a data transmission system capable of mapping the data to MPEG transport stream packets (referred to as TSP hereinafter) and easily connecting the data to the existing MPEG transmission apparatus in conformity to the standard of MPEG over ATM.

The standard of MPEG over ATM is described in "The ATM Forum Technical Committee Audiovisual Multimedia Service: Video on Demand Specification 1.0" af-saa-0049.000 December, 1995, ATM Forum Technical Committee.

In FIG. 40, the reference numeral 1501 denotes an ATM cell block sequence as described in the first preferred embodiment. The ATM cell block sequence is comprised of 248 ATM cell blocks of 47 bytes. On the other hand, TSP is constructed of 188 bytes. Therefore, the ATM cell block sequence can be exactly stored in 47×248/188=62 TSPs. That is, four ATM cell blocks are stored in the TSP. In FIG. 40, the transform from 1501 to 1502 shows the state.

The subsequent processing conforms to the standard of MPEG over ATM, and as denoted by 1503, the ATM transmission is executed by connecting two MTPs together, adding additional information of the AAL TYPE 5, subsequently dividing the resultant into 48-byte cells as denoted by 1504 and further adding the ATM cell header as denoted by 1505.

In the thirteenth preferred embodiment, the data amount appropriate for the mapping to MTP, i.e., the total data amount has already been the multiple of 188 bytes at the time point of the formation of the ATM cell block sequence 1501 (upper layer with respect to the AAL). Therefore, the subsequent data becomes very simple since the data is merely subjected successively to the predetermined processes.

In FIG. 39, the reference numeral 1601 denotes a data processing unit for generating an MPEG transport stream and is constructed of a DIF data processing circuit 104 and an MPEG-TS generating circuit 1603. The DIF data processing circuit 104 is the same as that of FIG. 1, i.e., the same circuit as that of FIG. 4. The MPEG-TS generating circuit 1603 forms data each having 188 bytes from four ATM cell blocks based on the data string outputted from the DIF data processing circuit 104, and then, outputs the MPEG transport stream. The ATM transmission terminal unit 102 has a circuit similar to that of FIG. 1 and transmits the MPEG transport stream outputted from the MPEG-TS generating circuit 1603 to the ATM network 100 while putting the MPEG transport stream into ATM cells. That is, the ATM transmission terminal unit 102 is a unit for executing the processing of the physical layers of 1503, 1504 and 1505 of FIG. 40 and their lower-order layers and transmitting the resultant to the ATM network 100. The currently widely popularized equipments can be utilized as they are, and therefore, the circuit can be simply realized at low cost.

As described above, according to the thirteenth preferred embodiment, the DVC data is made to have data construction appropriate for the standard of MPEG over ATM, so that the currently widely popularized MPEG transmission equipments can be utilized. The currently popularized equipments can be used as they are, so that the DVC data can be transmitted in ATM with a very simple construction at low cost.

In the thirteenth preferred embodiment, a data amount reduction of 2.87% can be achieved in a similar manner to that of the first preferred embodiment, so that the communications load can be remarkably reduced and the use of the resources of the communications network can be reduced. By virtue of the reduction in the amount of communications, the communications time is reduced and the reliability of the real-time communications is improved by that much or degree.

Furthermore, the load applied on the ATM network is small and the load applied on the ATM switch and so on inside the network is also small. Therefore, the probability of the occurrence of cell loss or the like is remarkably reduced, so that highly-reliable transmission having a great tolerance of the error can be achieved.

Although the AAL layer processing is executed by the AAL TYPE 5 in the thirteenth preferred embodiment, the ATM cell block, which is constructed of 47 bytes, is appropriate for the case where the processing is executed according to the AAL TYPE 1 protocol. Equipments capable of executing transmission according to the AAL TYPE 1 protocol are also currently widely popularized, and the equipments can be utilized as they are.

As described above, according to the first to thirteenth preferred embodiments of the present invention, the digitized image signal, sound signal and additional information can be transmitted in ATM.

Although the above-mentioned preferred embodiments take the ATM as an example of the transmitting means, the scope of the invention of the present application does not exclude the case where other packet communications are used as the transmitting means.

Although the above-mentioned preferred embodiments take the household digital VTR data as an example, the digital VTR for the broadcasting business use of the same compression system is under discussion for the standardization. The scope of the present invention does not exclude the case where the invention of the present application is applied to it.

Industrial Applicability

As described above, the currently popularized equipments can be used as they are, and the additional circuit can be realized with a very simple circuit construction. Therefore, the circuit can be realized very easily at low cost. According to the present invention, for example, the data of the DVC system, in which the image data, sound data and other additional information data are outputted in a data string obtained by dividing the data into fixed-length blocks can be transmitted by the packet communications network of, for example, the ATM network.

The first aspect of the present invention enables the communications with a remarkably reduced amount of information, so that the communications load can be remarkably reduced and the use of the resources of the communications network can be reduced. By virtue of the reduction in the amount of communications, the communications time is reduced and the reliability of the real-time communications is improved by that much or degree. The communications zone used by the packet communications network is reduced, the load applied on the network is reduced, and the load applied on the switch of the network is also reduced. Therefore, the probability of packet abandonment and the like is reduced, so that highly-reliable transmission can be achieved.

According to the second aspect of the present invention, if the packet loss and bit error are within the range of error correction, then the error is corrected by the error correction. Even when packet loss and bit error beyond the error correction capacity occur, the error does not propagate, so that high-quality image and sound transmission having a great tolerance of the packet loss and bit error can be provided.

According to the third aspect of the present invention, if the packet loss and bit error are within the range of error correction, then the error is corrected by the error correction. When the packet loss and bit error beyond the error correction capacity occur, then the presence or absence of the bit error is surely detected by the error check, so that the DIF blocks including no bit error are outputted as they are for the utilization of the greater part of data while treating the DIF block including a bit error as an error. By thus executing the error correction process, a transmission system that maintains a high image quality and a high sound quality can be provided.

According to the fourth aspect of the present invention, if the packet loss and bit error occur, the header information such as the time code or the like can be surely detected, so that the position of the transmitted image information and so on can be surely detected, thereby allowing high-quality image and sound transmission to be achieved.

According to the fifth aspect of the present invention, the error detection result based on the transmission standard of the predetermined packet communications network is utilized, and the Parity for FEC is attached perpendicular to the conceptual direction of error detection, thereby allowing the error correction effect to be utilized to the maximum. In particular, the packet loss that is the error characteristic of the packet communications network can be detected by the error detection and the loss correction of the predetermined block in which the error is detected can be achieved. Therefore, highly-reliable communications particularly tolerant of the packet loss can be achieved.

According to the sixth aspect of the present invention, an advantageous effect similar to that of the first aspect of the present invention is provided, and, for example, digital data such as the DVC data or the like can be made to have a data construction appropriate for the standard of MPEG over ATM. Therefore, the currently widely popularized MPEG transmission equipments can be utilized. The currently popularized equipments can be used as they are, so that the digital data of, for example, the DVC data can be transmitted by the ATM transmission with a very simple construction at low cost.

What is claimed is:

1. A packet transmission apparatus for transmitting in a packet form a transmission unit including a data string arranged to divide predetermined data into a plurality of blocks, each block having a fixed length, block information for specifying at least one of a block type and a block order being added to each block, said packet transmission apparatus comprising:

generating means for generating a transmission header having a new identifier for an application layer by deleting predetermined redundancy information from the block information belonging to the plurality of blocks based on the data string, and generating a transmission unit having the generated transmission header; and transmitting means for transmitting the transmission unit generated by said generating means by way of a transmission line, wherein said generating means is operable to generate the transmission header by deleting the predetermined redundancy information by:

retaining one header information among a set of a plurality of sequentially continuous header information and deleting the other header information belonging to the set if the plurality of header information belonging to the set are generated sequentially and continuously.

2. The packet transmission apparatus as claimed in claim 1, wherein said generating means is operable to generate a new identifier by making the block information of one block represent the block information of the plurality of blocks, and to generate a transmission header having the generated identifier.

3. The packet transmission apparatus as claimed in claim 2, wherein said generating means is operable to make the block information of one block represent the block information of an identical block.

4. The packet transmission apparatus as claimed in claim 1, wherein said generating means is operable to delete redundancy information that includes at least one of reserved data and invalid data.

5. The packet transmission apparatus as claimed in claim 1, wherein said generating means is operable to generate the transmission header to include a time code and a serial number.

6. The packet transmission apparatus as claimed in claim 1, wherein said transmitting means is operable to transmit the transmission unit by an ATM transmission system using AAL TYPE 1 as an adaptation layer function of an asynchronous transfer mode.

7. The packet transmission apparatus as claimed in claim 1, wherein said transmitting means is operable to transmit the transmission unit by an ATM transmission system using AAL TYPE 5 as an adaptation layer function of an asynchronous transfer mode.

8. The packet transmission apparatus as claimed in claim 6, wherein said transmitting means is operable to add a parity for error correction to the generated transmission unit, thereafter, to execute an interleave process on data including the added parity for error correction, and to output data obtained after the interleave process as a modified transmission unit.

9. The packet transmission apparatus as claimed in claim 8, wherein said generating means is operable to execute the interleave process by writing the data including the added parity for error correction into a storage apparatus as a matrix in a first direction of the matrix, and thereafter, to read from the storage apparatus the data in a second direction perpendicular to the first direction of the matrix.

10. A packet transmission apparatus for transmitting in a packet form a transmission unit including a data string arranged to divide predetermined data into a plurality of blocks, each block having a fixed length, block information for specifying at least one of a block type and a block order being added to each block, comprising:

generating means for generating a transmission header having a new identifier for an application layer by deleting predetermined redundancy information from the block information belonging to the plurality of blocks based on the data string, and generating a transmission unit having the generated transmission header;

packet forming means for dividing a data string including the transmission unit generated by said generating means, into a plurality of packets in a unit of MPG transport stream packets, and outputting the plurality of packets; and transmitting means for transmitting the plurality of packets outputted from said packet forming means by way of a transmission line, wherein said generating means is operable to generate the transmission header by deleting the predetermined redundancy information by:

retaining one header information among a set of a plurality of sequentially continuous header information and deleting the other header information belonging to the set if the plurality of header information belonging to the set are generated sequentially and continuously.

* * * * *

UNITED STATES PATENT AND TRADEMARK OFFICE
CERTIFICATE OF CORRECTION

PATENT NO. : 6,826,181 B1
DATED : November 30, 2004
INVENTOR(S) : Masaaki Higashida et al.

It is certified that error appears in the above-identified patent and that said Letters Patent is hereby corrected as shown below:

Title page,
Item [56], References Cited, OTHER PUBLICATIONS, "Zsehong Tsai et al." reference, should read -- Control Designs in ATM Networks" --.

Drawings,
In Figures 7, 9, 21, 29 and 36, each figures should be labeled with the corresponding number as amended in the Replacement Formal Drawings filed January 24, 2005.

Column 2,
Lines 58-66, delete the last two paragraphs.

Column 8,
Delete line 26

Column 11,
Line 41, "one. Subsequence" should read -- one subsequence --.
Line 51, "625/25 system" should read -- 625/50 system --.
Line 53, "first-preferred" should read -- first preferred --.

Column 16,
Line 51, "(80x6-467)/(80x6)x100 2.7%" should read
-- (80x6-467)/(80x6)x100 = 2.7% --

Column 18,
Line 32, "TM" should read -- ATM --.

Column 29,
Line 64, "4-it" should read -- 4-bit --.

UNITED STATES PATENT AND TRADEMARK OFFICE
CERTIFICATE OF CORRECTION

PATENT NO. : 6,826,181 B1
DATED : November 30, 2004
INVENTOR(S) : Masaaki Higashida et al.

It is certified that error appears in the above-identified patent and that said Letters Patent is hereby corrected as shown below:

<u>Column 34,</u>
Line 46, "ninth S preferred" should read -- ninth preferred --

Signed and Sealed this

Twenty-first Day of June, 2005

JON W. DUDAS
*Director of the United States Patent and Trademark Office*